US010096489B2

(12) United States Patent
Yamazaki et al.

(10) Patent No.: US 10,096,489 B2
(45) Date of Patent: Oct. 9, 2018

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Suguru Hondo, Kanagawa (JP); Naoto Yamade, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/635,324

(22) Filed: Mar. 2, 2015

(65) Prior Publication Data

US 2015/0255310 A1    Sep. 10, 2015

(30) Foreign Application Priority Data

Mar. 6, 2014   (JP) ................................. 2014-043574
Mar. 6, 2014   (JP) ................................. 2014-043577

(51) Int. Cl.
*H01L 21/425*   (2006.01)
*H01L 21/465*   (2006.01)
(Continued)

(52) U.S. Cl.
CPC .......... *H01L 21/425* (2013.01); *H01L 21/465* (2013.01); *H01L 29/66969* (2013.01);
(Continued)

(58) Field of Classification Search
CPC .............. H01L 29/7869; H01L 21/425; H01L 21/31155; H01L 21/823857;
(Continued)

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1737044 A    12/2006
EP    2226847 A     9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Michael Lebentritt
*Assistant Examiner* — Suberr Chi
(74) *Attorney, Agent, or Firm* — Fish & Richardson P.C.

(57) ABSTRACT

Provided is a method for manufacturing a semiconductor device with favorable electrical characteristics. The following steps are performed in the following order: forming an oxide semiconductor film over a substrate having a substantially planar surface; selectively etching the oxide semiconductor film to form an oxide semiconductor layer; implanting an oxygen ion on a top surface of the oxide semiconductor layer and a side surface of the oxide semiconductor layer in a cross-section perpendicular to the substantially planar surface in a channel width direction of the oxide semiconductor layer from an angle $0°<\theta<90°$; forming an insulating layer over the oxide semiconductor layer, and performing heat treatment on the oxide semiconductor layer to diffuse oxygen into the oxide semiconductor layer.

22 Claims, 74 Drawing Sheets

(51) Int. Cl.
*H01L 29/786* (2006.01)
*H01L 29/66* (2006.01)

(52) U.S. Cl.
CPC .... *H01L 29/7869* (2013.01); *H01L 29/78618* (2013.01); *H01L 29/78648* (2013.01); *H01L 29/78696* (2013.01)

(58) Field of Classification Search
CPC ..... H01L 21/823892; H01L 21/823814; H01L 21/823807; H01L 21/823418; H01L 21/823412; H01L 21/76859; H01L 21/76825
See application file for complete search history.

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,208,383 B1* | 4/2007 | Weintraub | H01L 21/26586 257/E21.345 |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,440,510 B2 | 5/2013 | Yamazaki | |
| 8,461,007 B2 | 6/2013 | Yamazaki | |
| 8,637,347 B2 | 1/2014 | Oikawa et al. | |
| 8,828,811 B2 | 9/2014 | Yamazaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0211711 A1* | 11/2003 | Seki | H01L 21/76243 438/480 |
| 2003/0218222 A1 | 11/2003 | Wager, III et al. | |
| 2004/0038446 A1 | 2/2004 | Takeda et al. | |
| 2004/0041177 A1* | 3/2004 | Satoh | H01L 21/26586 257/213 |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0159663 A1* | 6/2010 | Kim | H01L 29/66666 438/302 |
| 2010/0276682 A1* | 11/2010 | Yeh | H01L 29/78609 257/43 |
| 2013/0009220 A1* | 1/2013 | Yamazaki | H01L 29/78696 257/288 |
| 2013/0143376 A1* | 6/2013 | Pan | H01L 21/28273 438/294 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| | | |
|---|---|---|
| JP | 2007-096055 A | 4/2007 |
| JP | 2007-123861 A | 5/2007 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al, B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 :SID International Symposium Digest of the Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT"; SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

(56) References Cited

OTHER PUBLICATIONS

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technology Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J Electrochem. Soc. (Journal of Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

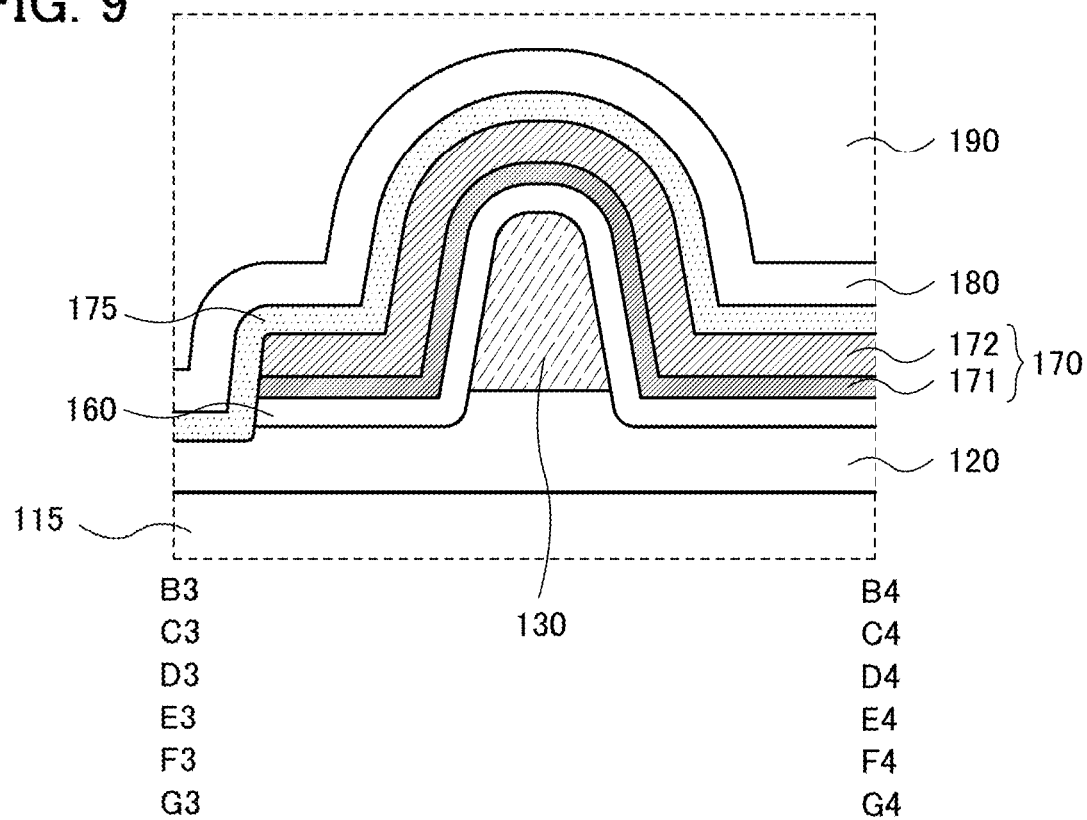

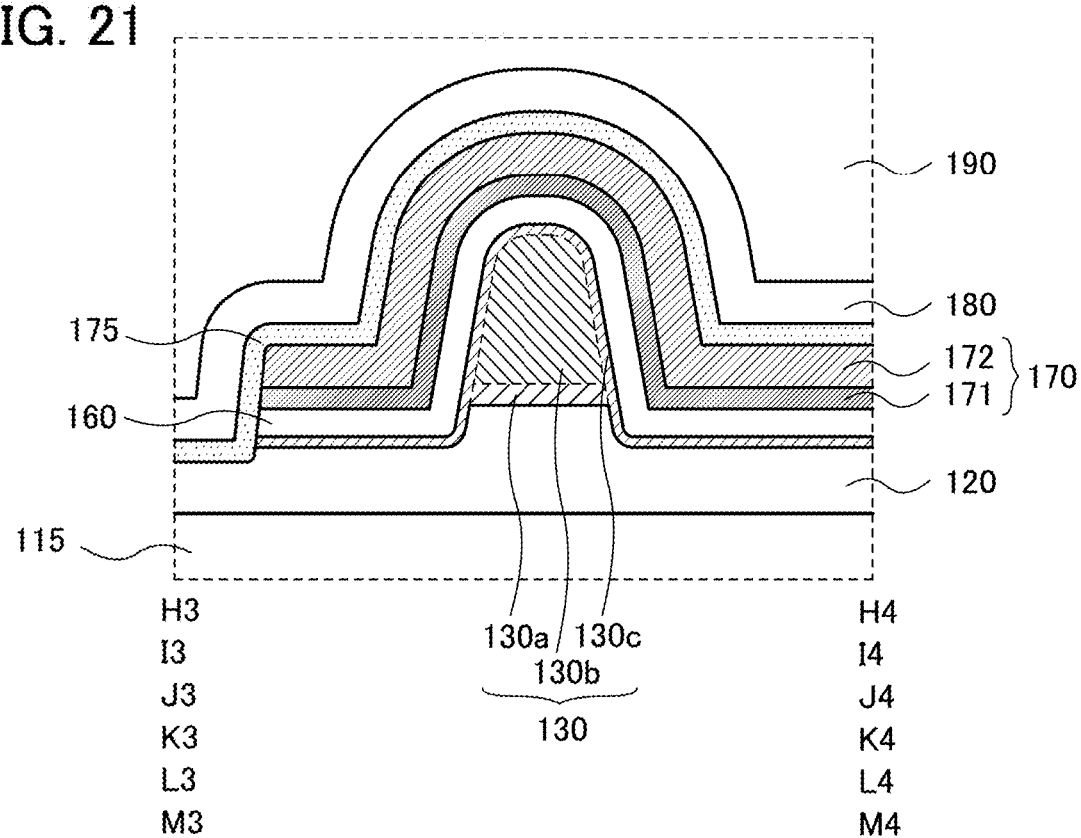

FIG. 30A
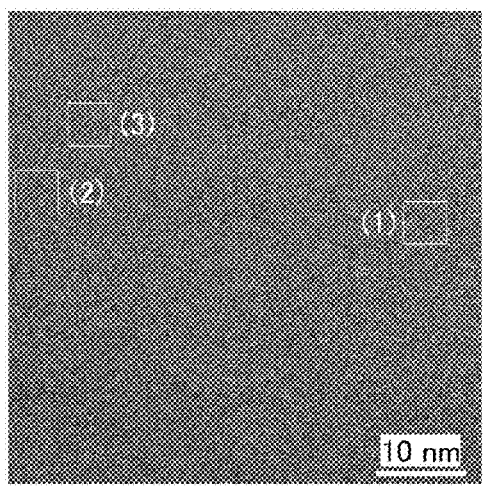
FIG. 30B  FIG. 30C  FIG. 30D
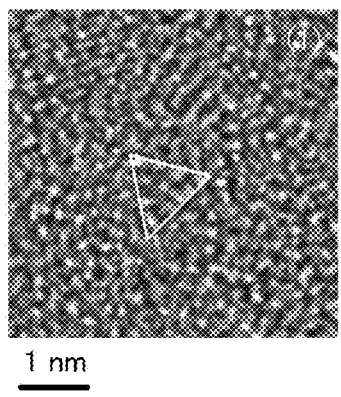 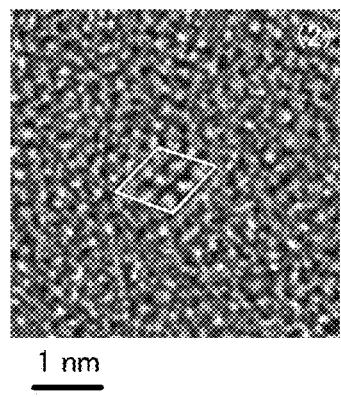 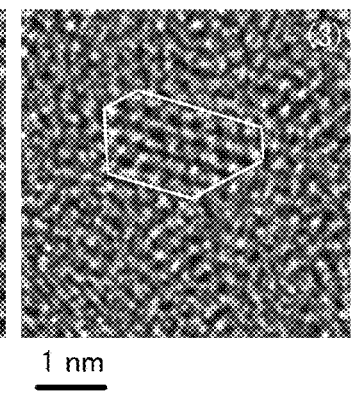

FIG. 39A
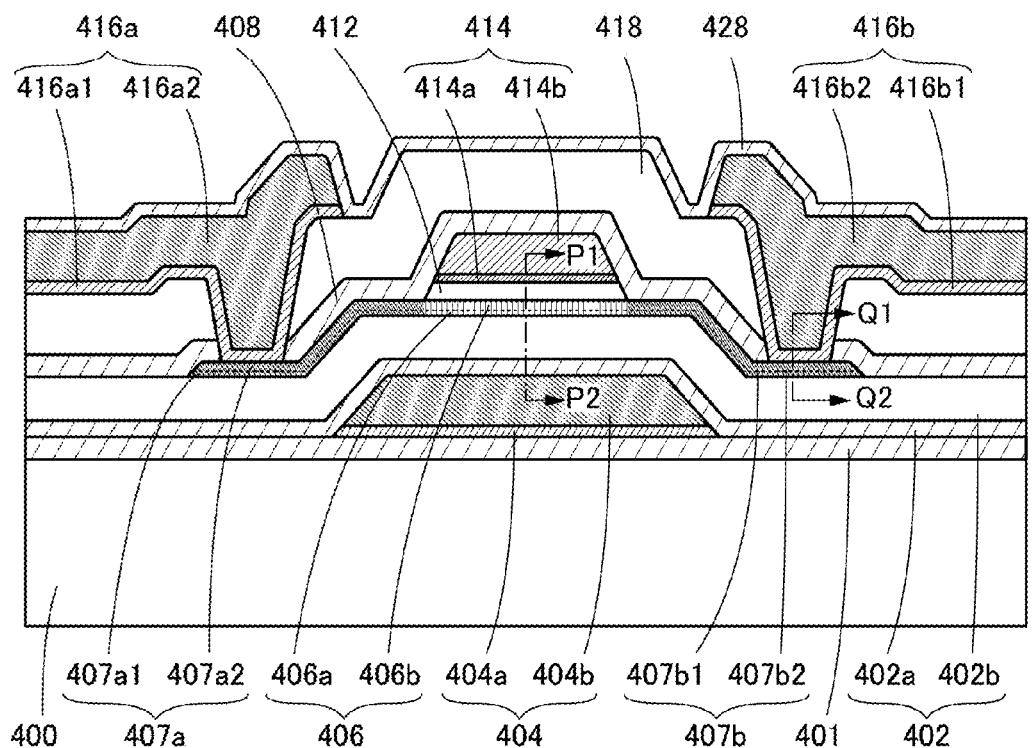
FIG. 39B
FIG. 39C
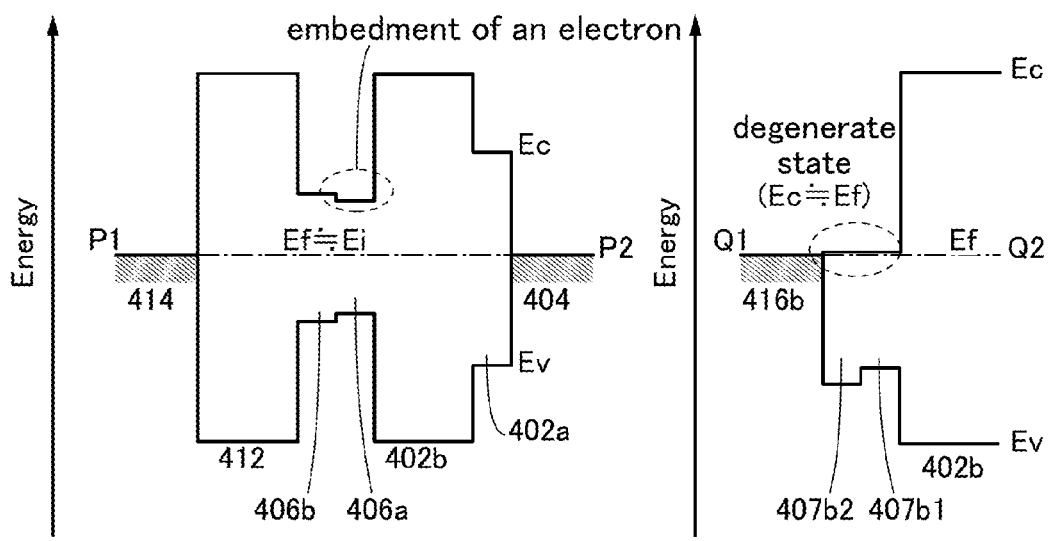

Initial State ($V_oH$)

$V_oH$ final state ($V_o$, H-O)

$V_o$

H bonded to oxygen

Initial State ($V_oH$)

final state ($V_o$, H-O)

InGaZnO₄

FIG. 53A
FIG. 53B
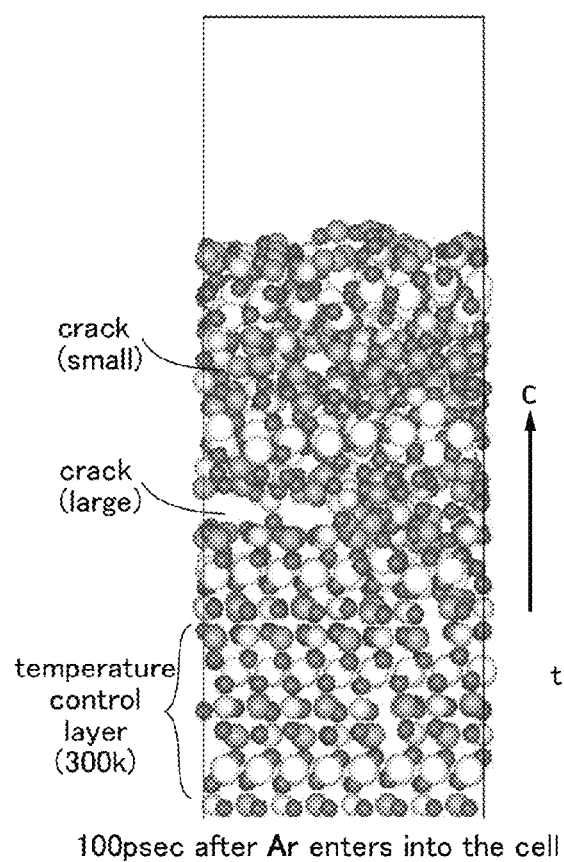
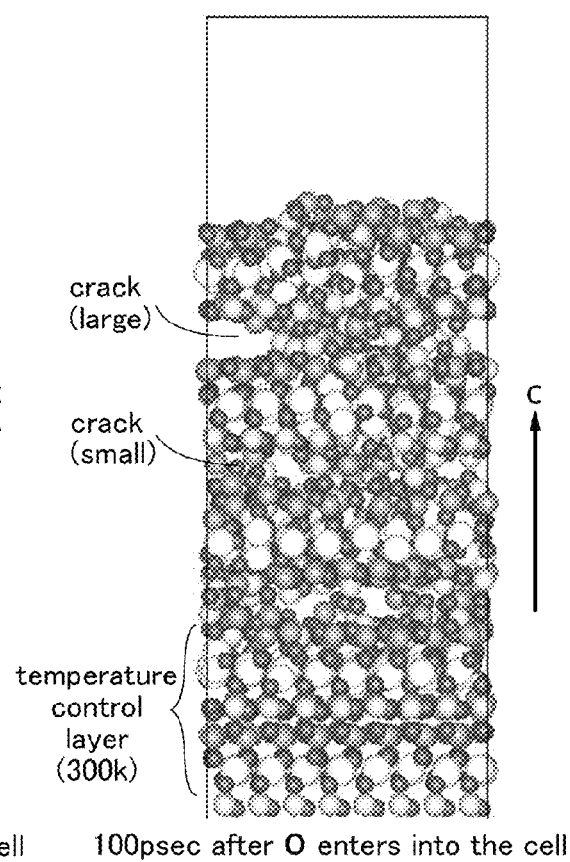
100psec after Ar enters into the cell
100psec after O enters into the cell
In : ○   Ga : ○   Zn : ●   O : ●

Zn of the third layer (Ga-Zn-O layer) reaches the neighborhood of the sixth layer (Ga-Zn-O layer)

trajectories of atoms from 0 to 0.3psec after Ar enters the cell

Zn of the third layer (Ga-Zn-O layer) does not reach the fifth layer (In-O layer)

trajectiories of atoms from 0 to 0.3psec after O enters the cell

CAAC-OS layer target

FIG. 57A
FIG. 57B
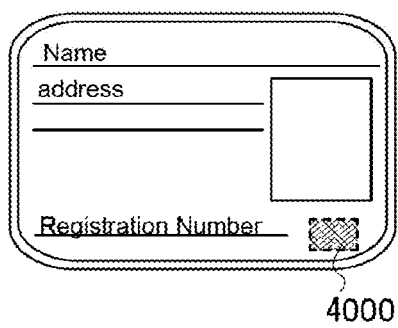
4000
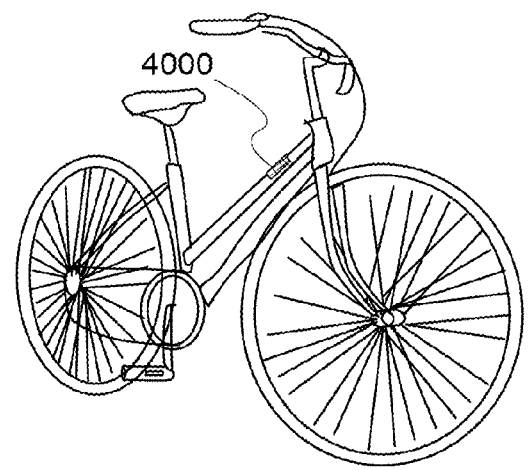
4000
FIG. 57C
FIG. 57D
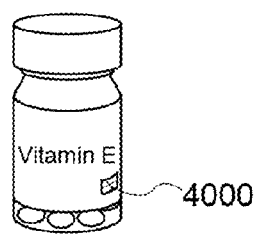
4000
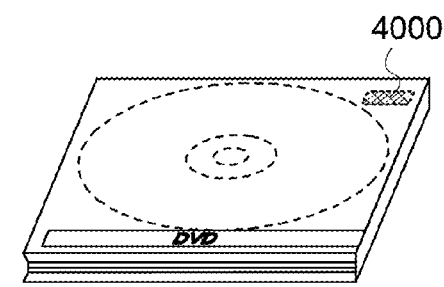
4000
FIG. 57E
FIG. 57F
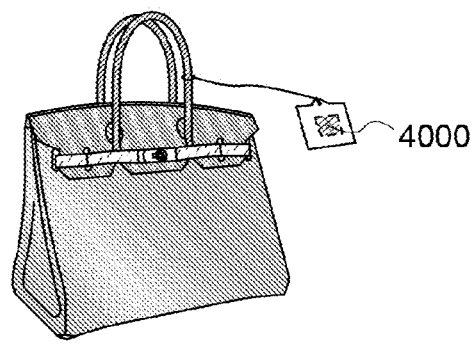
4000
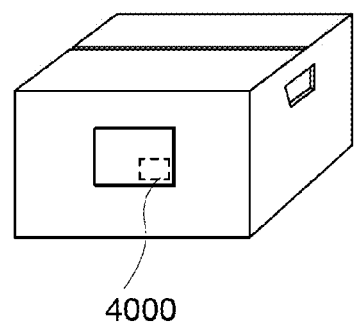
4000

FIG. 60A
model A
FIG. 60B
model B
FIG. 60C
model C
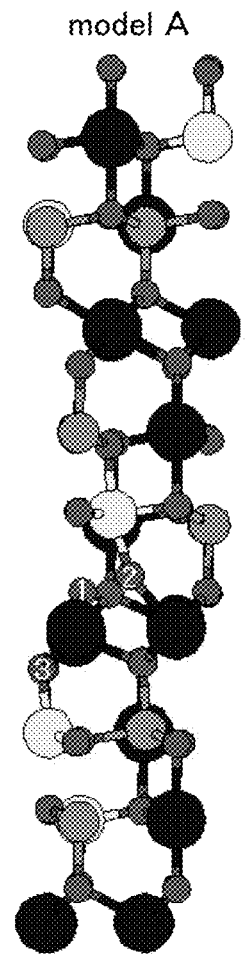
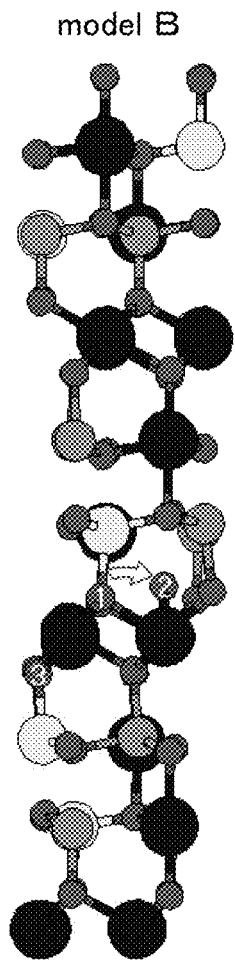
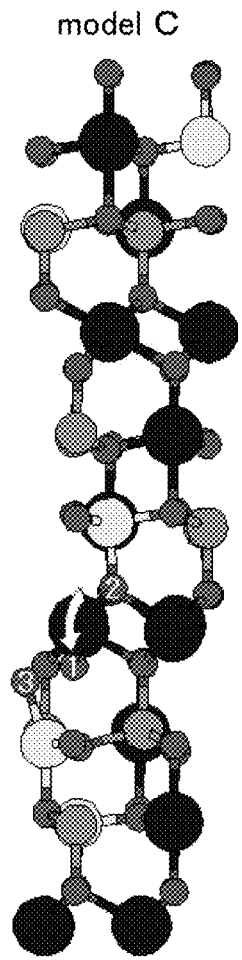
explanatory note
In: ● Ga: ○ Zn: ● O: ● model A model B model C explanatory note
In: ● Ga: ○ Zn: ● O: ● an electron beam in a direction parallel to a sample surface an electron beam in a direction perpendicular to a sample surface

METHOD FOR MANUFACTURING SEMICONDUCTOR DEVICE

BACKGROUND OF THE INVENTION

1. Field of the Invention

One embodiment of the present invention relates to a semiconductor device including an oxide semiconductor, and a manufacturing method thereof.

One embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, or an electronic device includes a semiconductor device.

2. Description of the Related Art

A technique by which a transistor is formed using a semiconductor thin film formed over a substrate having an insulating surface has been attracting attention. The transistor is used in a wide range of electronic devices such as an integrated circuit (IC) or an image display device (also simply referred to as a display device). A silicon-based semiconductor material is widely known as a material for a semiconductor thin film applicable to the transistor, but an oxide semiconductor has been attracting attention as an alternative material.

For example, a technique for manufacturing a transistor using zinc oxide or an In—Ga—Zn-based oxide semiconductor as an oxide semiconductor is disclosed (see Patent Documents 1 and 2).

REFERENCE

Patent Document

[Patent Document 1] Japanese Published Patent Application No. 2007-123861

[Patent Document 2] Japanese Published Patent Application No. 2007-096055

SUMMARY OF THE INVENTION

In view of the above, an object of one embodiment of the present invention is to provide a semiconductor device with favorable electric characteristics. Another object is to provide a semiconductor device with high on-state current. Another object is to provide a semiconductor device that is suitable for high speed operation. Another object is to provide a highly integrated semiconductor device. Another object is to provide a semiconductor device with low power consumption. Another object is to provide a highly reliable semiconductor device. Another object is to provide a semiconductor device that can retain data even when power supply is stopped. Another object is to provide a novel semiconductor device. Another object is to provide a manufacturing method of the semiconductor device.

Note that the descriptions of these objects do not disturb the existence of other objects. In one embodiment of the present invention, there is no need to achieve all the objects. Other objects will be apparent from and can be derived from the descriptions of the specification, the drawings, the claims, and the like.

One embodiment of the present invention relates to a transistor including an oxide semiconductor layer in a channel formation region.

One embodiment of the present invention is a method for manufacturing a semiconductor device including the steps of forming an oxide semiconductor film over a substrate having a substantially planar surface, selectively etching the oxide semiconductor film to form an oxide semiconductor layer, implanting an oxygen ion in the oxide semiconductor layer, forming an insulating layer over the oxide semiconductor layer, and performing heat treatment on the oxide semiconductor layer to diffuse oxygen into the oxide semiconductor layer.

Another embodiment of the present invention is a method for manufacturing a semiconductor device including the steps of forming an oxide semiconductor film over a substrate having a substantially planar surface, selectively etching the oxide semiconductor film to form an oxide semiconductor layer, forming an insulating layer over the oxide semiconductor layer, implanting an oxygen ion in the oxide semiconductor layer through the insulating layer, and performing heat treatment on the oxide semiconductor layer to diffuse oxygen into the oxide semiconductor layer.

The implantation of the oxygen ion is preferably performed on a top surface of the oxide semiconductor layer and a side surface of the oxide semiconductor layer in a cross-section perpendicular to the substantially planar surface in a channel width direction of the oxide semiconductor layer from an angle $0°<\theta<90°$ when an angle ($\theta$) perpendicular to the substantially planar surface is set to $0°$ and an angle ($\theta$) parallel to the substantially planar surface is set to $90°$.

The implantation of the oxygen ion may be performed from an angle $0°<\theta<90°$ when an angle ($\theta$) perpendicular to the substantially planar surface is set to $0°$ and an angle ($\theta$) parallel to the substantially planar surface is set to $90°$ while the substrate is rotated around an axis perpendicular to the substantially planar surface.

The implantation of the oxygen ion may be performed plural times on the top surface of the oxide semiconductor layer and the side surface of the oxide semiconductor layer in a cross-section perpendicular to the substantially planar surface in a channel width direction of the oxide semiconductor layer from an angle substantially $0°$ and an angle $0°<\theta<90°$ when an angle ($\theta$) perpendicular to the substantially planar surface is set to $0°$ and an angle ($\theta$) parallel to the substantially planar surface is set to $90°$.

The oxide semiconductor layer preferably contains In, Zn, and M (M is Al, Ti, Ga, Sn, Y, Zr, La, Ce, Nd, or Hf).

The semiconductor layer may be a lamination in which a first oxide semiconductor layer and a second oxide semiconductor layer are stacked in this order from the substrate side. The first oxide semiconductor layer and the second oxide semiconductor layer each preferably contain In, Zn, and M (M is Al, Ti, Ga, Y, Zr, La, Ce, Nd, or Hf). The first oxide semiconductor layer preferably has a larger atomic ratio of M to In than the second oxide semiconductor layer.

Note that in this specification and the like, ordinal numbers such as "first", "second", and the like are used in order to avoid confusion among components and do not limit the number.

The oxide semiconductor layer may be a lamination in which a first oxide semiconductor layer, a second oxide semiconductor layer, and a third oxide semiconductor layer are stacked in this order from the substrate side. It is preferable that the first oxide semiconductor layer and the third oxide semiconductor layer each contain In, Zn, and M (M is Al, Ti, Ga, Y, Zr, La, Ce, Nd, or Hf) and that an atomic ratio of M to In in each of the first and third oxide semiconductor layers be higher than an atomic ratio of M to In in the second oxide semiconductor layer.

In the cross section in the channel width direction of the oxide semiconductor layer perpendicular to the substantially planar surface, a top portion may be combined with a side portion with curvature.

Another embodiment of the present invention is a method for manufacturing a semiconductor device including the steps of forming a first oxide semiconductor film over a substrate having a substantially planar surface and a second oxide semiconductor film over the first oxide semiconductor film, selectively etching the first oxide semiconductor film and the second oxide semiconductor film to form a lamination of the first oxide semiconductor layer and the second oxide semiconductor layer, implanting an oxygen ion to the lamination, forming a third oxide semiconductor film over the lamination, and performing heat treatment on the oxide semiconductor layer to diffuse oxygen into the oxide semiconductor layer.

Another embodiment of the present invention is a method for manufacturing a semiconductor device including the steps of forming a first oxide semiconductor film and a second oxide semiconductor film in this order over a substrate having a substantially planar surface, selectively etching the first oxide semiconductor film and the second oxide semiconductor film to form a lamination including the first oxide semiconductor film and the second oxide semiconductor film, forming a third oxide semiconductor film over the lamination, implanting an oxygen ion in the lamination through the third oxide semiconductor film, and performing heat treatment on the oxide semiconductor layer to diffuse oxygen into the oxide semiconductor layer.

The implantation of the oxygen ion is preferably performed on a top surface of the lamination and a side surface of the lamination in a cross-section perpendicular to the substantially planar surface in a channel width direction of the lamination from an angle $0°<\theta<90°$ when an angle ($\theta$) perpendicular to the substantially planar surface is set to $0°$ and an angle ($\theta$) parallel to the substantially planar surface is set to $90°$.

The implantation of the oxygen ion may be performed from an angle $0°<\theta<90°$ when an angle ($\theta$) perpendicular to the substantially planar surface is set to $0°$ and an angle ($\theta$) parallel to the substantially planar surface is set to $90°$ while the substrate is rotated around an axis perpendicular to the substantially planar surface.

The implantation of the oxygen ion is performed plural times on the top surface of the lamination and a side surface of the lamination in a cross-section perpendicular to the substantially planar surface in a channel width direction of the lamination from an angle substantially $0°$ and an angle $0°<\theta<90°$ when an angle ($\theta$) perpendicular to the substantially planar surface is set to $0°$ and an angle ($\theta$) parallel to the substantially planar surface is set to $90°$.

It is preferable that the first oxide semiconductor layer and the third oxide semiconductor layer each contain In, Zn, and M (M is Al, Ti, Ga, Y, Zr, La, Ce, Nd, or Hf) and that an atomic ratio of M to In in each of the first and third oxide semiconductor layers be higher than an atomic ratio of M to In in the second oxide semiconductor layer.

In the cross section in the channel width direction of the lamination perpendicular to the substantially planar surface, a top portion may be combined with a side portion with curvature.

According to one embodiment of the present invention, a semiconductor device with favorable electrical characteristics can be provided. A semiconductor device with a high on-state current can be provided. A semiconductor device that is suitable for high-speed operation can be provided. A highly integrated semiconductor device can be provided. A semiconductor device with low power consumption can be provided. A highly reliable semiconductor device can be provided. A semiconductor device that can retain data even when power supply is stopped can be provided. A novel semiconductor device can be provided. A manufacturing method of the semiconductor device can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIG. 9 illustrates a cross section of a transistor in the channel width direction.

FIG. 21 illustrates a cross section of a transistor in a channel width direction.

FIGS. 30A to 30D are Cs-corrected high-resolution TEM images of a plane of a CAAC-OS.

FIG. 39A is a cross-sectional view of a transistor and FIGS. 39B and 39C illustrate band structures.

FIGS. 52A and 52B show the structure of InGaZnO$_4$ before collision of an atom, and the like.

FIGS. 53A and 53B show the structure of InGaZnO$_4$ after collision of an atom, and the like.

FIGS. 57A to 57F illustrate usage examples of an RF tag.

FIGS. 60A to 60C are model diagrams used in computation of excessive oxygen transfer.

DETAILED DESCRIPTION OF THE INVENTION

Figure 1A:
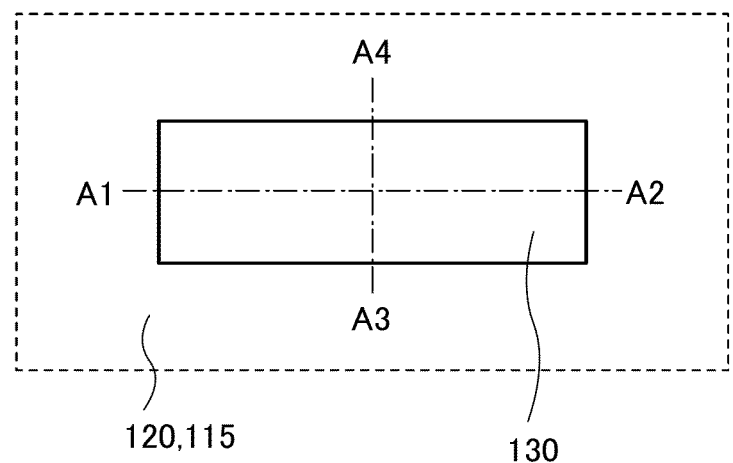
FIGS. 1A and 1B are a top view and a cross-sectional view illustrating a semiconductor layer.

Embodiments will be described in detail with reference to the drawings. However, the present invention is not limited to the description below, and it is easily understood by those skilled in the art that modes and details disclosed herein can be modified in various ways without departing from the spirit and the scope of the present invention. Further, the present invention is not construed as being limited to the description of the embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

Note that in this specification and the like, when it is explicitly described that X and Y are connected, the case where X and Y are electrically connected, the case where X and Y are functionally connected, and the case where X and Y are directly connected are included therein. Here, X and Y each denote an object (e.g., a device, an element, a circuit, a wiring, an electrode, a terminal, a conductive film, a layer, or the like). Accordingly, without limiting to a predetermined connection relation, for example, a connection relation shown in drawings and texts, another element may be interposed between elements having the connection relation shown in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be turned on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit, and a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. When a signal output from X is transmitted to Y, it can be said that X and Y are functionally connected even if another circuit is provided between X and Y.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. As examples of the glass substrate, a barium borosilicate glass substrate, an aluminoborosilicate glass substrate, a soda lime glass substrate, and the like can be given. For the flexible substrate, a flexible synthetic resin such as plastic typified by polyethylene terephthalate (PET), polyethylene naphthalate (PEN), and polyether sulfone (PES), or acrylic can be used, for example. For the attachment film, polypropylene, polyester, polyvinyl fluoride, polyvinyl chloride, or the like can be used, for example. For the base material film, polyester, polyamide, polyimide, an inorganic vapor deposition film, paper, or the like can be used, for example. Specifically, when a transistor is formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

Alternatively, a flexible substrate may be used as the substrate, and the transistor may be provided directly on the flexible substrate. A separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a lamination including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, a transistor with excellent properties or a transistor with low power consumption can be formed, a device with high durability can be formed, heat resistance can be provided, or reduction in weight or thickness can be achieved.

Embodiment 1

In this embodiment, a manufacturing method of a transistor of one embodiment of the present invention will be described with reference to drawings.

A channel formation region of the transistor of one embodiment of the present invention can be made of silicon (including strained silicon), germanium, silicon germanium, silicon carbide, gallium arsenide, aluminum gallium arsenide, indium phosphide, gallium nitride, an organic semiconductor, an oxide semiconductor, or the like can be used. It is particularly preferable to use an oxide semiconductor having a wider band gap than silicon for the channel formation region.

For example, the oxide semiconductor preferably contains at least indium (In) or zinc (Zn) as the oxide semiconductor. More preferably, the oxide semiconductor contains an oxide represented by an In-M-Zn-based oxide (M is a metal such as Al, Ti, Ga, Ge, Y, Zr, Sn, La, Ce, or Hf).

In the description below, unless otherwise specified, a transistor described as an example includes an oxide semiconductor in a channel formation region.

A material containing as few oxygen vacancies as possible is preferably used because an oxygen vacancy in an oxide semiconductor layer contributes to the formation of an unnecessary donor. However, even when an oxide semiconductor layer contains few oxygen vacancies shortly after it is formed, oxygen vacancies will increase in number from various causes in a manufacturing process of a transistor. An increase in oxygen vacancies in a channel formation region of an oxide semiconductor layer can cause poor electrical characteristics; for example, the transistor becomes normally-on, leakage current increases, or threshold voltage is shifted due to stress application.

There is a method for supplying oxygen from a base insulating film in contact with an oxide semiconductor film to fill oxygen vacancies in the oxide semiconductor film. In that case, it is preferable that an oxide insulating layer used as the base insulating film have oxygen content higher than that in the stoichiometric composition.

Oxygen may be directly added to the oxide semiconductor layer by an ion implantation method or the like. By the ion implantation method, the required amount of oxygen can be accurately added to the oxide semiconductor layer.

When oxygen is supplied to the oxide semiconductor layer by these methods, electrical characteristics and reliability of the transistor are improved.

Although transistor miniaturization causes a problem of reduction in on-state current, this problem can be prevented by making the fin-type active layer. With the fin-type active layer, the effective channel width can be increased as the thickness of an oxide semiconductor layer is larger, and the on-state current is likely to be increased.

On the other hand, when the thickness of an oxide semiconductor layer is large, it becomes difficult to diffuse oxygen supplied from a base insulating film in the overall thickness direction.

In order to spread oxygen in the overall thickness direction of the oxide semiconductor layer with large thickness, a necessary condition for oxygen ion implantation is a high acceleration voltage and a high dosage. However, oxygen implantation under such a condition causes damage and breaks crystals contained in the oxide semiconductor layer, so that electrical characteristics of the transistor deteriorates.

Figure 59A:
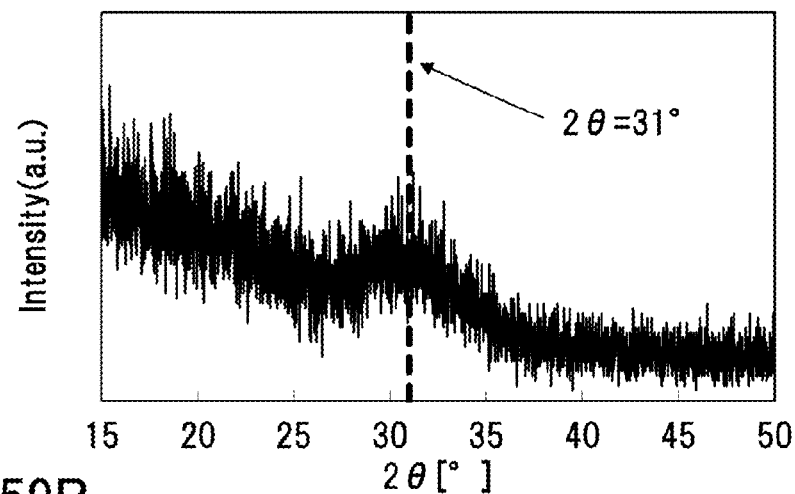
FIGS. 59A to 59C each show an X-ray diffraction spectrum.
Figure 59B:
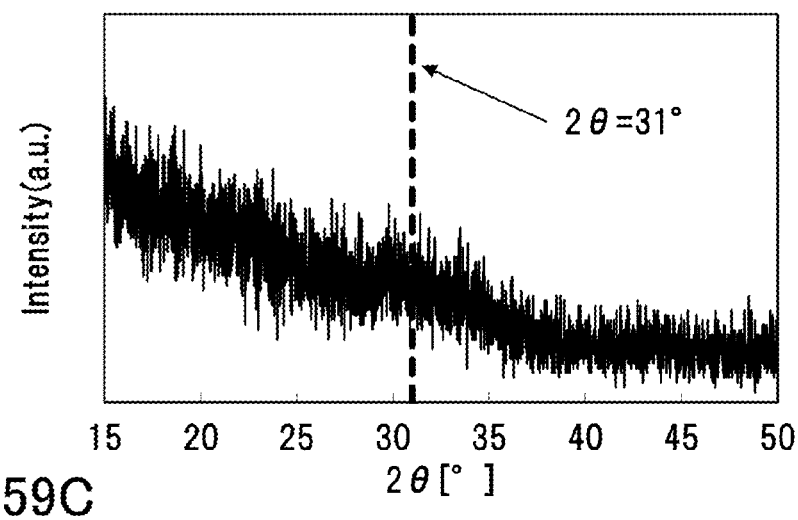
Figure 59C:
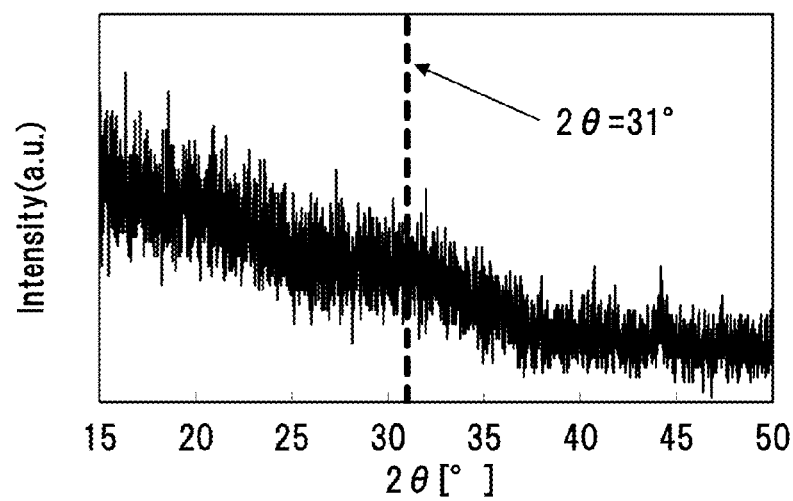

The phenomenon can be confirmed by X-ray diffraction, for example. FIGS. 59A to 59C show X-ray diffraction results of examining influence of oxygen ion implantation on a c-axis aligned In—Ga—Zn oxide film. As shown in FIG. 59A, a peak at 2θ of around 31° that shows the (009) plane alignment of an InGaZnO$_4$ crystal is observed in the initial state (no oxygen ion implantation is carried out), whereas when ion implantation is carried out under the conditions that ion species are $^{16}O_2^+$, acceleration voltage is 5 kV, and a dosage is 1E16 cm$^{-2}$, the peak at 2θ of around 31° disappears as in FIG. 59B. The same result is obtained as in FIG. 59C in ion implantation under the conditions that ion species are $^{16}O^+$, acceleration voltage is 5 kV, and a dosage is 1E15 cm$^{-2}$. Although it is found that the crystal state can be maintained with a smaller dosage than those in these conditions, it is difficult to supply oxygen in the overall thickness direction.

In view of the problems, according to one embodiment of the present invention, oxygen ion implantation is performed on the side surfaces of an oxide semiconductor layer in order to efficiently supply oxygen to the oxide semiconductor layer without breaking crystals.

Figure 1B:
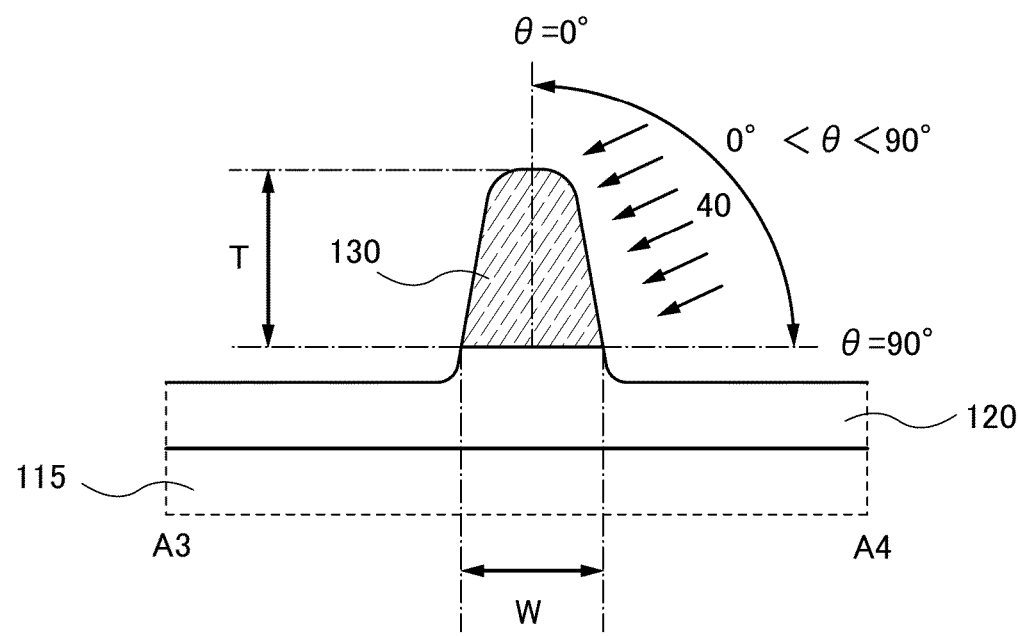

FIGS. 1A and 1B are a top view and a cross-sectional view of an oxide semiconductor layer 130 used in a transistor of one embodiment of the present invention. FIG. 1A is the top view. FIG. 1B illustrates the cross section taken along dashed-dotted line A3-A4 in FIG. 1A. In FIGS. 1A and 1B, some components are enlarged, reduced in size, or omitted for simplification. In some cases, the direction of the dashed-dotted line A1-A2 is referred to as a channel length direction, and the direction of the dashed-dotted line A3-A4 is referred to as a channel width direction.

An insulating layer 120 is formed over a substrate 115 having a substantially planar surface. An oxide semiconductor layer 130 is formed over the insulating layer 120. The insulating layer 120 preferably includes excessive oxygen because it serves as a base insulating film being an oxygen supply source described above. At least in the vicinity of a region of the oxide semiconductor layer 130 being in contact with the insulating layer 120, oxygen defects can be reduced by oxygen diffused from the insulating layer 120.

Figure 69A:
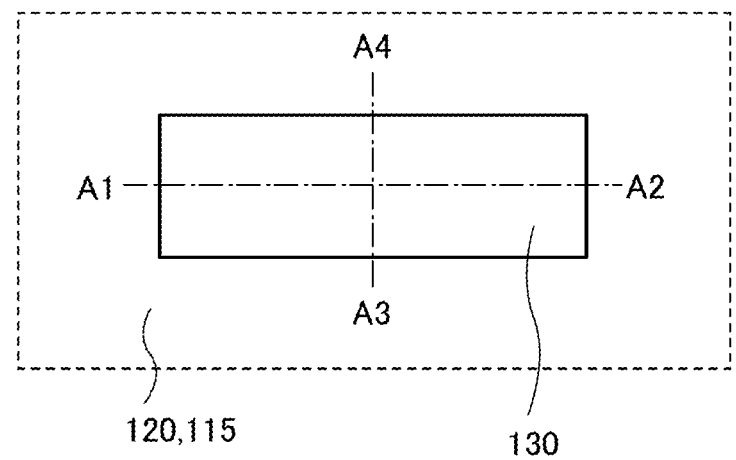
FIGS. 69A and 69B are a top view and a cross-sectional view illustrating a semiconductor layer.
Figure 69B:
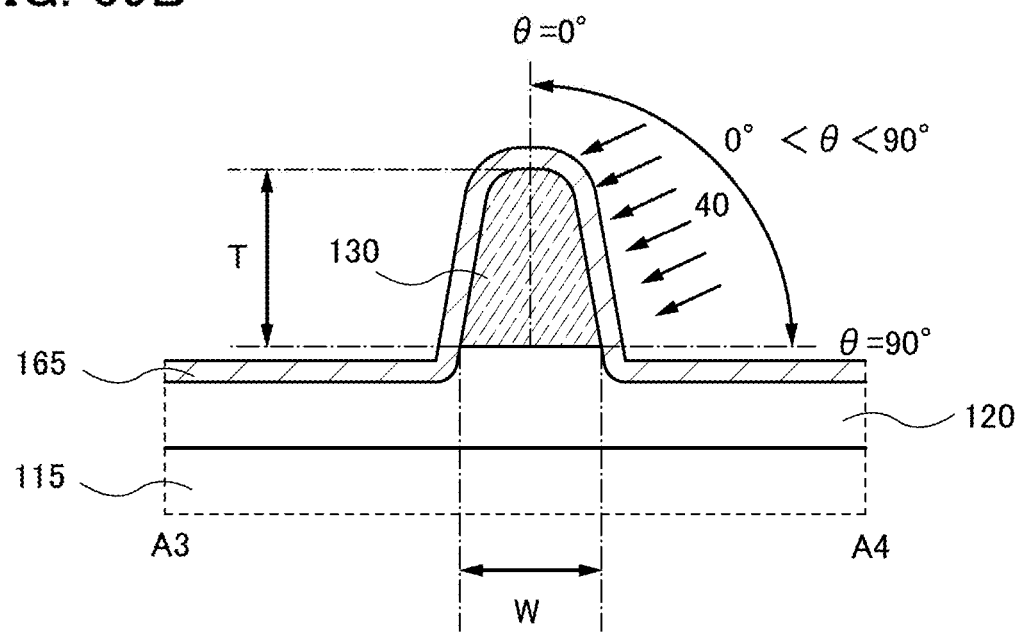

FIGS. 69A and 69B are a top view and a cross-sectional view of the oxide semiconductor layer 130 and a block layer 165 which are used in a transistor of one embodiment of the present invention, showing a mode different from the above mode. FIG. 69A is the top view. FIG. 69B illustrates the cross section taken along dashed-dotted line A3-A4 in FIG. 69A.

The insulating layer 120 is formed over the substrate 115 having a substantially planar surface. The oxide semiconductor layer 130 is formed over the insulating layer 120. The block layer 165 in contact with the oxide semiconductor layer 130 is formed. The insulating layer 120 preferably includes excessive oxygen because it serves as a base insulating film being an oxygen supply source described above. At least in the vicinity of a region of the oxide semiconductor layer 130 being in contact with the insulating layer 120, oxygen defects can be reduced by oxygen diffused from the insulating layer 120. The block layer 165 has the effect of reducing damage on the oxide semiconductor layer 130 due to ion implantation.

Note that a substantially planar surface denotes, in general meaning, a surface without intended unevenness or undulation. A surface with a microscopic unevenness or undulation is included in a substantially planar surface. Therefore, the insulating layer 120 formed over the substrate 115 having a substantially planar surface also has a substantially planar surface.

In one embodiment of the present invention, the oxide semiconductor layer 130 has a thickness larger than a channel width (i.e., T>W) in the cross section in the channel width direction. The cross section in the channel width direction of the oxide semiconductor layer 130 is substantially trapezoidal, and a top portion is preferably combined with a side portion with curvature. This structure improves the on-state current and the coverage of the oxide semiconductor layer 130 with a gate insulating film (the insulating layer 160); thus, the gate insulating film can be easily made thin. Moreover, the oxide semiconductor layer 130 without a local convex or concave portion where an electric field concentrates can be obtained; thus, a transistor with high gate withstand voltage can be formed.

The oxide semiconductor layer 130 in one embodiment of the present invention preferably includes crystals in which c-axes are aligned perpendicularly to the substantially planar surface of the substrate 115 or the insulating layer 120, which is referred to as a c-axis aligned crystalline oxide semiconductor (CAAC-OS) film. Using the CAAC-OS film improves reliability and electrical characteristics of the transistor.

When an angle θ perpendicular to the substantially planar surface of the substrate 115 or the insulating layer 120 is set to 0° and an angle θ parallel to the substantially planar surface is set to 90°, implantation of oxygen ions 40 is performed on the top surface of the oxide semiconductor layer 130 and the side surfaces of the oxide semiconductor layer 130 in a cross-section perpendicular to the substantially planar surface in a channel width direction of the oxide semiconductor layer 130 from an angle 0°<θ<90°, preferably 10°<θ<85°, more preferably 20°<θ<80° (see FIG. 1B), and still more preferably, from an angle perpendicular to the side surfaces of the oxide semiconductor layer 130 in a cross-section perpendicular to the substantially planar surface in the channel width direction of the oxide semiconductor layer. The angle may be changed during the oxygen ion implantation. Note that in the mode illustrated in FIGS. 69A and 69B, ion implantation is performed on the top surface of the oxide semiconductor layer 130 and the side surfaces of the oxide semiconductor 130 layer in a cross-section perpendicular to the substantially planar surface in the channel width direction of the oxide semiconductor layer 130 through the block layer 165 from the above-described angle.

Ion implantation may be performed under the conditions that ion species are $^{16}O_2^+$, acceleration voltage is 5 kV, and a dosage is less than 1E16 cm$^{-2}$ or under the conditions that ion species are $^{16}O^+$, acceleration voltage is 5 kV, and a dosage is less than 1E15 cm$^{-2}$.

Since the implantation of the oxygen ions 40 is performed on the side surface of the oxide semiconductor layer in the above-described manner, oxygen can be supplied in the overall thickness direction without breaking crystals even in the case where the thickness of the oxide semiconductor layer 130 is large. Particularly in the case where the CAAC-OS film is used, oxygen is likely to be diffused in a direction perpendicular to the c-axis direction. For this reason, oxygen can be supplied in the overall thickness direction efficiently when the oxygen ions 40 are implanted to the side surface of the oxide semiconductor layer 130.

The characteristic of the CAAC-OS film that oxygen is likely to be diffused in the direction perpendicular to the c-axis direction (the horizontal direction) will be described.

Here, as an example of the CAAC-OS film, ease of excessive oxygen (oxygen atoms in excess of those in the stoichiometric composition) transfer and ease of oxygen vacancy transfer in an In—Ga—Zn-based oxide (hereinafter, referred to as IGZO) film are described with reference to scientific calculation results.

Note that the calculation was performed in such a manner that models in which one excessive oxygen or oxygen vacancy existed in an In—O plane of IGZO with an atomic ratio of In:Ga:Zn=3:1:2 were made by geometry optimization (see FIGS. 60A to 60C and FIGS. 62A to 62C), and energy to an intermediate structure along a minimum energy path in each model was calculated by a nudged elastic band (NEB) method.

The calculation was performed using calculation program software "OpenMX" based on the density functional theory (DFT). Parameters are described below.

As a basis function, a pseudo-atomic localized basis function was used. The basis function is classified as polarization basis sets STO (slater type orbital).

As a functional, generalized-gradient-approximation/ Perdew-Burke-Ernzerhof (GGA/PBE) was used.

The cut-off energy was 200 Ry.

The sampling point k was 5×5×3.

In the calculation of ease of excessive oxygen transfer, the number of atoms which existed in the calculation model was set to 85. In the calculation of ease of oxygen vacancy transfer, the number of atoms which existed in the calculation model was set to 83.

Ease of excessive oxygen transfer and ease of oxygen vacancy transfer are evaluated by calculation of a height of energy barrier Eb which is required to go over in moving to respective sites. That is, when the height of energy barrier Eb which is gone over in moving is high, excessive oxygen or oxygen vacancy hardly moves, and when the height of the energy barrier Eb is low, excessive oxygen or oxygen vacancy easily moves.

Figure 61:
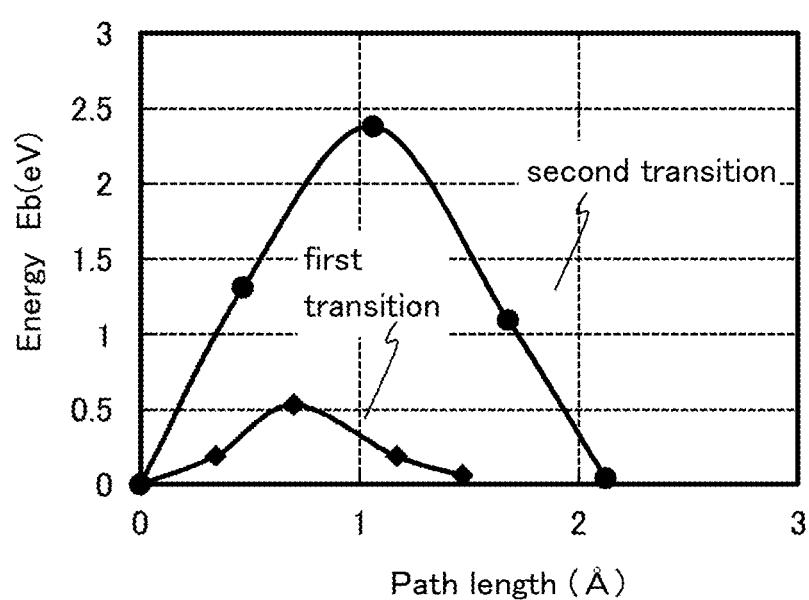
FIG. 61 shows calculation results of excessive oxygen transfer.

First, the movement of excessive oxygen is described. FIGS. 60A to 60C show models used in calculation of the movement of excessive oxygen. Note that the longitudinal direction in each of the models corresponds to a c-axis of crystal axes. The calculations of two transfer patterns described below were performed. FIG. 61 shows the calculation results. In FIG. 61, the horizontal axis represents a path length (for the movement of excessive oxygen) and the vertical axis represents energy (which is needed for the movement) with respect to energy in a state of Model A in FIG. 60A.

Of the two transfer patterns in the case of the movement of the excessive oxygen, the first transfer is the one from Model A to Model B. The second transfer is the one from Model A to Model C.

In FIGS. 60A to 60C, an oxygen atom denoted by "1" is referred to as a first oxygen atom of Model A; an oxygen atom denoted by "2" is referred to as a second oxygen atom of Model A; and an oxygen atom denoted by "3" is referred to as a third oxygen atom of Model A.

As seen from FIG. 61, the maximum value ($Eb_{max}$) of the height Eb of the energy barrier in the first transfer is 0.53 eV, and that in the second transfer is 2.38 eV. That is, the maximum value ($Eb_{max}$) of the height Eb of the energy barrier in the first transfer is lower than that in the second transfer. Therefore, energy required for the first transfer is lower than energy required for the second transfer, and the first transfer occurs more easily than the second transfer.

That is, the first oxygen atom of Model A moves in the direction in which the second oxygen atom of Model A is pushed more easily than in the direction in which the third oxygen atom of Model A is pushed. Therefore, this shows that the oxygen atom moves along the layer of indium atoms more easily than across the layer of indium atoms.

Figure 62A:
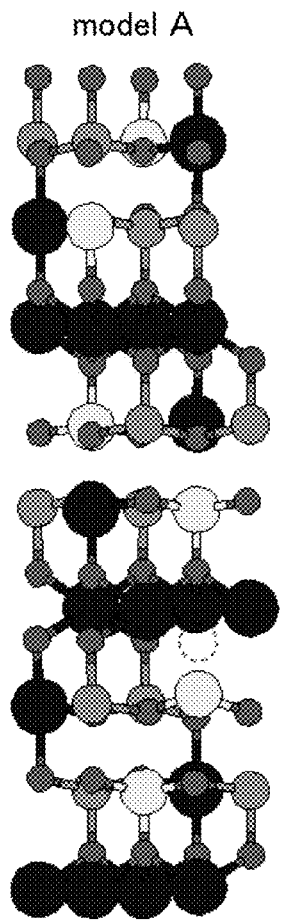
FIGS. 62A to 62C are model diagrams used for calculation of oxygen vacancy transfer.
Figure 62B:
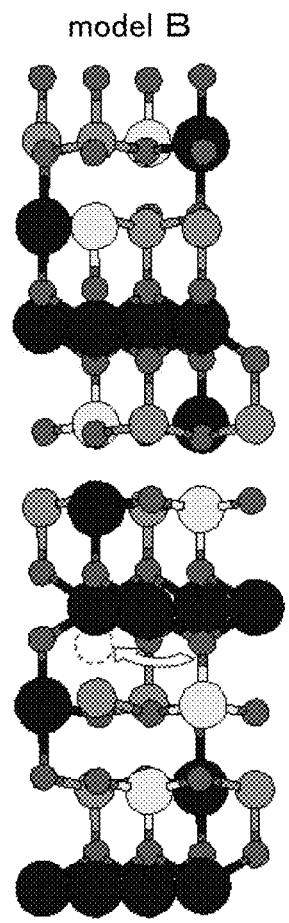
Figure 62C:
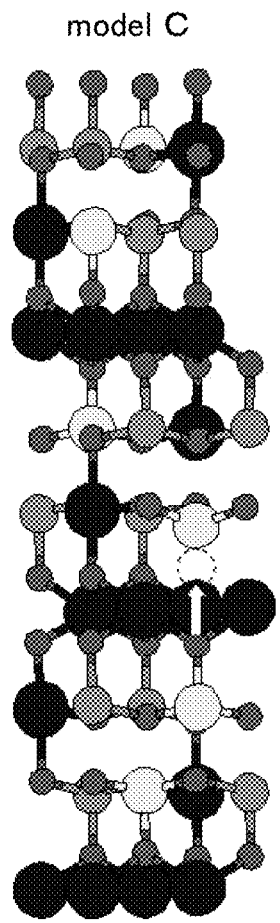
Figure 63:
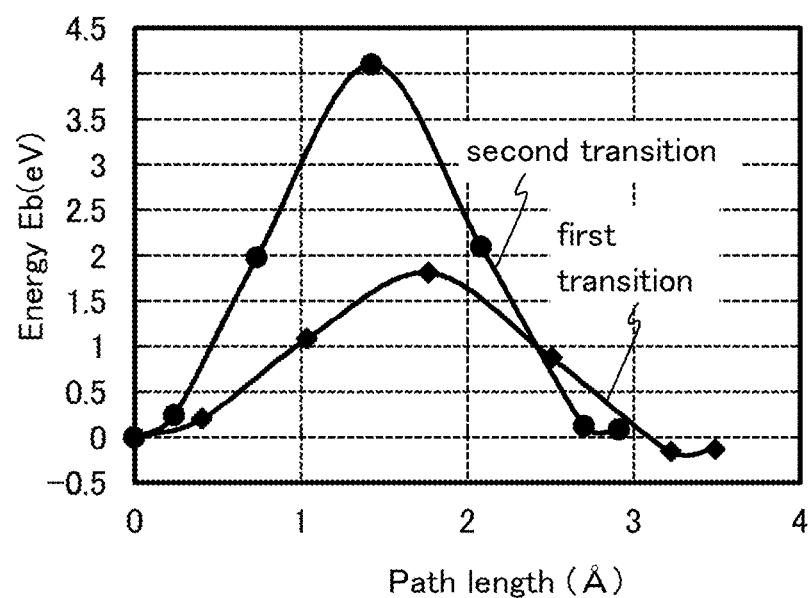
FIG. 63 shows calculation results of oxygen vacancy transfer.

Next, the movement of oxygen vacancy is described. FIGS. 62A to 62C show models used in calculation of the movement of oxygen vacancy. The calculations of two transfer patterns described below were performed. FIG. 63 shows the calculation results. In FIG. 63, the horizontal axis represents a path length (for the movement of oxygen vacancy) and the vertical axis represents energy (which is needed for the movement) with respect to energy in a state of Model A in FIG. 62A.

Of the two transfer patterns in the case of the movement of the oxygen vacancy, the first transfer is the one from Model A to Model B. The second transfer is the one from Model A to Model C.

Note that dashed circles in FIGS. 62A to 62C represent oxygen vacancy.

As seen from FIG. 63, the maximum value ($Eb_{max}$) of the height Eb of the energy barrier in the first transfer is 1.81 eV, and that in the second transfer is 4.10 eV. That is, the maximum value ($Eb_{max}$) of the height Eb of the energy barrier in the first transfer is lower than that in the second transfer. Therefore, energy required for the first transfer is lower than energy required for the second transfer, and the first transfer occurs more easily than the second transfer.

That is, the oxygen vacancy of Model A moves to the position of oxygen vacancy of Model B more easily than to the position of oxygen vacancy of Model C. Therefore, this shows that the oxygen vacancy also moves along the layer of indium atoms more easily than across the layer of indium atoms.

Next, in order to compare probabilities of occurrence of the above-described four transfer patterns from another side, temperature dependence of each of these transfers is described. The above-described four transfer patterns are (1) the first transfer of excessive oxygen, (2) the second transfer of excessive oxygen, (3) the first transfer of oxygen vacancy, and (4) the second transfer of oxygen vacancy.

Temperature dependences of these transfers are compared with each other based on movement frequency per unit time. Here, movement frequency Z (per second) at certain temperature T (K) is represented by Formula (1) when the number of vibrations Zo (per second) of an oxygen atom in the chemically stable position is used.

$$Z = Zo \cdot \exp\left(-\frac{Eb_{max}}{kT}\right) \quad \text{[Formula 1]}$$

Note that $Eb_{max}$ represents the maximum value of the height Eb of the energy barrier in each transfer and k represents Boltzmann constant in Formula (1). Further, $Zo=1.0\times10^{13}$ (per second) is used for the calculation.

In the case where the excessive oxygen or the oxygen vacancy moves beyond the maximum value ($Eb_{max}$) of the height Eb of the energy barrier once per second (in the case of Z=1 (per second)), when Formula (1) is solved for T, the following are obtained.

(1) The first transfer of excessive oxygen: T=206 K (−67° C.).
(2) The second transfer of excessive oxygen: T=923 K (650° C.).
(3) The first transfer of oxygen vacancy: T=701 K (428° C.).
(4) The second transfer of oxygen vacancy: T=1590 K (1317° C.).

As for Z when T=300 K (27° C.), (1) the first transfer of excessive oxygen: $Z=1.2\times10^4$ (per second), (2) the second transfer of excessive oxygen: $Z=1.0\times10^{-27}$ (per second) (3) the first transfer of oxygen vacancy: $Z=4.3\times10^{-18}$ (per second) (4) the second transfer of oxygen vacancy: $Z=1.4\times10^{-56}$ (per second).

As for Z when T=723 K (450° C.), (1) the first transfer of excessive oxygen: $Z=2.0\times10^9$ (per second), (2) the second transfer of excessive oxygen: $Z=2.5\times10^{-4}$ (per second), (3) the first transfer of oxygen vacancy: Z=2.5 (per second), (4) The second transfer of oxygen vacancy: $Z=2.5\times10^{-16}$ (per second).

In view of the above-described calculation, excessive oxygen, in the case of either T=300 K or T=723 K, moves along the layer of indium atoms more easily than across the layer of indium atoms. Moreover, oxygen vacancy also, in the case of either T=300 K or T=723 K, moves along the layer of indium atoms more easily than across the layer of indium atoms.

Further, in the case of T=300 K, the movement of excessive oxygen along the layer of indium atoms occurs extremely easily; however, the other transfers do not occur easily. In the case of T=723K, not only the movement of excessive oxygen along the layer of indium atoms but the movement of oxygen vacancy along the layer of indium atoms occurs easily; however, it is difficult for either the excessive oxygen or the oxygen vacancy to move across the layer of indium atoms.

That is, it can be said that in the case where the layer of indium atoms exists in a plane parallel to a surface where a film is formed or a surface of the film (e.g., the case of a CAAC-OS film), excessive oxygen and oxygen vacancy easily move in a parallel direction to the surface where the film is formed or the surface of the film.

As described above, in the CAAC-OS film, excessive oxygen easily move along a surface where the CAAC-OS film is formed or a surface of the CAAC-OS film. Thus, when the oxide semiconductor layer is the CAAC-OS film, oxygen is likely to be diffused in the direction perpendicular to the c-axis direction (the horizontal direction) than in the c-axis direction (the vertical direction).

Note that the case where the excessive oxygen or the oxygen vacancy moves across the layer of indium atoms is described above; however, the present invention is not limited thereto, and the same applies to metals other than indium which are contained in an oxide semiconductor film.

Figure 2A:
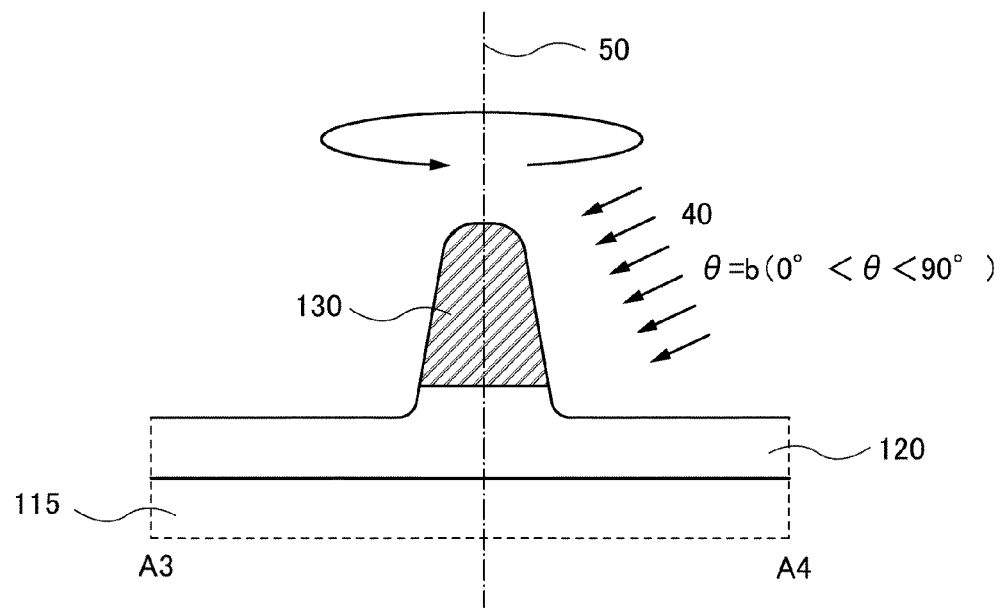
FIGS. 2A and 2B are cross-sectional views illustrating a semiconductor layer.
Figure 70A:
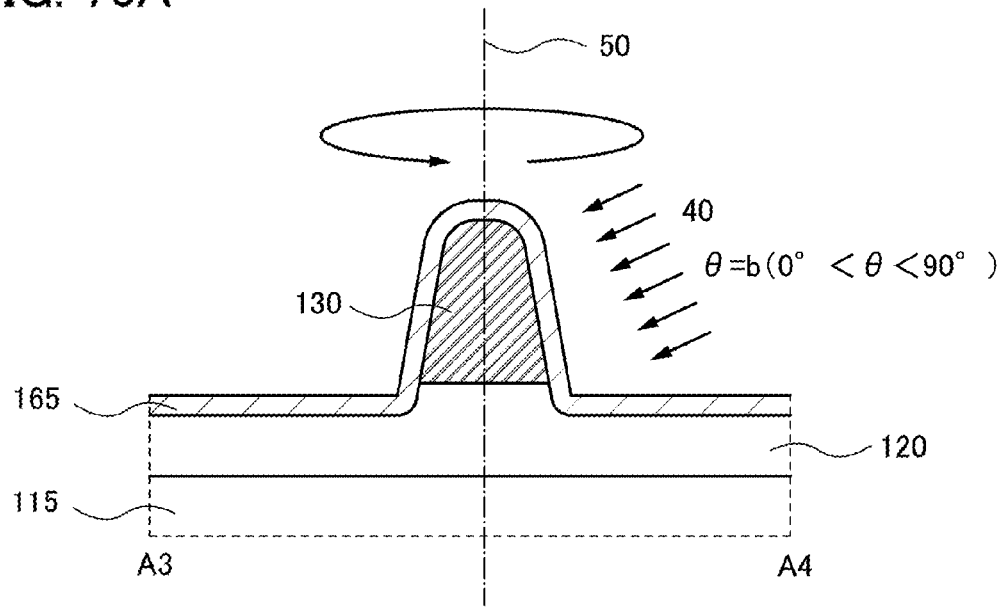
FIGS. 70A and 70B are cross-sectional views illustrating a semiconductor layer.

In one embodiment of the present invention, as shown in FIG. 2A, the angle of implantation of oxygen ions 40 is set to 0°<θ<90°, preferably 10°<θ<85°, preferably 20°<θ<80°, more preferably, an angle perpendicular to the side surface of the oxide semiconductor layer 130 in a cross-section perpendicular to the substantially planar surface in the channel width direction of the oxide semiconductor layer 130. During the implantation, the substrate 115 may be rotated around an axis 50 perpendicular to the substantially planar surface of the substrate 115 or the insulating layer 120. The substrate 115 may be rotated while the angle is changed within the above-described range during the implantation of the oxygen ions 40. In the mode illustrated in FIGS. 69A and 69B, oxygen ion implantation is performed on the oxide semiconductor layer 130 through the block layer 165 as shown in FIG. 70A.

When the substrate 115 is rotated during the implantation of the oxygen ions 40 as described above, oxygen can be supplied uniformly to the oxide semiconductor layer 130 in the thickness direction.

Figure 2B:
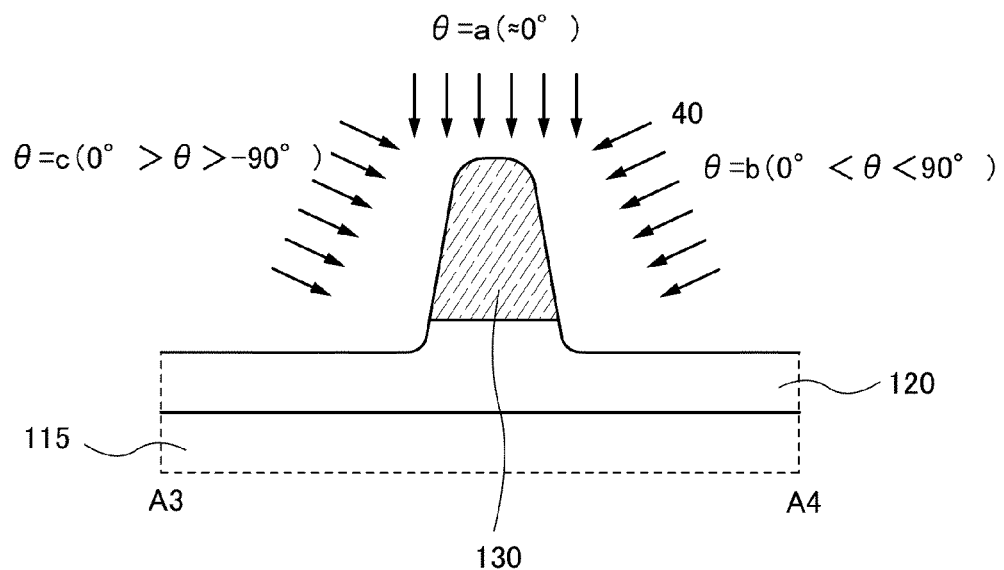
Figure 70B:
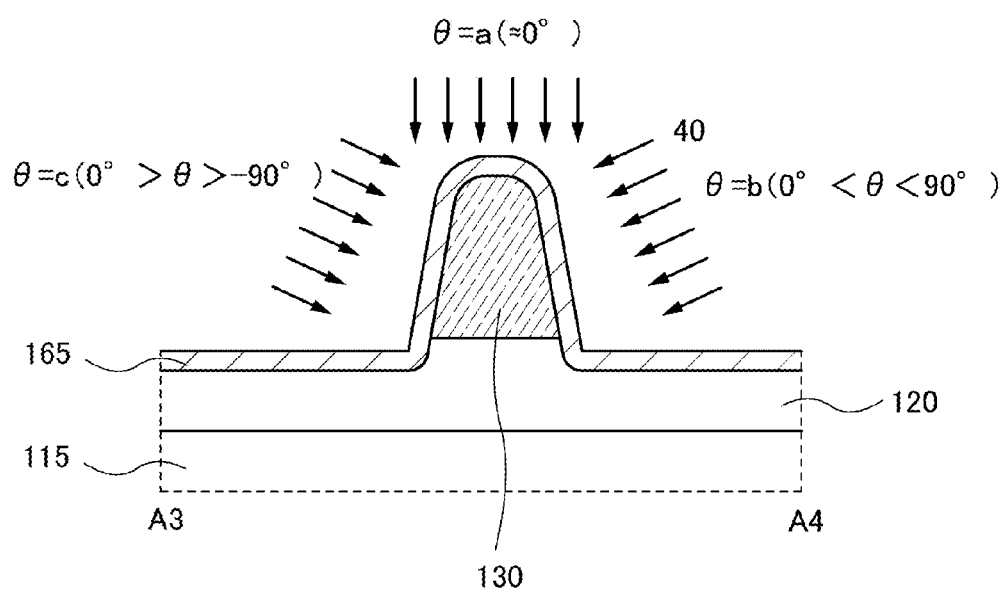

In one embodiment of the present invention, as shown in FIG. 2B, implantation of the oxygen ions 40 may be performed plural times: from an angle substantially 0° on the top surface of the oxide semiconductor layer 130 and the side surfaces of the oxide semiconductor layer 130 in a cross-section perpendicular to the substantially planar surface in the channel width direction of the oxide semiconductor layer 130, and from $0°<\theta<90°$, preferably $10°<\theta<85°$, preferably $20°<\theta<80°$, still preferably, an angle perpendicular to the side surface of the oxide semiconductor layer 130 in a cross-section perpendicular to the substantially planar surface in the channel width direction of the oxide semiconductor layer 130. For example, implantation of the oxygen ions 40 is performed on the top surface of the oxide semiconductor layer 130 from $\theta=a$ (substantially 0°) and is performed on the side surfaces of the oxide semiconductor layer 130 from $\theta=b$ ($0°<\theta<90°$) and $\theta=c$ ($0°>\theta>-90°$). The oxygen ion implantation may be performed with the combination of only $\theta=a$ and $\theta=b$. The oxygen ion implantation may be performed from a plurality of angles. During the implantation, the substrate 115 may be rotated around an axis perpendicular to the substantially planar surface of the substrate 115 or the insulating layer 120. In the mode illustrated in FIGS. 69A and 69B, oxygen ion implantation is performed on the oxide semiconductor layer 130 through the block layer 165 as shown in FIG. 70B.

When the implantation of the oxygen ions 40 is performed plural times at plural angles on the top surface of the oxide semiconductor layer 130 and the side surfaces of the oxide semiconductor layer 130 in a cross-section perpendicular to the substantially planar surface in the channel width direction of the oxide semiconductor layer 130 as described above, oxygen can be supplied uniformly to the oxide semiconductor layer 130 in the thickness direction.

Note that heat treatment is preferably performed in order to diffuse the oxygen ions 40 implanted into the oxide semiconductor layer 130 (the oxygen ions 40 includes the state of oxygen atoms or oxygen molecules in the oxide semiconductor layer 130) to the oxide semiconductor layer 130 in the overall thickness direction. However, when the heat treatment is performed immediately after the implantation of the oxygen ions 40, oxygen release from the oxide semiconductor layer 130 easily occurs. For this reason, the heat treatment is preferably performed after an oxygen-impermeable film is formed to cover the oxide semiconductor layer 130. Note that the heat treatment may be performed in a furnace or the like or using a rapid thermal anneal method (RTA). The block layer 165 in contact with the oxide semiconductor layer 130 in the mode show in FIGS. 69A and 69B also has the effect of suppressing oxygen release.

As the block layer 165, an oxide film such as a silicon oxide film and a silicon oxynitride film can be used. The oxide film can be used as a gate insulating film.

Alternatively, an oxide semiconductor layer can be used as the block layer 165. When a first oxide semiconductor layer includes a channel formation region and contains In, Zn, and M (M is Al, Ti, Ga, Y, Zr, La, Ce, Nd, or Hf), for example, a second oxide semiconductor layer in which an atomic ratio of M to In is larger than that in the first oxide semiconductor layer can be used as the block layer. As the second oxide semiconductor layer, an oxide semiconductor such as gallium oxide can also be used.

Specifically, the first oxide semiconductor layer may be formed using In:Ga:Zn=1:1:1 (atomic ratio), and the second oxide semiconductor layer may be formed using In:Ga:Zn=1:3:2 (atomic ratio), In:Ga:Zn=1:3:4 (atomic ratio), or the like. Furthermore, the second oxide semiconductor layer preferably includes a crystal in which c-axes are aligned in a direction perpendicular to a surface of the first oxide semiconductor layer.

Next, the second oxide semiconductor layer which can be used as an oxygen block layer is described.

Figure 64A:
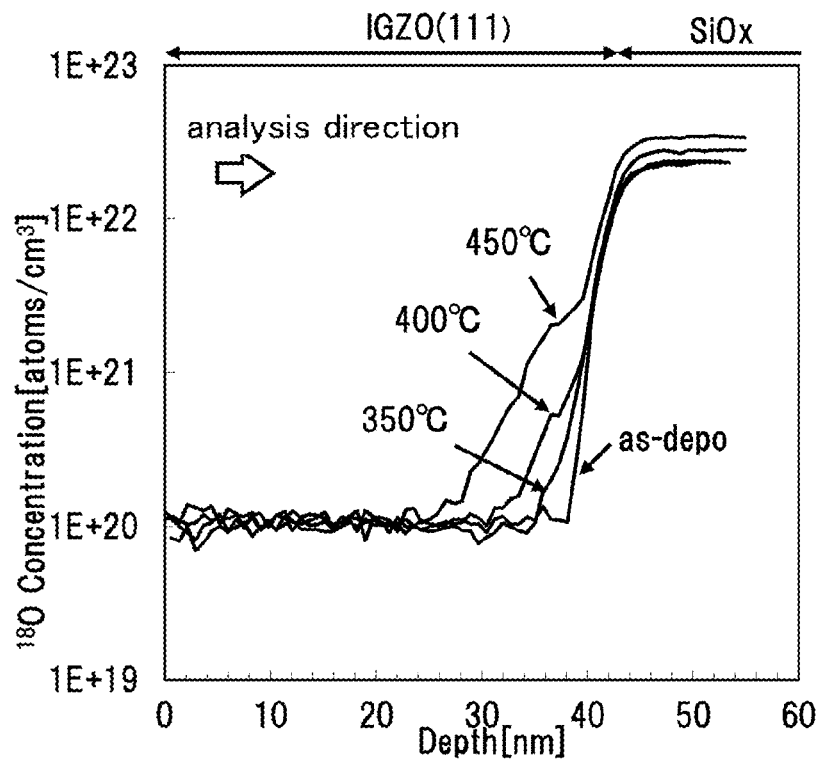
FIGS. 64A and 64B each show a depth profile of $^{18}$O in an In—Ga—Zn oxide film.
Figure 64B:
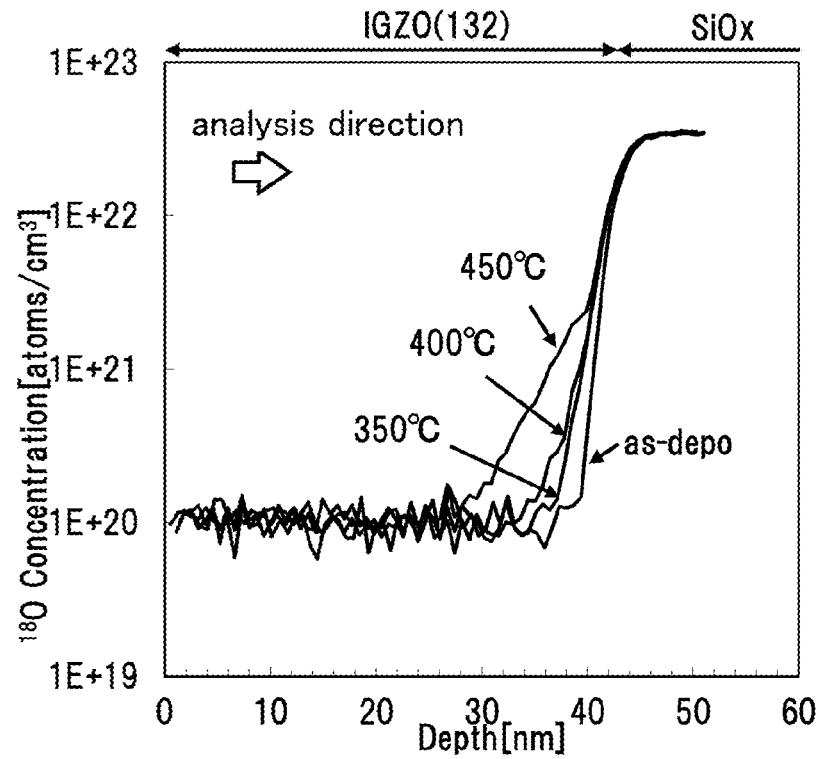

FIGS. 64A and 64B show results of secondary ion mass spectrometry (SIMS) analysis of oxygen after formation of oxide semiconductor films with different composition over a silicon oxide film and various heat treatment is performed. Note that the silicon oxide film is formed using $^{18}O_2$, which is isotopes of oxygen, as a sputtering gas by a sputtering method. Oxygen diffused from the silicon oxide film to the oxide semiconductor film can be quantified by analyzing $^{18}O$. The heat treatment at 350° C., 400° C., and 450° C. are each performed in a nitrogen atmosphere for an hour and an oxygen atmosphere for an hour.

FIG. 64A shows a depth profile of $^{18}O$ included in an oxide semiconductor film with In:Ga:Zn=1:1:1 (atomic ratio) which can be used as the first oxide semiconductor layer. FIG. 64B shows a depth profile of $^{18}O$ included in an oxide semiconductor film with In:Ga:Zn=1:3:2 (atomic ratio) which can be used as the second oxide semiconductor layer. As compared to these, the diffusion amount of oxygen ($^{18}O$) of the oxide semiconductor film with In:Ga:Zn=1:3:2 (atomic ratio) is smaller. That is, oxygen is not likely to be diffused relatively into the oxide semiconductor film with In:Ga:Zn=1:3:2 (atomic ratio).

Next, the relationship between crystallinity and oxygen permeability of an In—Ga—Zn oxide will be described.

An energy barrier due to movement of excess oxygen (oxygen) in a crystal of an In—Ga—Zn oxide is obtained by calculation. In the calculation, plane-wave basis first-principles calculation software Vienna ab-initio simulation package (VASP) based on density functional theory is used. GGA-PBE is used as a functional. Cut-off energy of a plane wave is 400 eV. The effect of an inner shell electron is included by a projector augmented wave (PAW) method.

Figure 65:
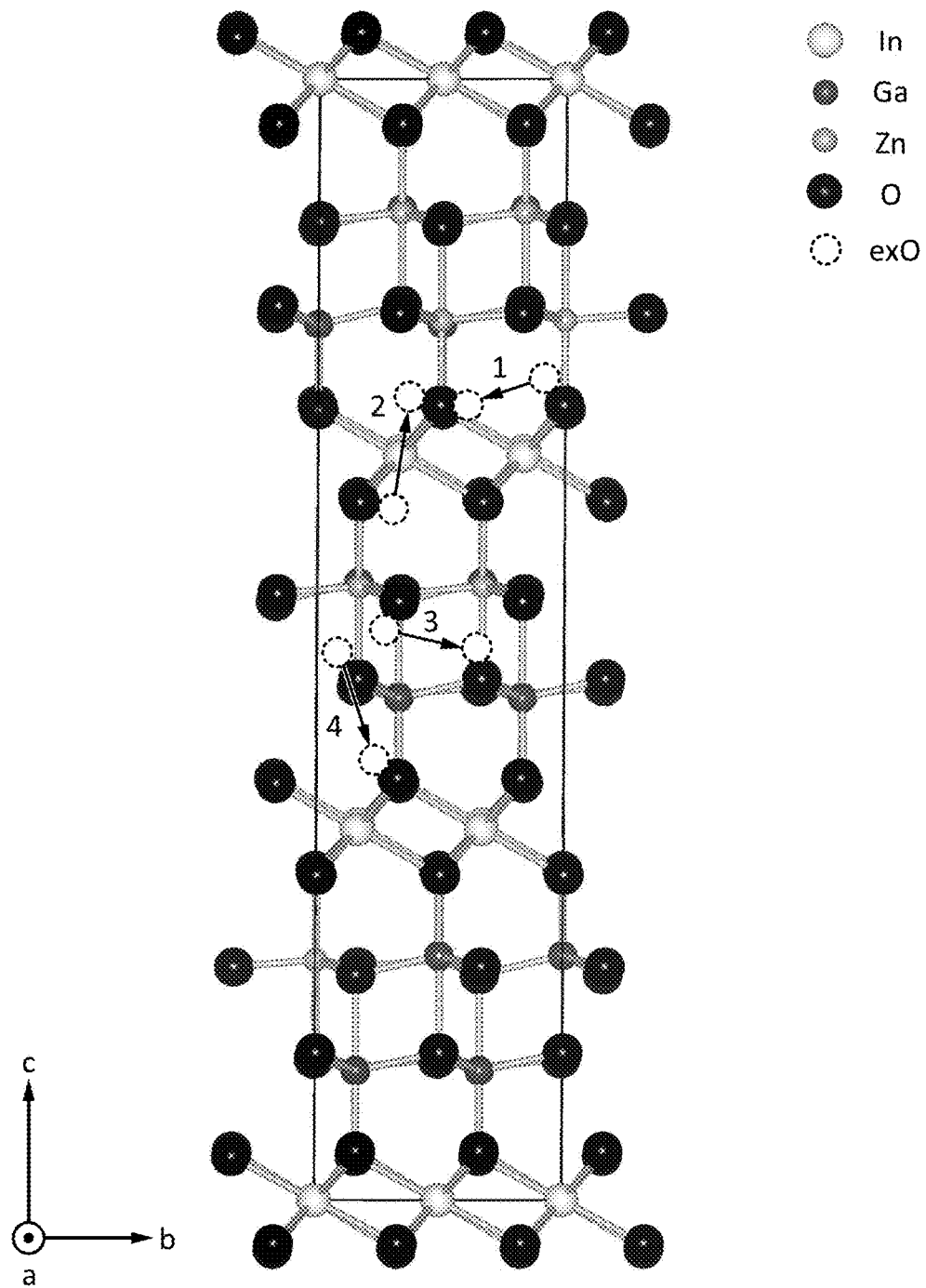
FIG. 65 is a view illustrating a movement path of oxygen in an In—Ga—Zn oxide.

Here, the ease of movement of excess oxygen (oxygen) through movement paths 1 to 4 in a crystal of an In—Ga—Zn oxide illustrated in FIG. 65 is calculated.

The movement path 1 is a path through which excess oxygen (oxygen) bonded to oxygen bonded to three indium atoms and one zinc atom is bonded to adjacent oxygen bonded to three indium atoms and one zinc atom. The movement path 2 is a path through which excess oxygen (oxygen) bonded to oxygen bonded to three indium atoms and one gallium atom crosses a layer containing indium and oxygen and is bonded to adjacent oxygen bonded to three indium atoms and one zinc atom. The movement path 3 is a path through which excess oxygen (oxygen) bonded to oxygen bonded to two gallium atoms and one zinc atom is bonded to adjacent oxygen bonded to two zinc atoms and one gallium atom. The movement path 4 is a path through which excess oxygen (oxygen) bonded to oxygen bonded to two gallium atoms and one zinc atom crosses a layer containing gallium, zinc, and oxygen and is bonded to adjacent oxygen bonded to three indium atoms and one gallium atom.

When the frequency of going over an energy barrier $E_a$ per unit time is referred to as a diffusion frequency R, R can be expressed as the following formula.

$$R = \nu \cdot \exp[-E_a/(k_B T)]$$

Note that $\nu$ represents the number of heat vibrations of diffusion atoms, $k_B$ represents Boltzmann constant, and T represents the absolute temperature. The diffusion frequency R at 350° C. and 450° C. when $10^{13}$ [1/sec] is applied to $\nu$ as Debye frequency is shown in Table 1.

TABLE 1

| | Energy barrier [eV] | Diffusion frequency R [1/sec] | |
|---|---|---|---|
| | | 350° C. | 450° C. |
| Movement path 1 | 0.50 | $9.0 \times 10^8$ | $3.3 \times 10^9$ |
| Movement path 2 | 1.97 | $1.2 \times 10^{-3}$ | $1.9 \times 10^{-1}$ |
| Movement path 3 | 0.53 | $5.2 \times 10^8$ | $2.0 \times 10^9$ |
| Movement path 4 | 0.56 | $3.0 \times 10^8$ | $1.3 \times 10^9$ |

As shown in Table 1, the movement path 2 across the layer containing indium and oxygen has a higher energy barrier than the other movement paths. This indicates that movement of excess oxygen (oxygen) in the c-axis direction is less likely to occur in a crystal of an In—Ga—Zn oxide. In other words, in the case where crystals have c-axis alignment and the c-axes are aligned in a direction substantially perpendicular to a formation surface or a top surface, like CAAC-OS, movement of excess oxygen (oxygen) is less likely to occur in the direction substantially perpendicular to the formation surface or the top surface.

That is, when an oxide semiconductor layer being c-axis aligned in the direction perpendicular to the surface of the first oxide semiconductor layer is used as the second oxide semiconductor layer, oxygen blocking property can be increased.

This embodiment can be combined with any of the other embodiments in this specification as appropriate.

Embodiment 2

In this embodiment, a transistor formed using the method in which oxygen is supplied to an oxide semiconductor layer described in Embodiment 1 is described with reference to drawings.

Figure 3A:
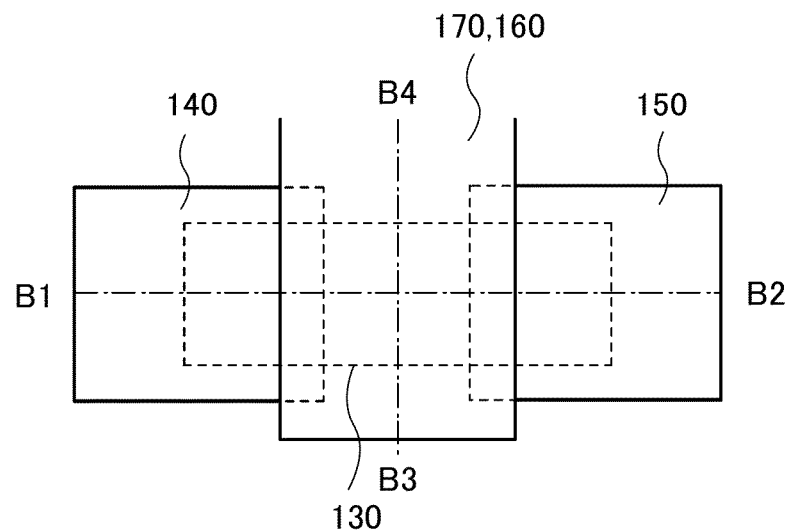
FIGS. 3A and 3B are a top view and a cross-sectional view illustrating a transistor.
Figure 3B:
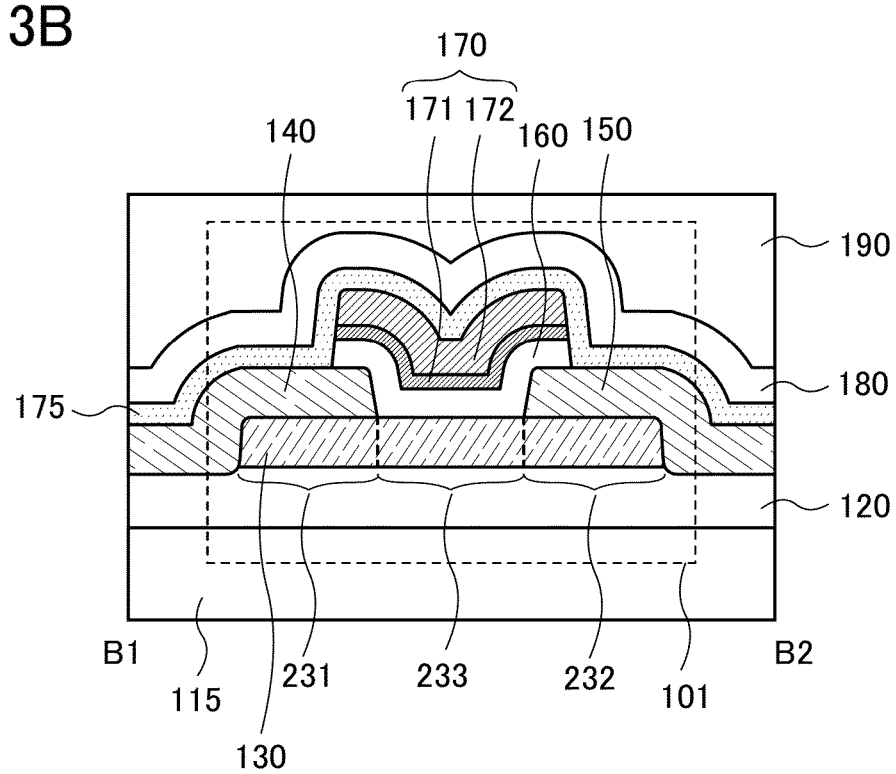

FIGS. 3A and 3B are a top view and a cross-sectional view illustrating a transistor 101 of one embodiment of the present invention. FIG. 3A is a top view, and a cross section in the direction of a dashed-dotted line B1-B2 in FIG. 3A is illustrated in FIG. 3B. A cross section in the direction of a dashed-dotted line B3-B4 in FIG. 3A is illustrated in FIG. 9. In the drawings, some components are enlarged, reduced in size, or omitted for easy understanding. In some cases, the direction of the dashed-dotted line B1-B2 is referred to as a channel length direction, and the direction of the dashed-dotted line B3-B4 is referred to as a channel width direction.

The transistor 101 includes an insulating layer 120 in contact with a substrate 115; an oxide semiconductor layer 130 in contact with the insulating layer 120; a conductive layer 140 and a conductive layer 150 electrically connected to the oxide semiconductor layer 130; an insulating layer 160 in contact with the oxide semiconductor layer 130, the conductive layer 140, and the conductive layer 150; a conductive layer 170 in contact with the insulating layer 160; an insulating layer 175 in contact with the conductive layer 140, the conductive layer 150, the insulating layer 160, and the conductive layer 170; and an insulating layer 180 in contact with the insulating layer 175. The transistor 101 may also include, for example, an insulating layer 190 (planarization film) in contact with the insulating layer 180 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 3B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layer 140 and the conductive layer 150, for example, the resistance of the region 231 and the region 232 can be reduced.

Specifically, since the oxide semiconductor layer 130 is in contact with the conductive layer 140 and the conductive layer 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the region 231 and the region 232 to n-type regions with low resistance.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification. In addition, the term "electrode layer" can be replaced with the term "wiring".

The conductive layer 170 includes two layers, a conductive layer 171 and a conductive layer 172, in the drawing, but also may be a single layer or a lamination of three or more layers. The same applies to other transistors described in this embodiment.

Each of the conductive layers 140 and 150 is a single layer in the drawing, but also may be a lamination of two or more layers. The same applies to other transistors described in this embodiment.

Figure 58A:
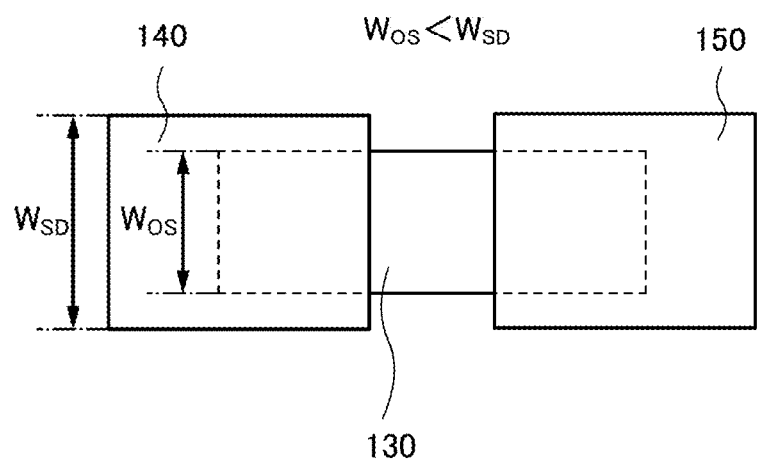
FIGS. 58A and 58B are top views each illustrating a transistor.
Figure 58B:
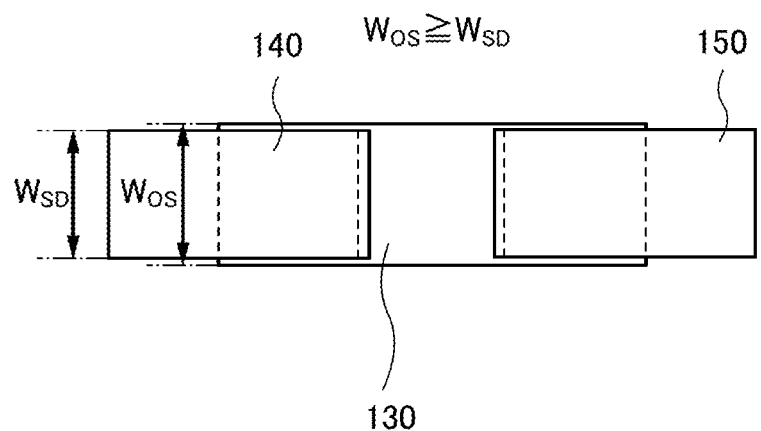

Furthermore, as shown in the top views in FIGS. 58A and 58B (showing only the oxide semiconductor layer 130, the conductive layer 140, and the conductive layer 150), the width ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved. The same applies to other transistors described in this embodiment.

Figure 4A:
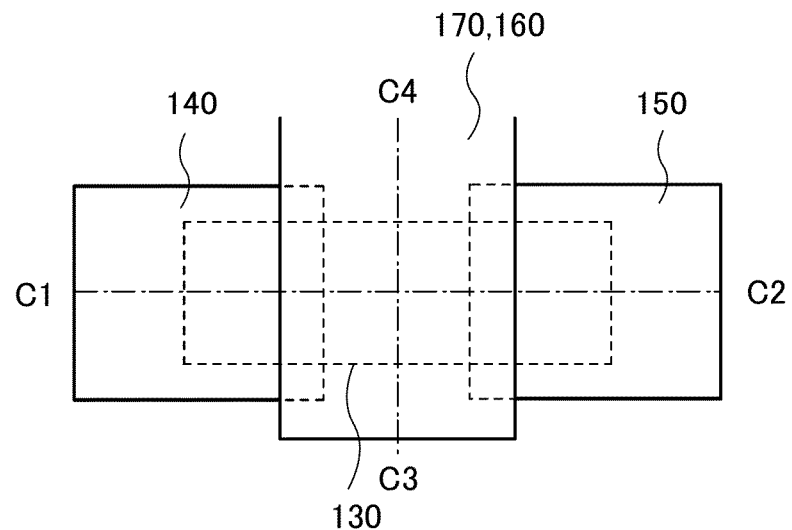
FIGS. 4A and 4B are a top view and a cross-sectional view illustrating a transistor.
Figure 4B:
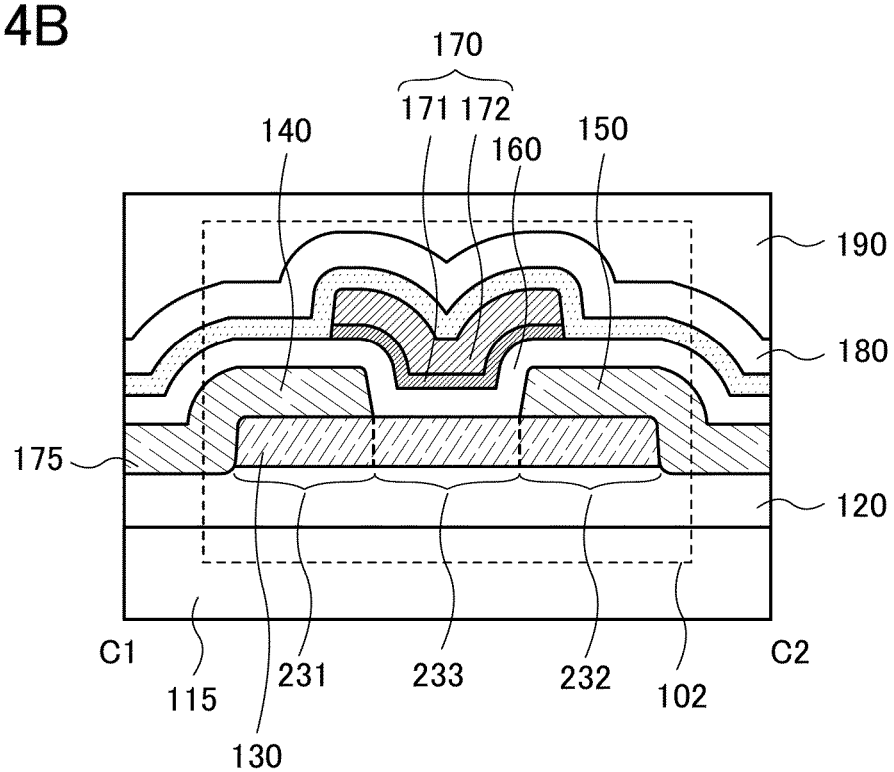

The transistor of one embodiment of the present invention may have a structure illustrated in FIGS. 4A and 4B. FIG. 4A is a top view of a transistor 102. A cross section in the direction of a dashed-dotted line C1-C2 in FIG. 4A is illustrated in FIG. 4B. A cross section in the direction of a dashed-dotted line C3-C4 in FIG. 4A is illustrated in FIG. 9. In the drawings, some components are enlarged, reduced in size, or omitted for easy understanding. In some cases, the direction of the dashed-dotted line C1-C2 is referred to as a channel length direction, and the direction of the dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layer 140 and the conductive layer 150 are covered with the insulating layer 160 and accordingly the resistance between the conductive layer 170 and the conductive layers 140 and 150 is high; therefore, the transistor 102 has a feature of low gate leakage current.

The transistor 101 and the transistor 102 each have a top-gate structure including a region where the conductive layer 170 overlaps with each of the conductive layers 140 and 150. To reduce parasitic capacitance, the width of the region in the channel length direction is preferably greater than or equal to 3 nm and less than 300 nm. Meanwhile, since an offset region is not formed in the oxide semiconductor layer 130, a transistor with high on-state current can be easily be formed.

Figure 5A:
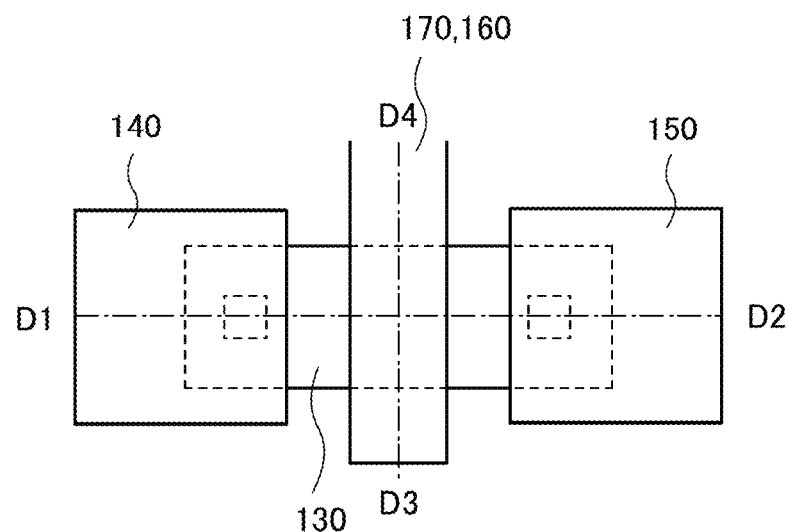
FIGS. 5A and 5B are a top view and a cross-sectional view illustrating a transistor.
Figure 5B:
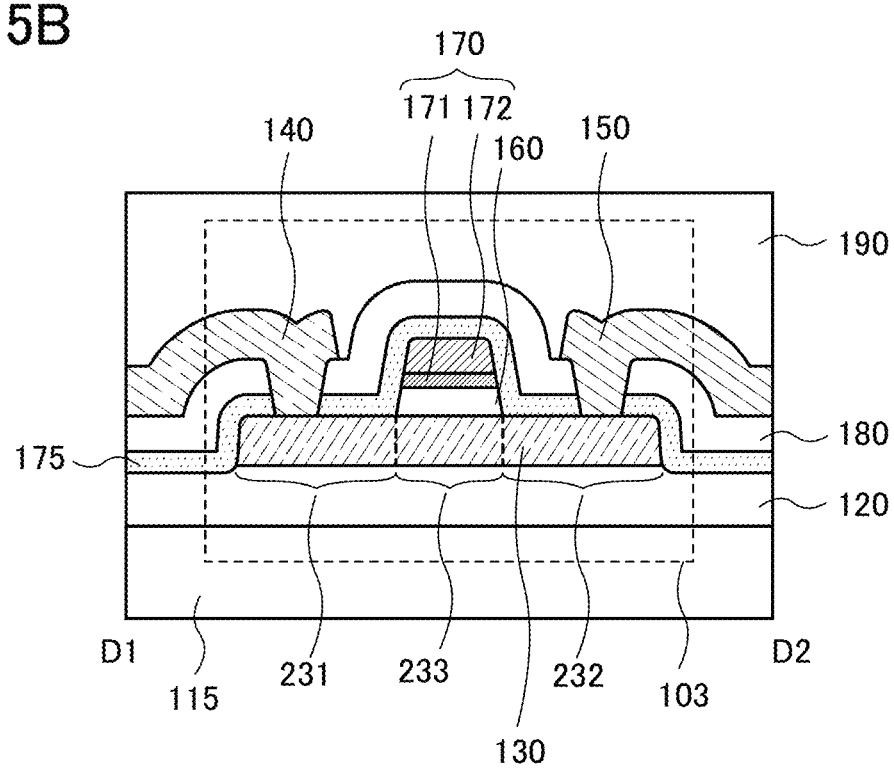

The transistor of one embodiment of the present invention may have a structure illustrated in FIGS. 5A and 5B. FIG. 5A is a top view of a transistor 103. A cross section in the direction of a dashed-dotted line D1-D2 in FIG. 5A is illustrated in FIG. 5B. A cross section in the direction of a dashed-dotted line D3-D4 in FIG. 5A is illustrated in FIG. 9. In the drawings, some components are enlarged, reduced in size, or omitted for easy understanding. In some cases, the direction of the dashed-dotted line D1-D2 is referred to as a channel length direction, and the direction of the dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layer 140 and the conductive layer 150 electrically connected to the oxide semiconductor layer 130 through openings provided in the insulating layer 175 and the insulating layer 180. The transistor 103 may also include, for example, the insulating layer 190 (planarization film) in contact with the insulating layer 180, the conductive layer 140, and the conductive layer 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 5B can function as a source region, a drain region, and a channel formation region, respectively. The region 231 and the region 232 are in contact with the insulating layer 175. When an insulating material containing hydrogen is used for the insulating layer 175, for example, the resistance of the region 231 and the region 232 can be reduced.

Specifically, interaction between an oxygen vacancy generated in the region 231 and the region 232 by the steps up to the formation of the insulating layer 175 and hydrogen that diffuses into the region 231 and the region 232 from the insulating layer 175 changes the region 231 and the region 232 to n-type regions with low resistance. As the insulating material containing hydrogen, for example, silicon nitride, aluminum nitride, or the like can be used.

Figure 6A:
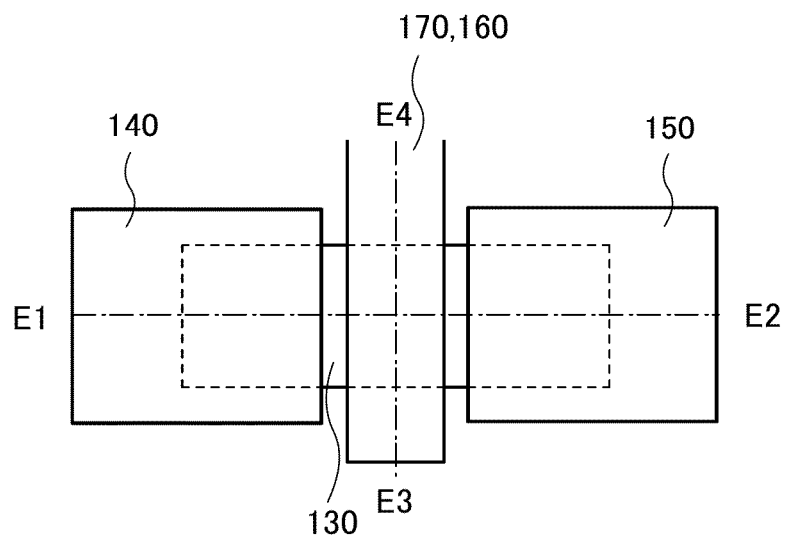
FIGS. 6A and 6B are a top view and a cross-sectional view illustrating a transistor.
Figure 6B:
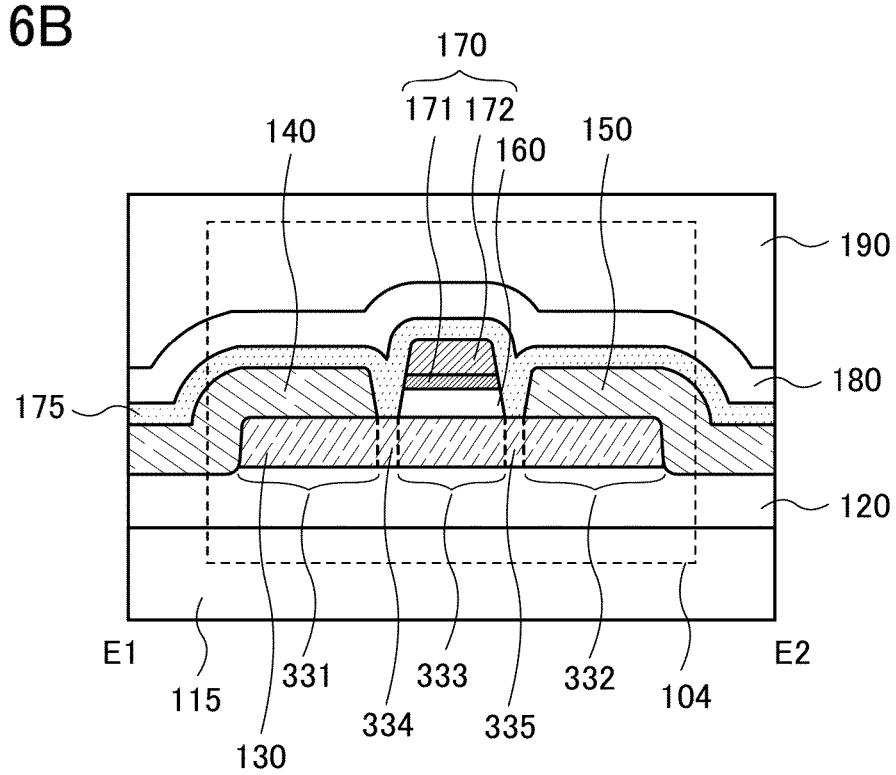

The transistor of one embodiment of the present invention may have a structure illustrated in FIGS. 6A and 6B. FIG. 6A is a top view of a transistor 104. A cross section in the direction of a dashed-dotted line E1-E2 in FIG. 6A is illustrated in FIG. 6B. A cross section in the direction of a dashed-dotted line E3-E4 in FIG. 6A is illustrated in FIG. 9. In the drawings, some components are enlarged, reduced in size, or omitted for easy understanding. In some cases, the direction of the dashed-dotted line E1-E2 is referred to as a channel length direction, and the direction of the dashed-dotted line E3-E4 is referred to as a channel width direction.

The transistor 104 has the same structure as the transistor 103 except that the conductive layer 140 and the conductive layer 150 in contact with the oxide semiconductor layer cover end portions thereof.

In FIG. 6B, a region 331 and a region 334 can function as a source region, a region 332 and a region 335 can function as a drain region, and a region 333 can function as a channel formation region. The resistance of the region 331 and the region 332 can be reduced in a manner similar to that of the region 231 and the region 232 in the transistor 101. The resistance of the region 334 and the region 335 can be reduced in a manner similar to that of the region 231 and the region 232 in the transistor 103. In the case where the width of the region 334 and the region 335 in the channel length direction is less than or equal to 100 nm, preferably less than or equal to 50 nm, a gate electric field contributes to preventing a significant decrease in on-state current; therefore, a reduction in resistance of the region 334 and the region 335 as described above is not necessarily performed.

The transistor 103 and the transistor 104 each have a self-aligned structure not including a region where the conductive layer 170 overlaps with each of the conductive layers 140 and 150. A transistor with a self-aligned structure, which has extremely small parasitic capacitance between a gate electrode layer and source and drain electrode layers, is suitable for applications that require high-speed operation.

Figure 7A:
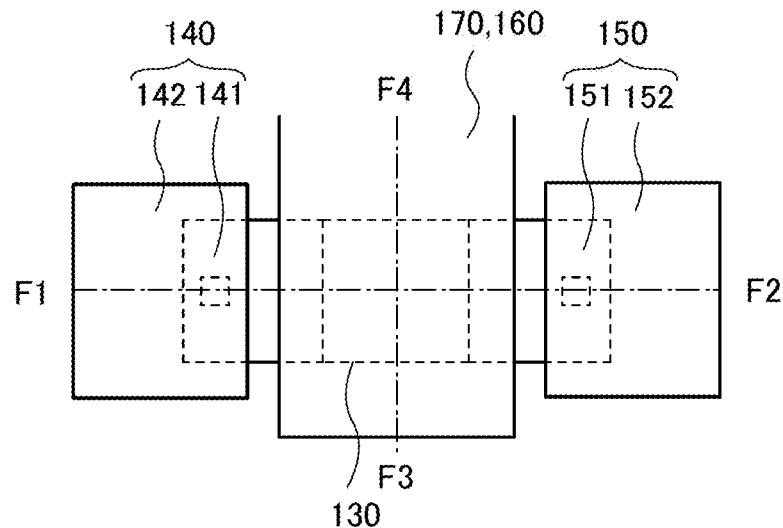
FIGS. 7A and 7B are a top view and a cross-sectional view illustrating a transistor.
Figure 7B:
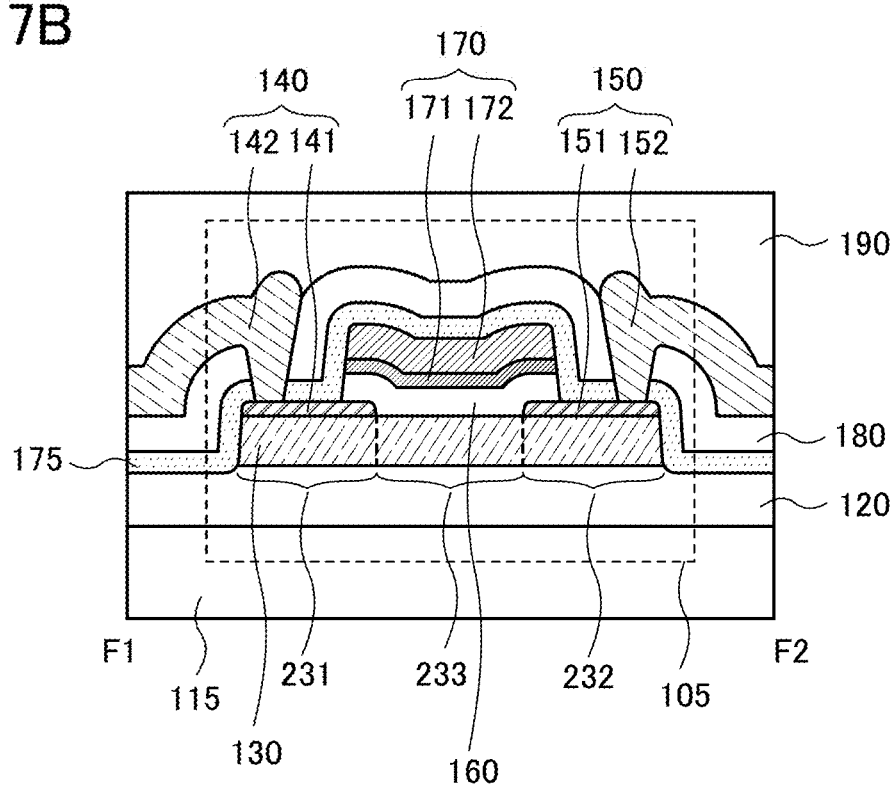

The transistor of one embodiment of the present invention may have a structure illustrated in FIGS. 7A and 7B. FIG. 7A is a top view of a transistor 105. A cross section in the direction of a dashed-dotted line F1-F2 in FIG. 7A is illustrated in FIG. 7B. A cross section in the direction of a dashed-dotted line F3-F4 in FIG. 7A is illustrated in FIG. 9. In the drawings, some components are enlarged, reduced in size, or omitted for easy understanding. In some cases, the direction of the dashed-dotted line F1-F2 is referred to as a channel length direction, and the direction of the dashed-dotted line F3-F4 is referred to as a channel width direction.

The transistor 105 includes the insulating layer 120 in contact with the substrate 115; the oxide semiconductor layer 130 in contact with the insulating layer 120; a conductive layer 141 and a conductive layer 151 electrically connected to the oxide semiconductor layer 130; the insulating layer 160 in contact with the oxide semiconductor layer 130, the conductive layer 141, and the conductive layer 151; the conductive layer 170 in contact with the insulating layer 160; the insulating layer 175 in contact with the oxide semiconductor layer 130, the conductive layer 141, the conductive layer 151, the insulating layer 160, and the conductive layer 170; the insulating layer 180 in contact with the insulating layer 175; and a conductive layer 142 and a conductive layer 152 electrically connected to the conductive layer 141 and the conductive layer 151, respectively, through openings provided in the insulating layer 175 and the insulating layer 180. The transistor 105 may also include, for example, the insulating layer 190 (planarization film) in contact with the insulating layer 180, the conductive layer 142, and the conductive layer 152 as necessary.

Here, the conductive layer 141 and the conductive layer 151 are in contact with the top surface of the oxide semiconductor layer 130 and are not in contact with side surfaces of the oxide semiconductor layer 130.

The transistor 105 has the same structure as the transistor 101 except that the conductive layer 141 and the conductive layer 151 are provided and that the conductive layer 142 and the conductive layer 152 electrically connected to the conductive layer 141 and the conductive layer 151, respectively, through the openings provided in the insulating layer 175 and the insulating layer 180 are provided. The conductive layer 140 (the conductive layer 141 and the conductive layer 142) can function as a source electrode layer, and the conductive layer 150 (the conductive layer 151 and the conductive layer 152) can function as a drain electrode layer.

Figure 8A:
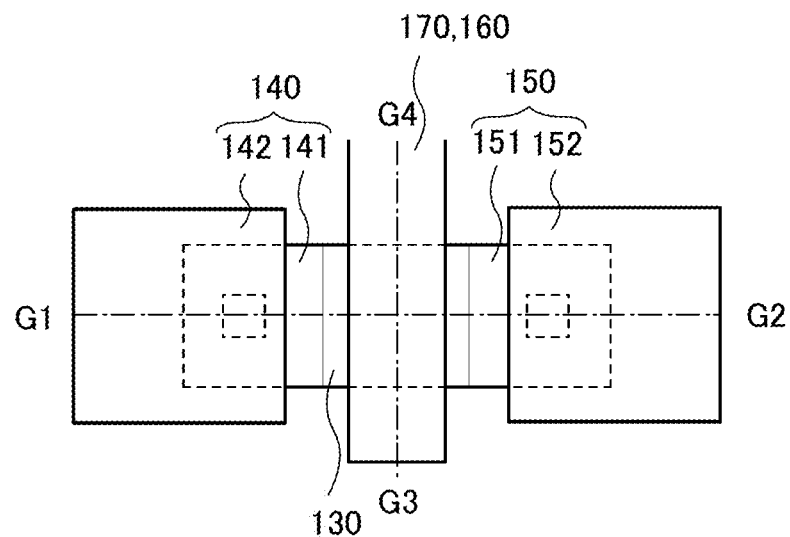
FIGS. 8A and 8B are a top view and a cross-sectional view illustrating a transistor.
Figure 8B:
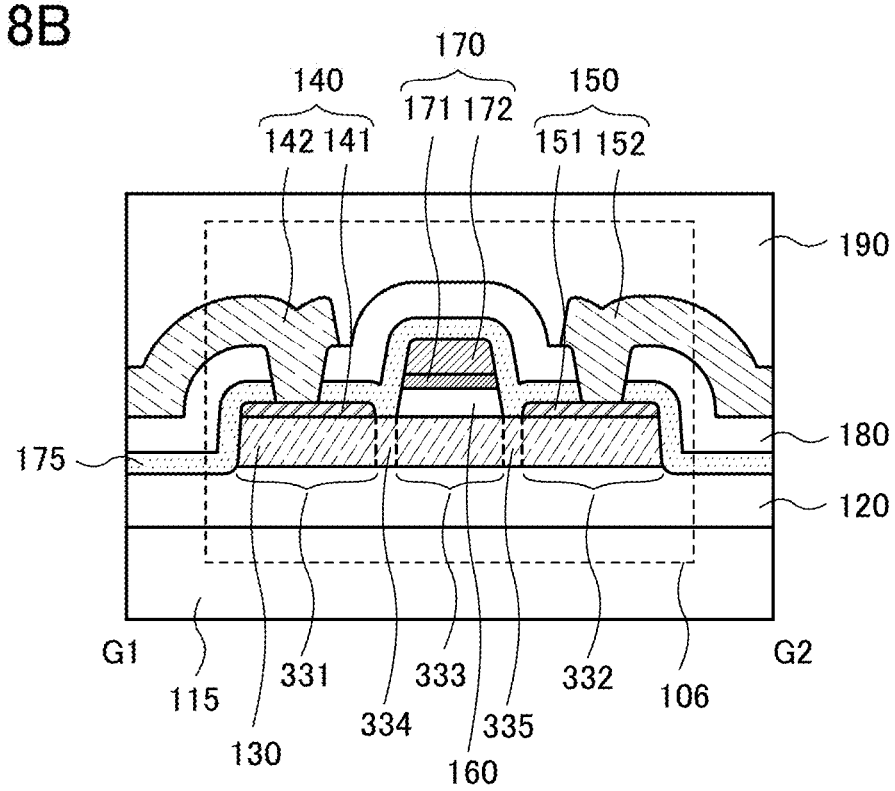
Figure 10A:
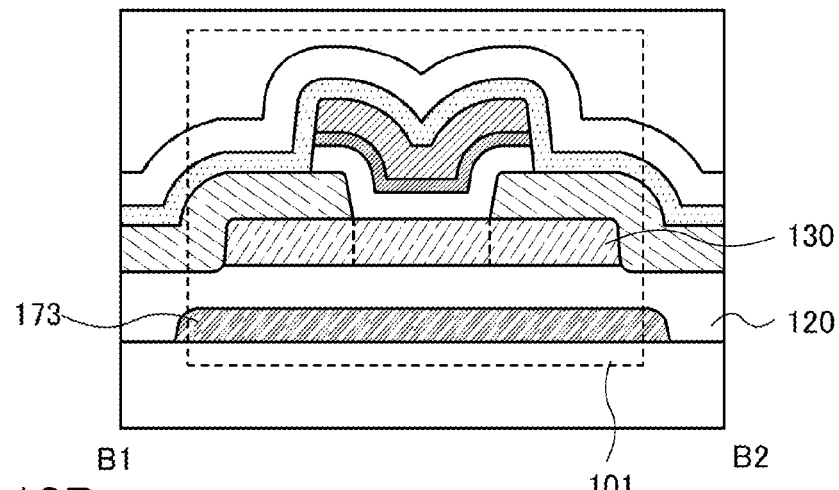
FIGS. 10A to 10C are each a cross-sectional view of a transistor in a channel length direction.
Figure 10B:
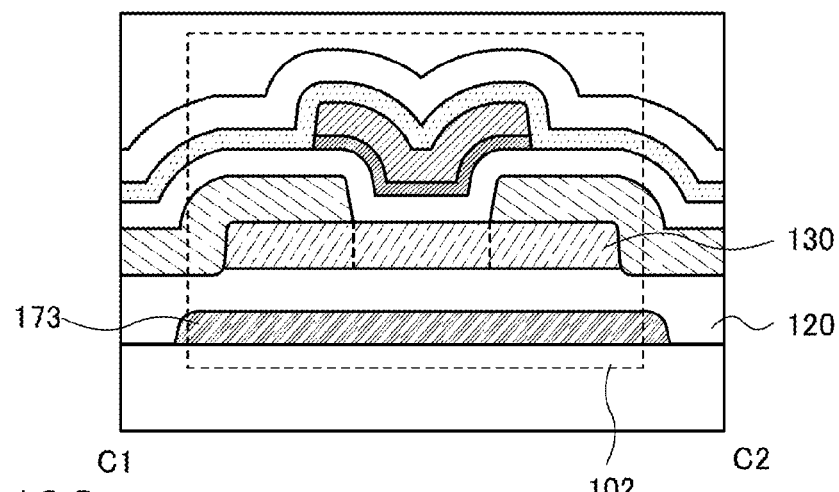
Figure 10C:
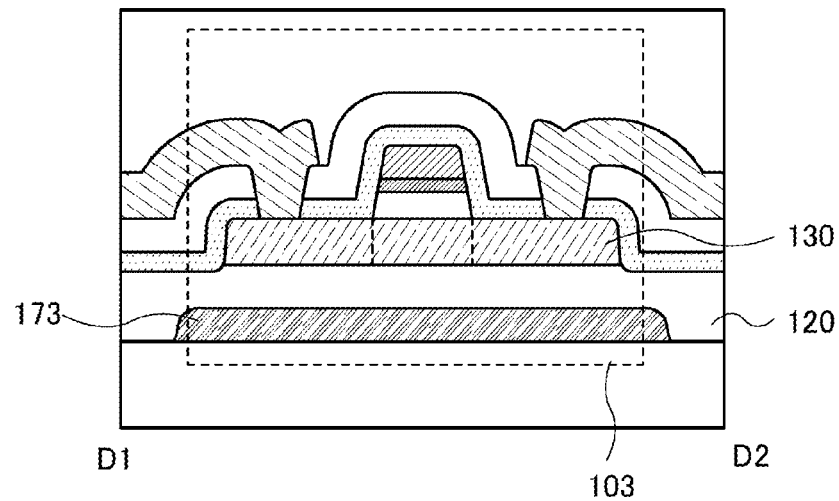
Figure 11A:
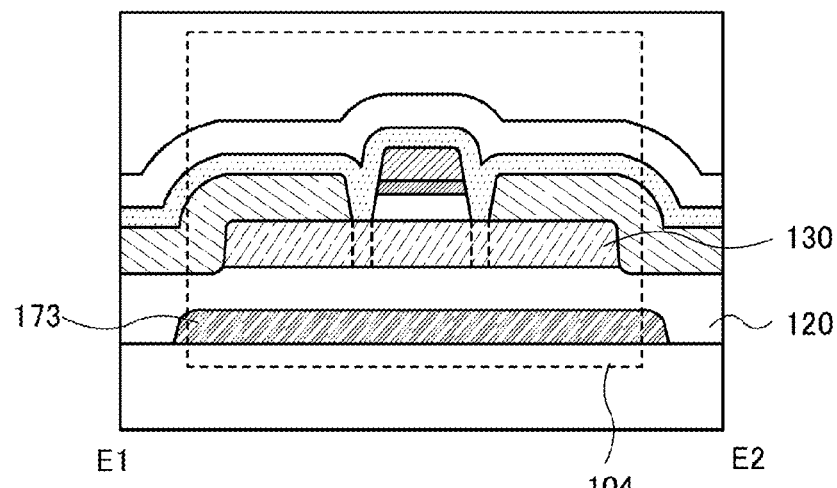
FIGS. 11A to 11C are each a cross-sectional view of a transistor in a channel length direction.
Figure 11B:
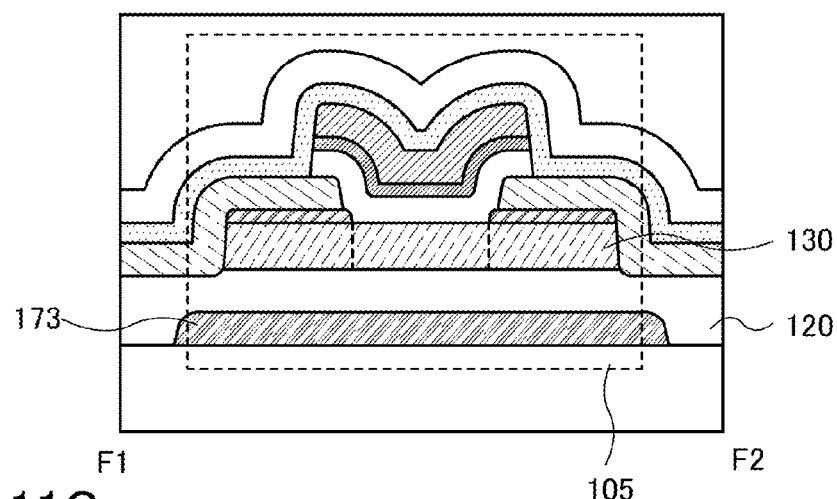
Figure 11C:
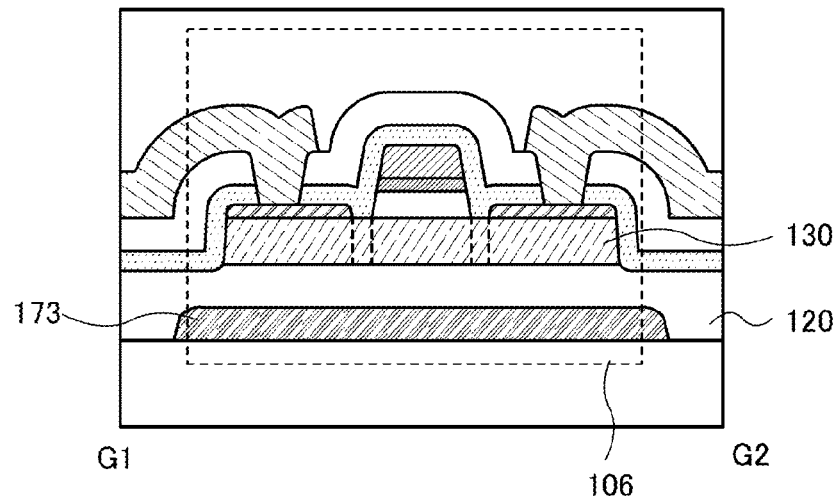

The transistor of one embodiment of the present invention may have a structure illustrated in FIGS. 8A and 8B. FIG. 8A is a top view of a transistor 106. A cross section in the direction of a dashed-dotted line G1-G2 in FIG. 8A is illustrated in FIG. 8B. A cross section in the direction of a dashed-dotted line G3-G4 in FIG. 8A is illustrated in FIG. 9. In the drawings, some components are enlarged, reduced in size, or omitted for easy understanding. In some cases, the direction of the dashed-dotted line G1-G2 is referred to as a channel length direction, and the direction of the dashed-dotted line G3-G4 is referred to as a channel width direction.

The transistor 106 includes the insulating layer 120 in contact with the substrate 115; the oxide semiconductor layer 130 in contact with the insulating layer 120; the conductive layer 141 and the conductive layer 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layer 141, the conductive layer 151, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. The transistor 106 may also include, for example, the insulating layer 190 (planarization film) in contact with the insulating layer 180, the conductive layer 142, and the conductive layer 152 as necessary.

Here, the conductive layer 141 and the conductive layer 151 are in contact with the top surface of the oxide semiconductor layer 130 and are not in contact with side surfaces of the oxide semiconductor layer 130.

The transistor 106 has the same structure as the transistor 103 except that the conductive layer 141 and the conductive layer 151 are provided. The conductive layer 140 (the conductive layer 141 and the conductive layer 142) can function as a source electrode layer, and the conductive layer 150 (the conductive layer 151 and the conductive layer 152) can function as a source electrode layer.

In the structures of the transistor 105 and the transistor 106, the conductive layer 140 and the conductive layer 150 are not in contact with the insulating layer 120. These structures make the insulating layer 120 less likely to be deprived of oxygen by the conductive layer 140 and the conductive layer 150 and facilitate oxygen supply from the insulating layer 120 to the oxide semiconductor layer 130.

Note that an impurity for forming an oxygen vacancy to increase conductivity may be added to the region 231 and the region 232 in the transistor 103 and the region 334 and the region 335 in the transistor 104 and the transistor 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, an ion implantation method, an ion doping method, a plasma immersion ion implantation method, or the like can be used.

When the above element is added as an impurity element to the oxide semiconductor layer, a bond between a metal element and oxygen in the oxide semiconductor layer is cut, whereby an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Accordingly, the oxide conductor has a light-transmitting property. Here, an oxide conductor refers to an oxide semiconductor having become a conductor.

The oxide conductor is a degenerate semiconductor and it is suggested that the conduction band edge equals to or substantially equals to the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 12A:
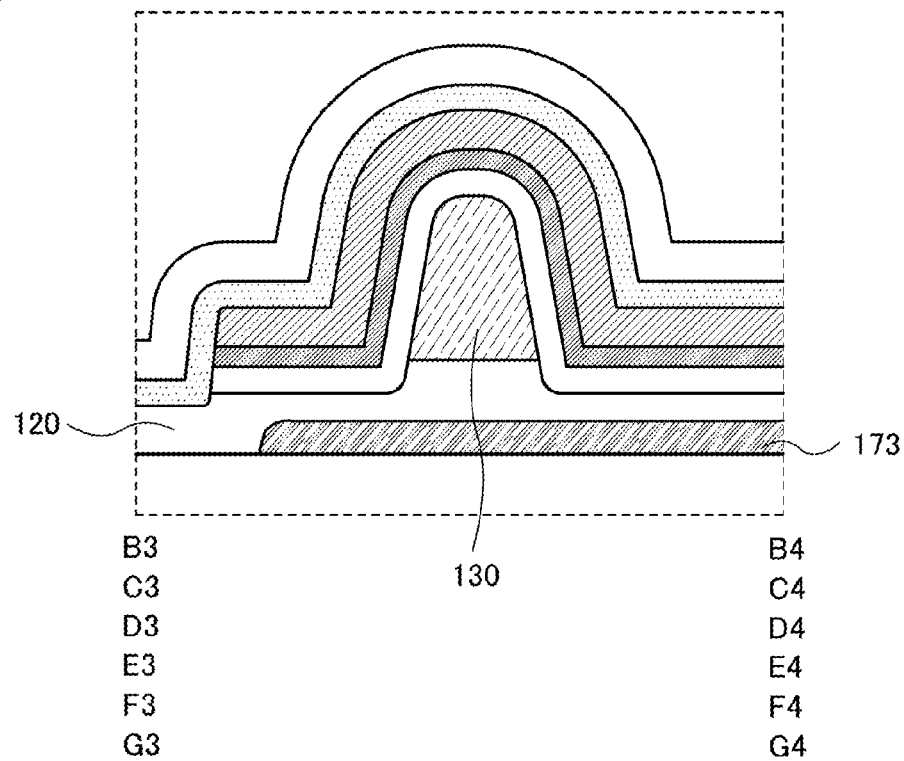
FIGS. 12A and 12B each illustrate a cross section of a transistor in a channel width direction.
Figure 12B:
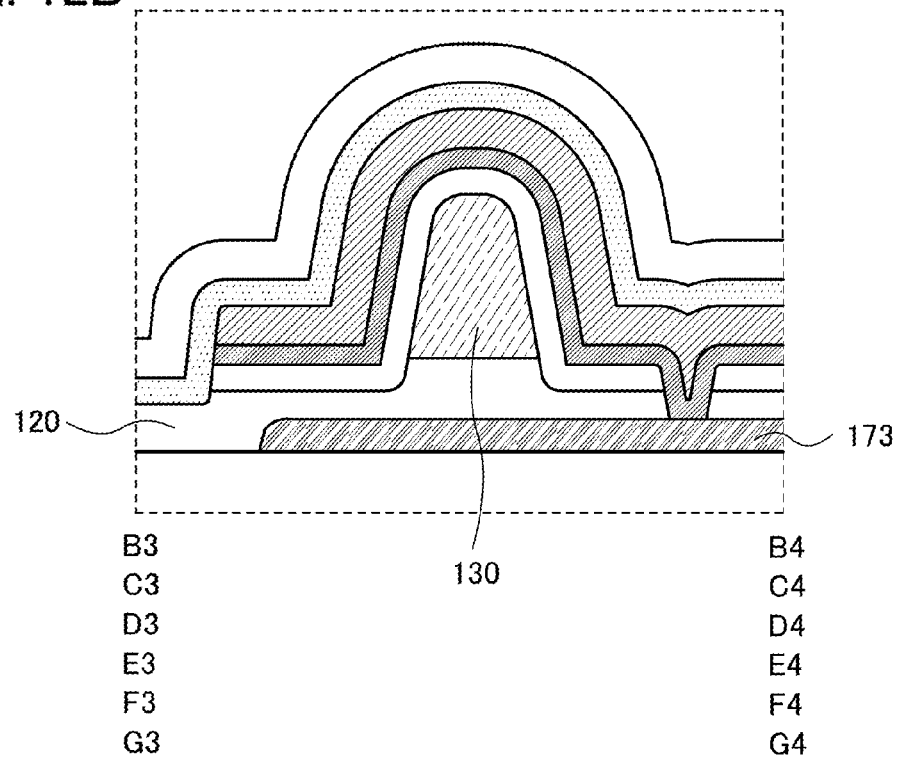

The transistor of one embodiment of the present invention may include a conductive layer 173 between the oxide semiconductor layer 130 and the substrate 115 as illustrated in the cross-sectional views in the channel length direction in FIGS. 10A to 10C and FIGS. 11A to 11C and the cross-sectional views in the channel width direction in FIGS. 12A and 12B. When the conductive layer is used as a second gate electrode layer (back gate), the on-state current can be increased or the threshold voltage can be controlled. In the cross-sectional views in FIGS. 10A to 10C and FIGS. 11A to 11C, the width of the conductive layer 173 may be shorter than that of the oxide semiconductor layer 130. Moreover, the width of the conductive layer 173 may be shorter than that of the conductive layer 170.

In order to increase the on-state current, for example, the conductive layer 170 and the conductive layer 173 are set to have the same potential, and the transistor is driven as a double-gate transistor. Further, to control the threshold voltage, a fixed potential, which is different from a potential of the conductive layer 170, is supplied to the conductive layer 173. To set the conductive layer 170 and the conductive layer 173 at the same potential, for example, as shown in FIG. 12B, the conductive layer 170 and the conductive layer 173 may be electrically connected to each other through a contact hole.

The transistors 101 to 106 shown in FIGS. 3 and 3B, FIGS. 4A and 4B, FIGS. 5A and 5B, FIGS. 6A and 6B, FIGS. 7A and 7B, and FIGS. 8A and 8B are examples in which the oxide semiconductor layer 130 is a single layer;

alternatively, the oxide semiconductor layer 130 may be a lamination layer. The oxide semiconductor layer 130 in the transistors 101 to 106 can be replaced with the oxide semiconductor layer 130 shown in FIGS. 13A to 13C or FIGS. 14A to 14C.

Figure 13A:
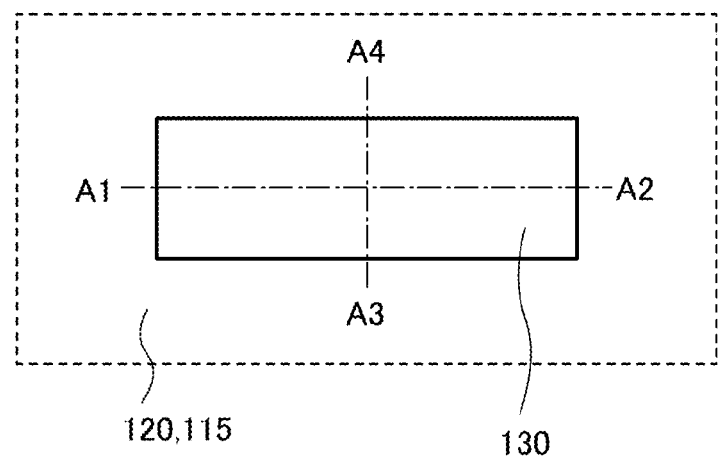
FIGS. 13A to 13C are a top view and cross-sectional views illustrating a semiconductor layer.
Figure 13B:
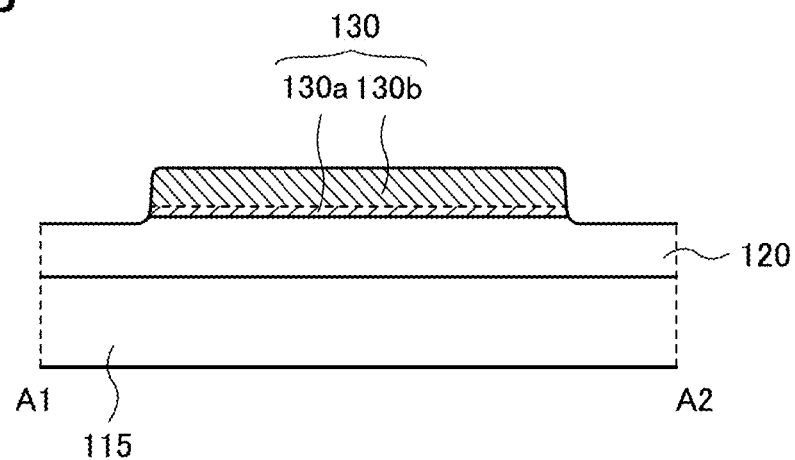
Figure 13C:
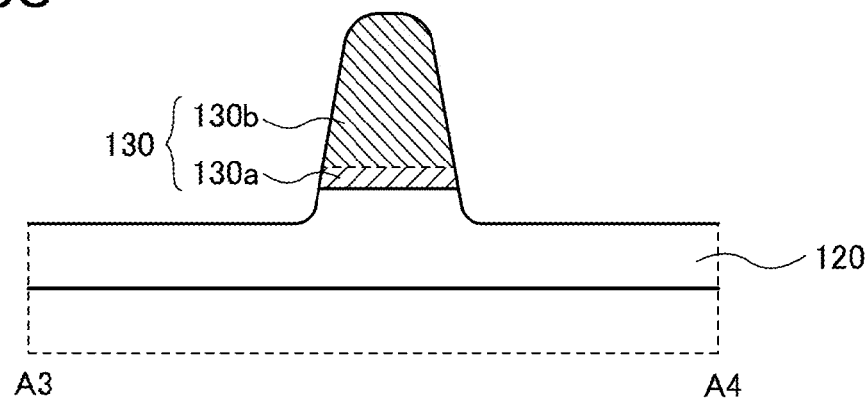

FIGS. 13A to 13C are a top view and cross-sectional views of the oxide semiconductor layer 130 with a two-layer structure. FIG. 13A is the top view. FIG. 13B illustrates a cross section in the direction of a dashed-dotted line A1-A2 in FIG. 13A. FIG. 13C illustrates a cross section in the direction of a dashed-dotted line A3-A4 in FIG. 13A. In the drawings, some components are enlarged, reduced in size, or omitted for easy understanding.

Figure 14A:
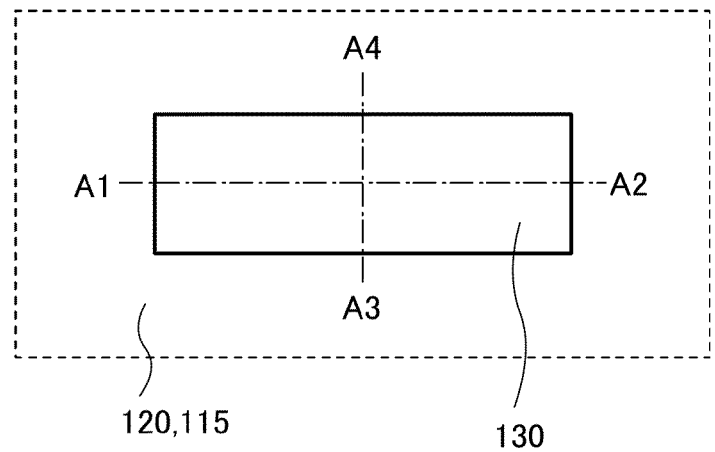
FIGS. 14A to 14C are a top view and cross-sectional views illustrating a semiconductor layer.
Figure 14B:
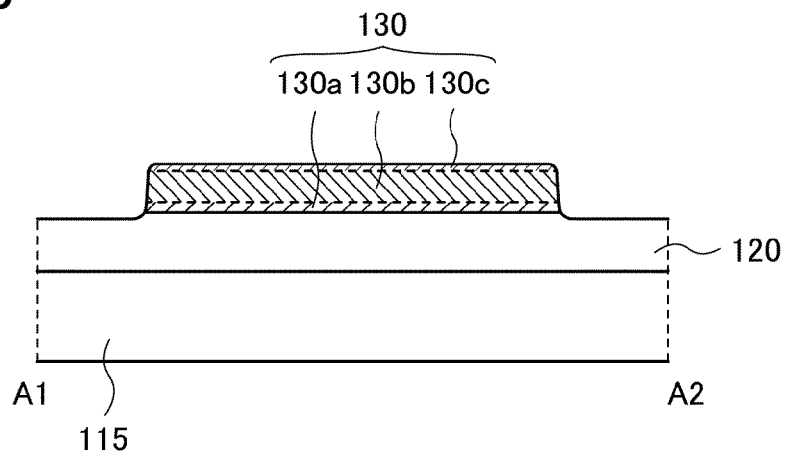
Figure 14C:
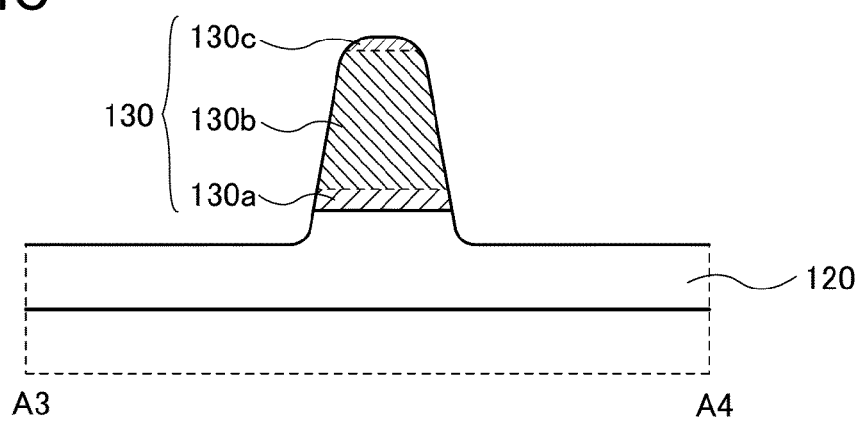

FIGS. 14A to 14C are a top view and cross-sectional views of the oxide semiconductor layer 130 with a three-layer structure. FIG. 14A is the top view. FIG. 14B illustrates a cross section in the direction of a dashed-dotted line A1-A2 in FIG. 14A. FIG. 14C illustrates a cross section in the direction of a dashed-dotted line A3-A4 in FIG. 14A. In the drawings, some components are enlarged, reduced in size, or omitted for easy understanding.

Oxide semiconductor layers with different compositions, for example, can be used as an oxide semiconductor layer 130a, an oxide semiconductor layer 130b, and an oxide semiconductor layer 130c.

Figure 15A:
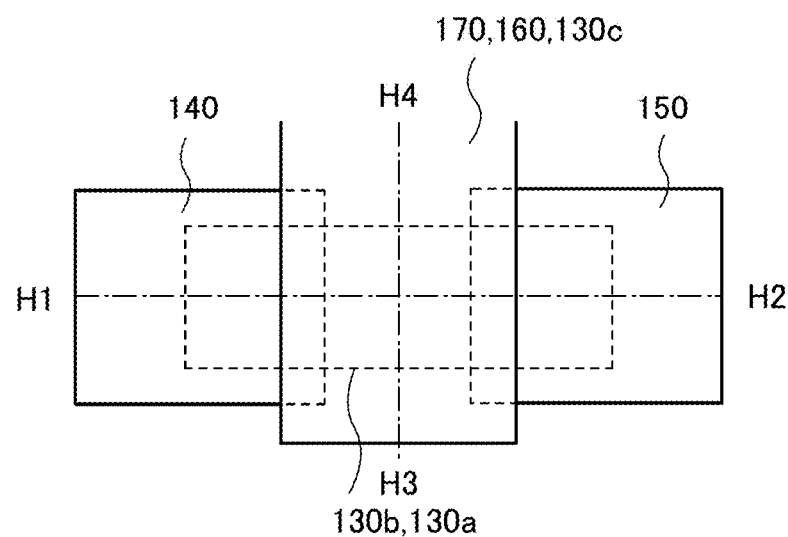
FIGS. 15A and 15B are a top view and a cross-sectional view of a transistor.
Figure 15B:
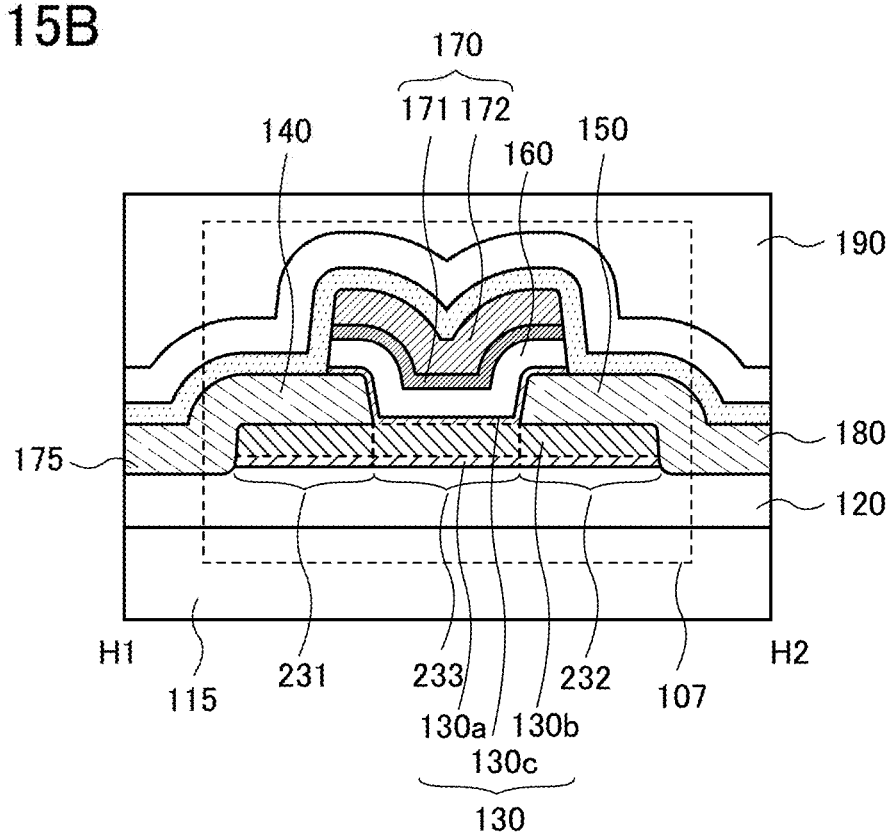

The transistor of one embodiment of the present invention may have a structure illustrated in FIGS. 15A and 15B. FIG. 15A is a top view of a transistor 107. A cross section in the direction of a dashed-dotted line H1-H2 in FIG. 15A is illustrated in FIG. 15B. A cross section in the direction of a dashed-dotted line H3-H4 in FIG. 15A is illustrated in FIG. 21. In the drawings, some components are enlarged, reduced in size, or omitted for easy understanding. In some cases, the direction of the dashed-dotted line H1-H2 is referred to as a channel length direction, and the direction of the dashed-dotted line H3-H4 is referred to as a channel width direction.

The transistor 107 includes the insulating layer 120 in contact with the substrate 115; a lamination of the oxide semiconductor layer 130a and the oxide semiconductor layer 130b, in contact with the insulating layer 120; the conductive layer 140 and the conductive layer 150 electrically connected to the lamination; the oxide semiconductor layer 130c in contact with the lamination, the conductive layer 140, and the conductive layer 150; the insulating layer 160 in contact with the oxide semiconductor layer 130c; the conductive layer 170 in contact with the insulating layer 160; the insulating layer 175 in contact with the conductive layer 140, the conductive layer 150, the oxide semiconductor layer 130c, the insulating layer 160, and the conductive layer 170; and the insulating layer 180 in contact with the insulating layer 175. The transistor 107 may also include, for example, the insulating layer 190 (planarization film) in contact with the insulating layer 180 as necessary.

The transistor 107 has the same structure as the transistor 101 except that the oxide semiconductor layer 130 includes two layers (the oxide semiconductor layer 130a and the oxide semiconductor layer 130b) in the region 231 and the region 232, that the oxide semiconductor layer 130 includes three layers (the oxide semiconductor layer 130a, the oxide semiconductor layer 130b, and the oxide semiconductor layer 130c) in the region 233, and that part of the oxide semiconductor layer (the oxide semiconductor layer 130c) exists between the insulating layer 160 and the conductive layers 140 and 150.

Figure 16A:
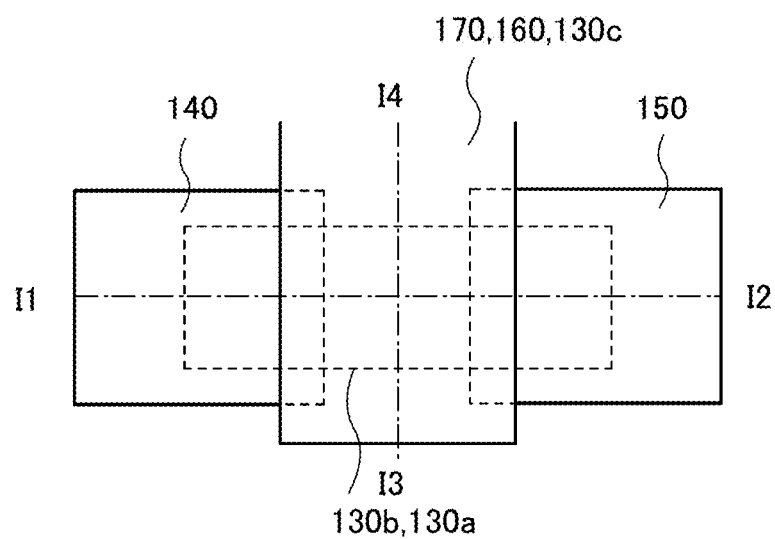
FIGS. 16A and 16B are a top view and a cross-sectional view of a transistor.
Figure 16B:
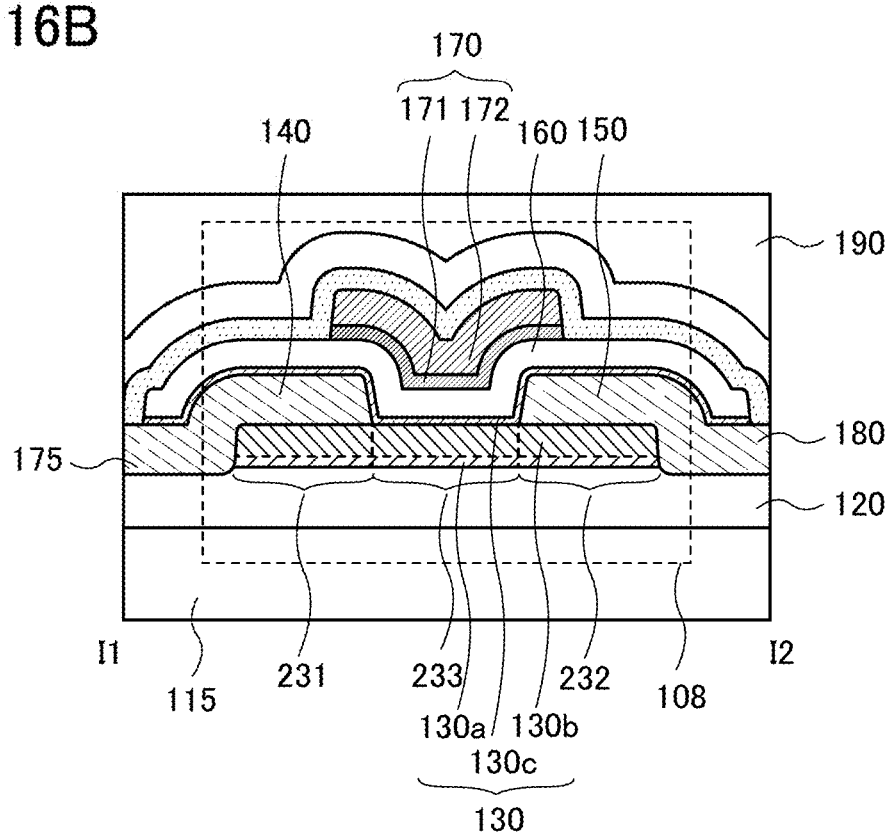

The transistor of one embodiment of the present invention may have a structure illustrated in FIGS. 16A and 16B. FIG. 16A is a top view of a transistor 108. A cross section in the direction of a dashed-dotted line I1-I2 in FIG. 16A is illustrated in FIG. 16B. A cross section in the direction of a dashed-dotted line I3-I4 in FIG. 16A is illustrated in FIG. 21. In the drawings, some components are enlarged, reduced in size, or omitted for easy understanding. In some cases, the direction of the dashed-dotted line I1-I2 is referred to as a channel length direction, and the direction of the dashed-dotted line I3-I4 is referred to as a channel width direction.

The transistor 108 has the same structure as the transistor 102 except that the oxide semiconductor layer 130 includes two layers (the oxide semiconductor layer 130a and the oxide semiconductor layer 130b) in the region 231 and the region 232, that the oxide semiconductor layer 130 includes three layers (the oxide semiconductor layer 130a, the oxide semiconductor layer 130b, and the oxide semiconductor layer 130c) in the region 233, and that part of the oxide semiconductor layer (the oxide semiconductor layer 130c) exists between the insulating layer 160 and the conductive layers 140 and 150.

Figure 17A:
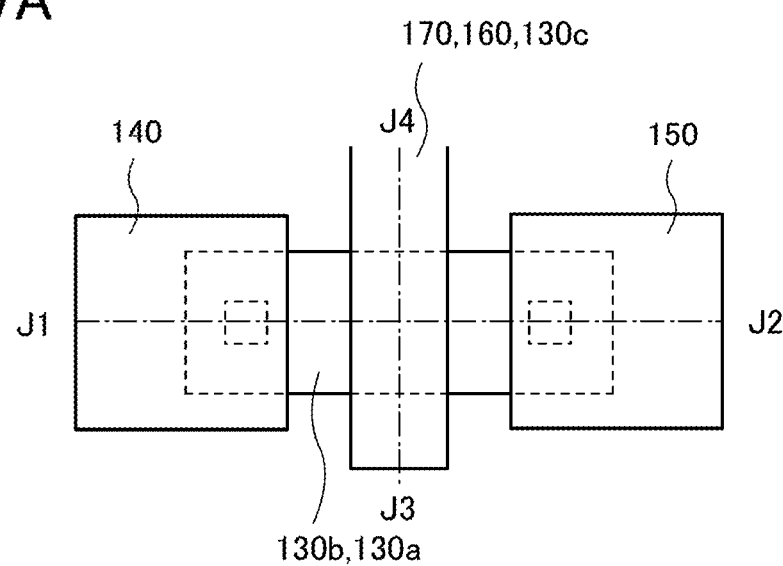
FIGS. 17A and 17B are a top view and a cross-sectional view of a transistor.
Figure 17B:
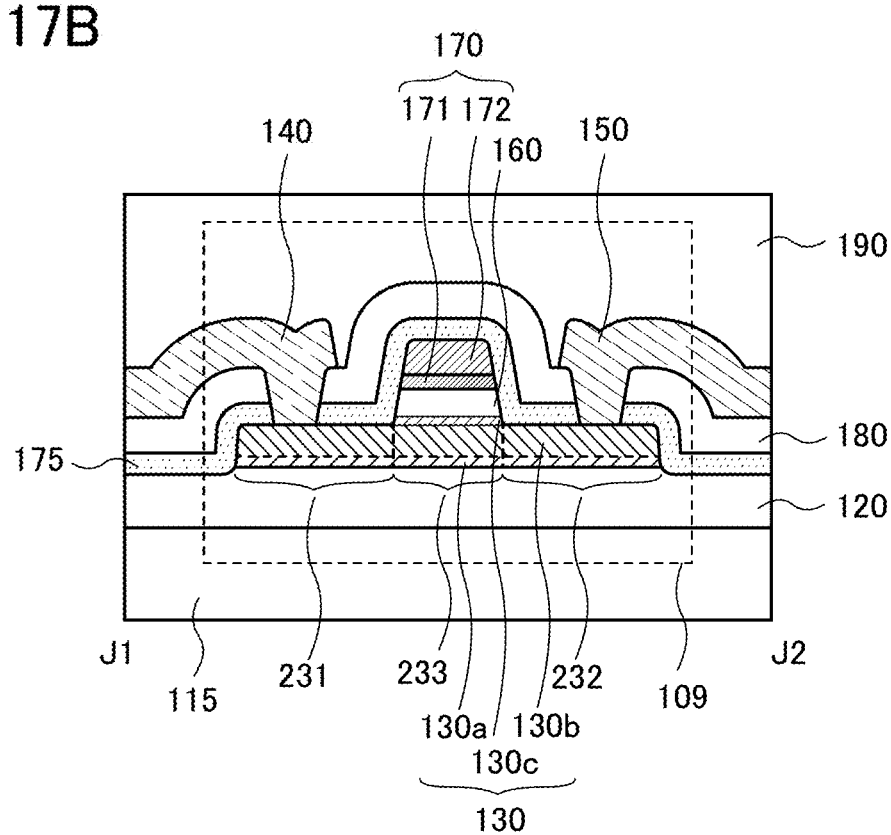
Figure 23A:
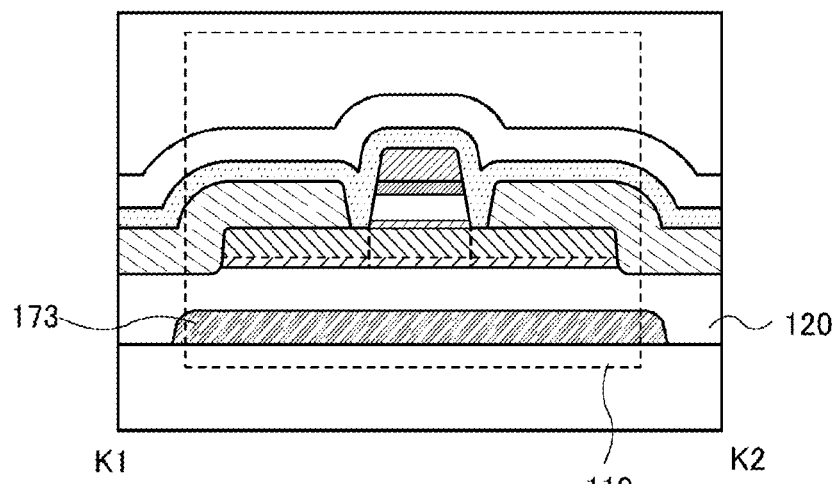
FIGS. 23A to 23C are each a cross-sectional view of a transistor in a channel length direction.
Figure 23B:
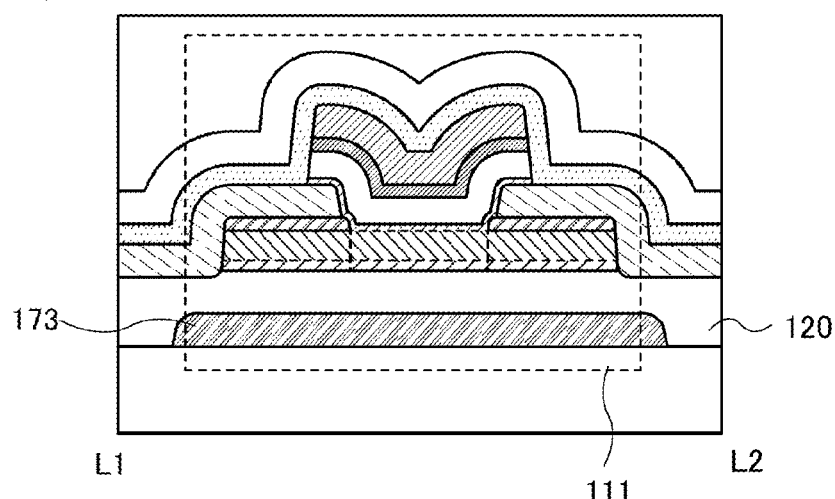
Figure 23C:
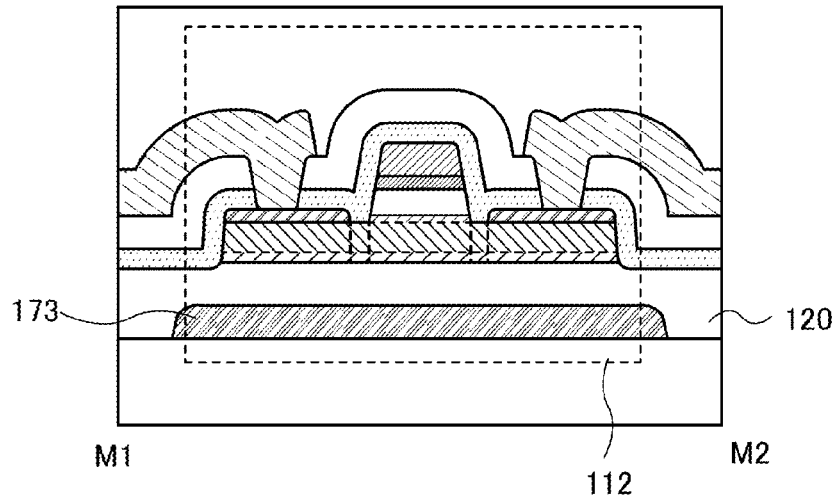

The transistor of one embodiment of the present invention may have a structure illustrated in FIGS. 17A and 17B. FIG. 17A is a top view of a transistor 109. A cross section in the direction of a dashed-dotted line J1-J2 in FIG. 23A is illustrated in FIG. 17B. A cross section in the direction of a dashed-dotted line J3-J4 in FIG. 17A is illustrated in FIG. 21. In some cases, the direction of the dashed-dotted line J142 is referred to as a channel length direction, and the direction of the dashed-dotted line J3-J4 is referred to as a channel width direction.

The transistor 109 includes the insulating layer 120 in contact with the substrate 115; a lamination of the oxide semiconductor layer 130a and the oxide semiconductor layer 130b, in contact with the insulating layer 120; the oxide semiconductor layer 130c in contact with the lamination; the insulating layer 160 in contact with the oxide semiconductor layer 130c; the conductive layer 170 in contact with the insulating layer 160; the insulating layer 175 covering the lamination, the oxide semiconductor layer 130c, the insulating layer 160, and the conductive layer 170; the insulating layer 180 in contact with the insulating layer 175; and the conductive layer 140 and the conductive layer 150 electrically connected to the lamination through openings provided in the insulating layer 175 and the insulating layer 180. The transistor 109 may also include, for example, the insulating layer 190 (planarization film) in contact with the insulating layer 180, the conductive layer 140, and the conductive layer 150 as necessary.

The transistor 109 has the same structure as the transistor 103 except that the oxide semiconductor layer 130 includes two layers (the oxide semiconductor layer 130a and the oxide semiconductor layer 130b) in the region 231 and the region 232 and that the oxide semiconductor layer 130 includes three layers (the oxide semiconductor layer 130a, the oxide semiconductor layer 130b, and the oxide semiconductor layer 130c) in the region 233.

Figure 18A:
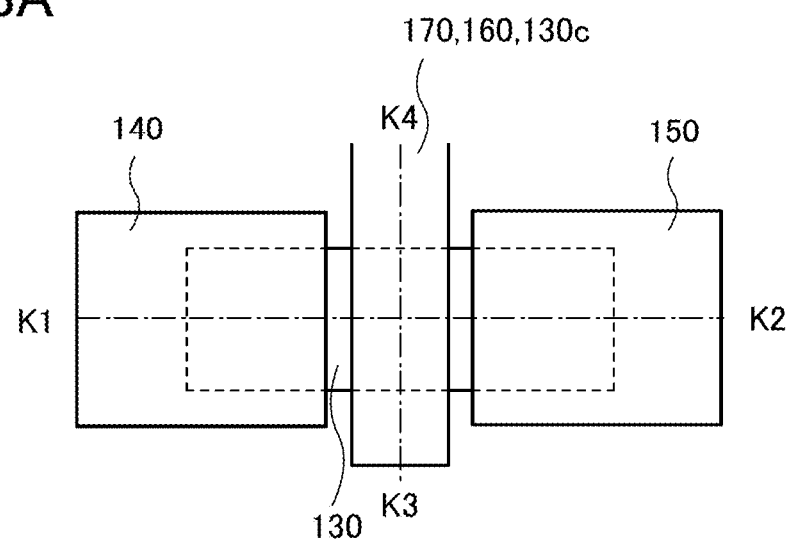
FIGS. 18A and 18B are a top view and a cross-sectional view of a transistor.
Figure 18B:
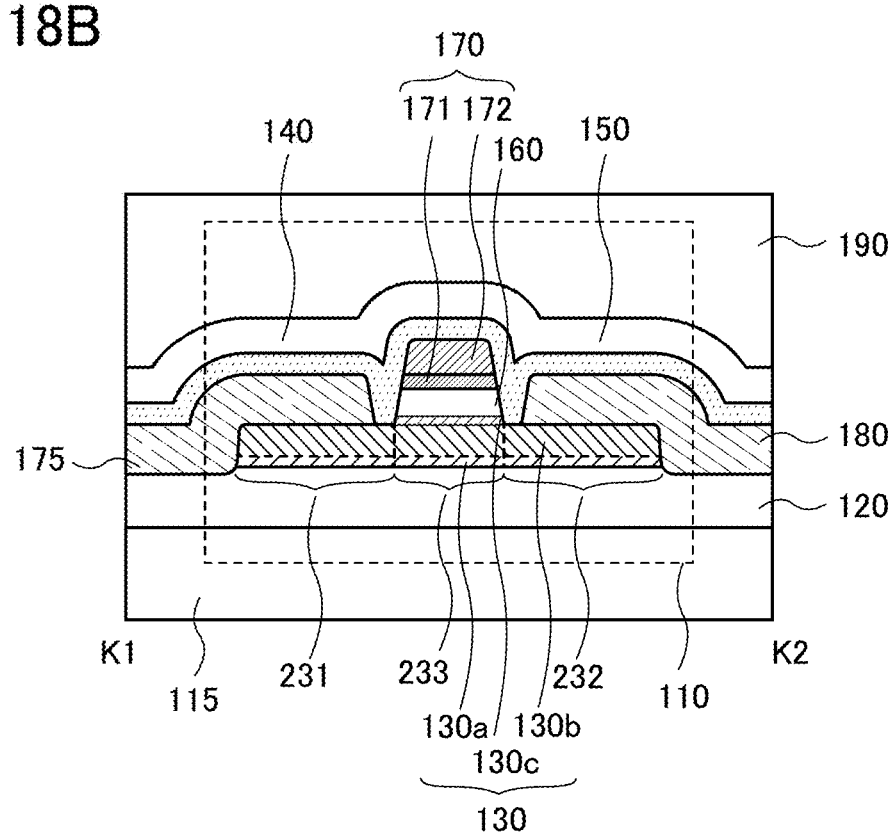

The transistor of one embodiment of the present invention may have a structure illustrated in FIGS. 18A and 18B. FIG. 18A is a top view of a transistor 110. A cross section in the direction of a dashed-dotted line K1-K2 in FIG. 18A is illustrated in FIG. 18B. A cross section in the direction of a dashed-dotted line K3-K4 in FIG. 18A is illustrated in FIG. 21. In the drawings, some components are enlarged, reduced in size, or omitted for easy understanding. In some cases, the direction of the dashed-dotted line K1-K2 is referred to as a channel length direction, and the direction of the dashed-dotted line K3-K4 is referred to as a channel width direction.

The transistor 110 has the same structure as the transistor 104 except that the oxide semiconductor layer 130 includes two layers (the oxide semiconductor layer 130a and the oxide semiconductor layer 130b) in the region 231 and the region 232 and that the oxide semiconductor layer 130 includes three layers (the oxide semiconductor layer 130a, the oxide semiconductor layer 130b, and the oxide semiconductor layer 130c) in the region 233.

Figure 19A:
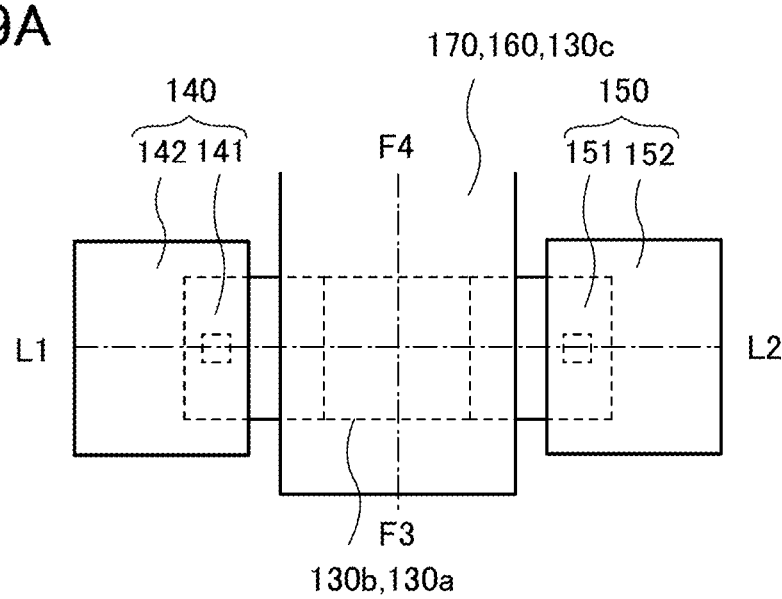
FIGS. 19A and 19B are a top view and a cross-sectional view of a transistor.
Figure 19B:
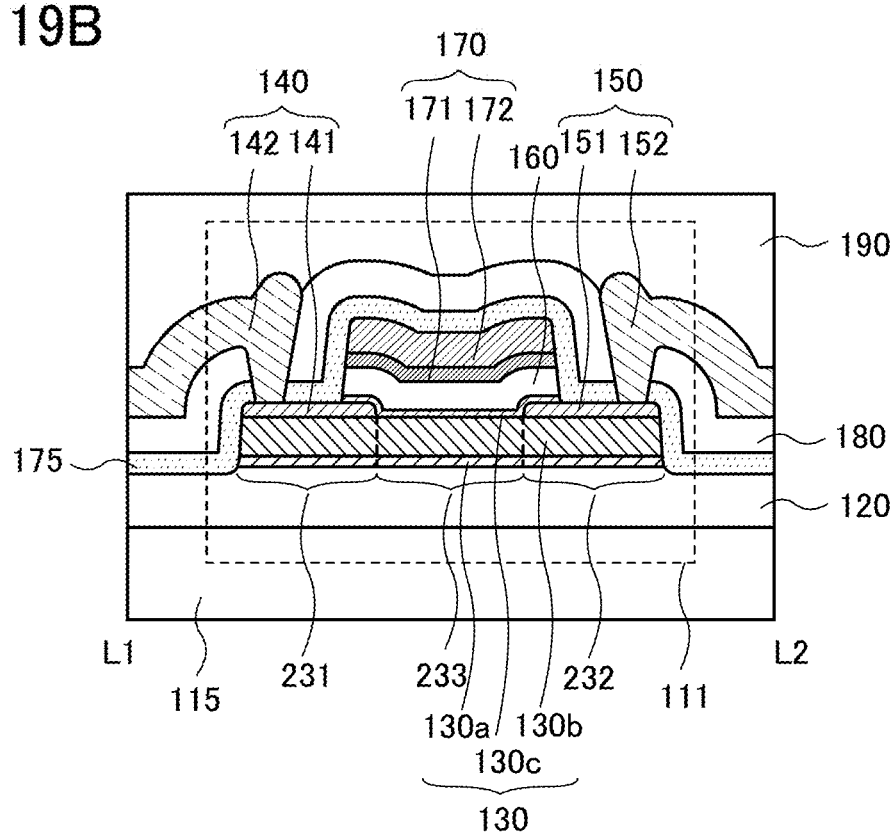

The transistor of one embodiment of the present invention may have a structure illustrated in FIGS. 19A and 19B. FIG. 19A is a top view of a transistor 111. A cross section in the direction of a dashed-dotted line K1-K2 in FIG. 19A is illustrated in FIG. 19B. A cross section in the direction of a dashed-dotted line K3-K4 in FIG. 19A is illustrated in FIG. 21. In the drawings, some components are enlarged, reduced in size, or omitted for easy understanding. In some cases, the direction of the dashed-dotted line K1-K2 is referred to as a channel length direction, and the direction of the dashed-dotted line K3-K4 is referred to as a channel width direction.

The transistor 111 includes the insulating layer 120 in contact with the substrate 115; a lamination of the oxide semiconductor layer 130a and the oxide semiconductor layer 130b, in contact with the insulating layer 120; the conductive layer 141 and the conductive layer 151 electrically connected to the lamination; the oxide semiconductor layer 130c in contact with the lamination, the conductive layer 141, and the conductive layer 151; the insulating layer 160 in contact with the oxide semiconductor layer 130c; the conductive layer 170 in contact with the insulating layer 160; the insulating layer 175 in contact with the lamination, the conductive layer 141, the conductive layer 151, the oxide semiconductor layer 130c, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. The transistor 111 may also include, for example, the insulating layer 190 (planarization film) in contact with the insulating layer 180, the conductive layer 142, and the conductive layer 152 as necessary.

The transistor 111 has the same structure as the transistor 105 except that the oxide semiconductor layer 130 includes two layers (the oxide semiconductor layer 130a and the oxide semiconductor layer 130b) in the region 231 and the region 232, that the oxide semiconductor layer 130 includes three layers (the oxide semiconductor layer 130a, the oxide semiconductor layer 130b, and the oxide semiconductor layer 130c) in the region 233, and that part of the oxide semiconductor layer (the oxide semiconductor layer 130c) exists between the insulating layer 160 and the conductive layers 141 and 151.

Figure 20A:
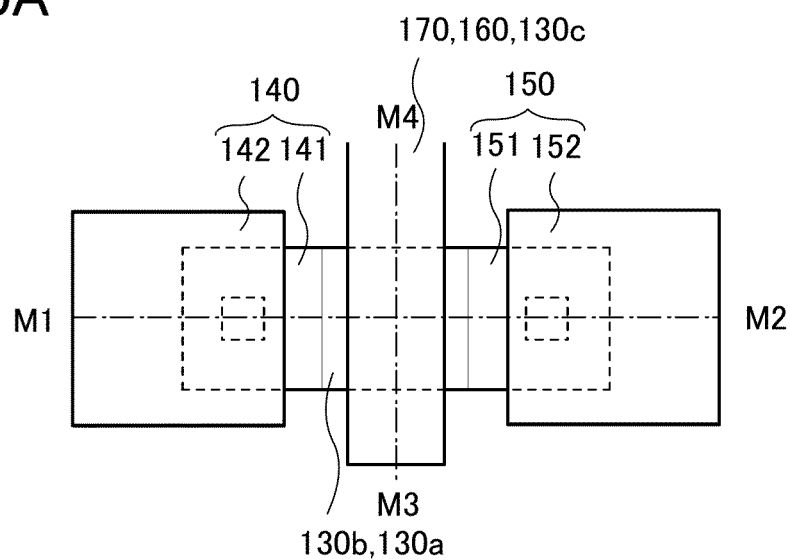
FIGS. 20A and 20B are a top view and a cross-sectional view of a transistor.
Figure 20B:
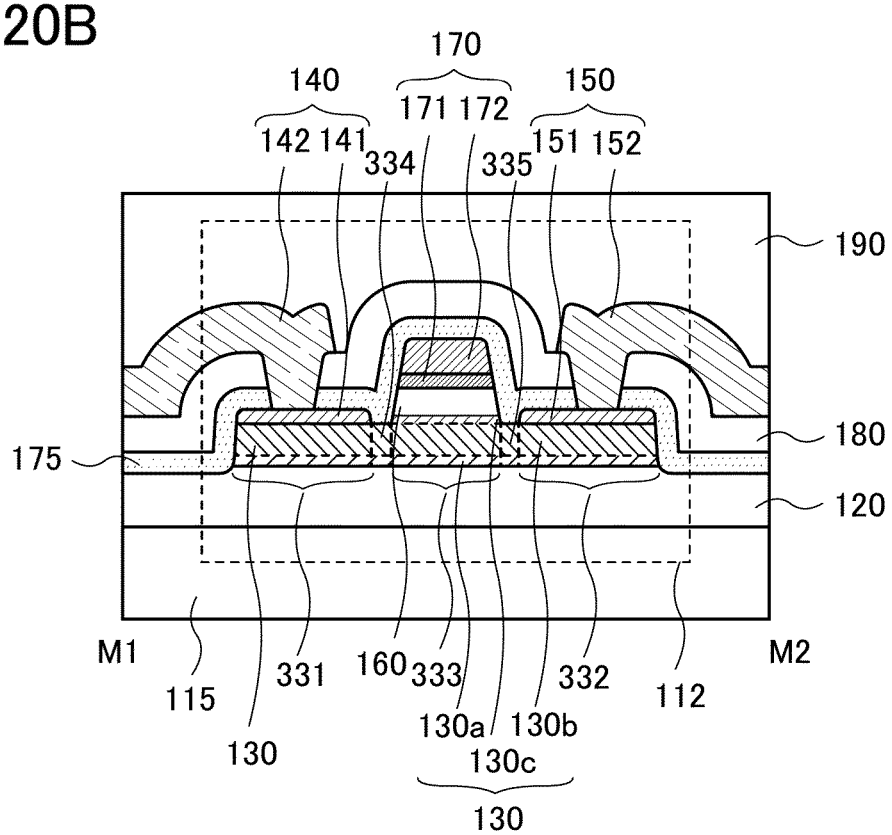
Figure 22A:
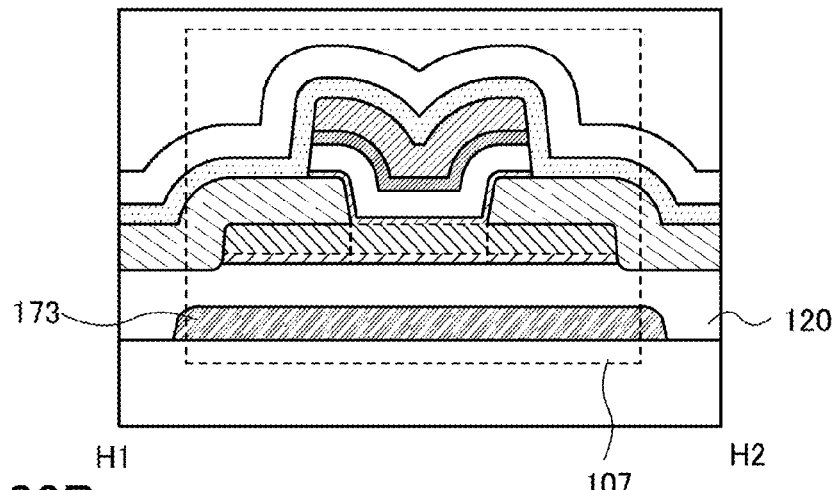
FIGS. 22A to 22C are each a cross-sectional view of a transistor in a channel length direction.
Figure 22B:
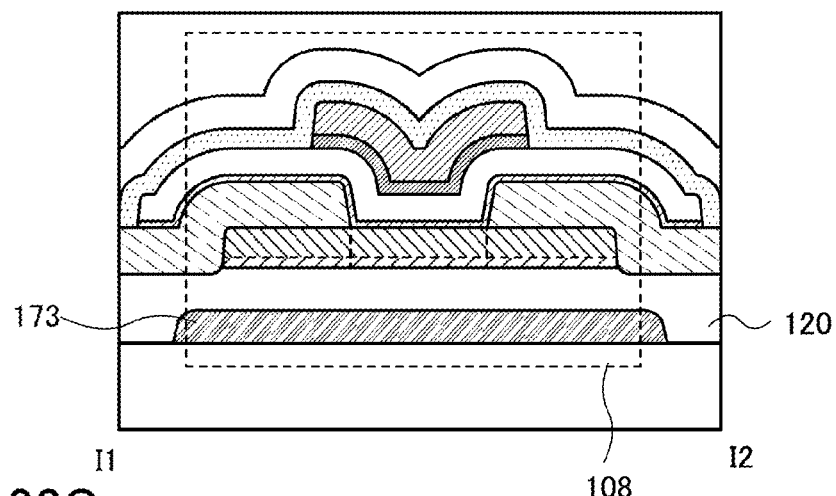
Figure 22C:
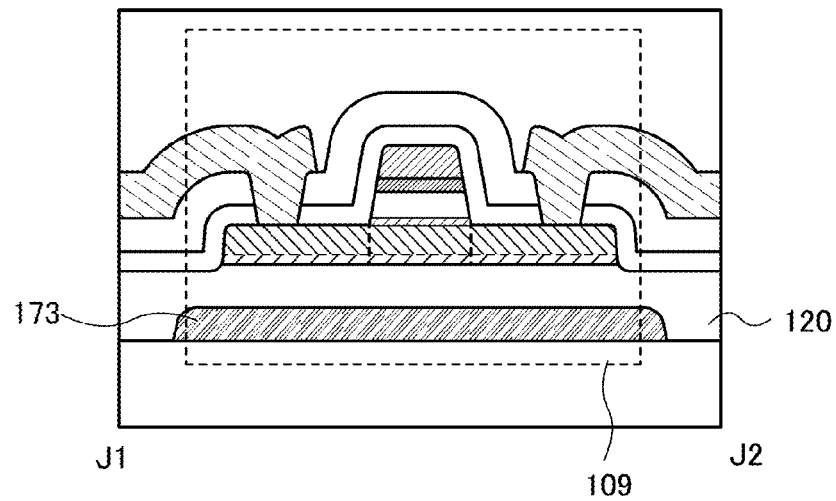

The transistor of one embodiment of the present invention may have a structure illustrated in FIGS. 20A and 20B. FIG. 20A is a top view of a transistor 112. A cross section in the direction of a dashed-dotted line M1-M2 in FIG. 20A is illustrated in FIG. 20B. A cross section in the direction of a dashed-dotted line M3-M4 in FIG. 20A is illustrated in FIG. 21. In the drawings, some components are enlarged, reduced in size, or omitted for easy understanding. In some cases, the direction of the dashed-dotted line M1-M2 is referred to as a channel length direction, and the direction of the dashed-dotted line M3-M4 is referred to as a channel width direction.

The transistor 112 has the same structure as the transistor 106 except that the oxide semiconductor layer 130 includes two layers (the oxide semiconductor layer 130a and the oxide semiconductor layer 130b) in the region 331, the region 332, the region 334, and the region 335 and that the oxide semiconductor layer 130 includes three layers (the oxide semiconductor layer 130a, the oxide semiconductor layer 130b, and the oxide semiconductor layer 130c) in the region 333.

Figure 24A:
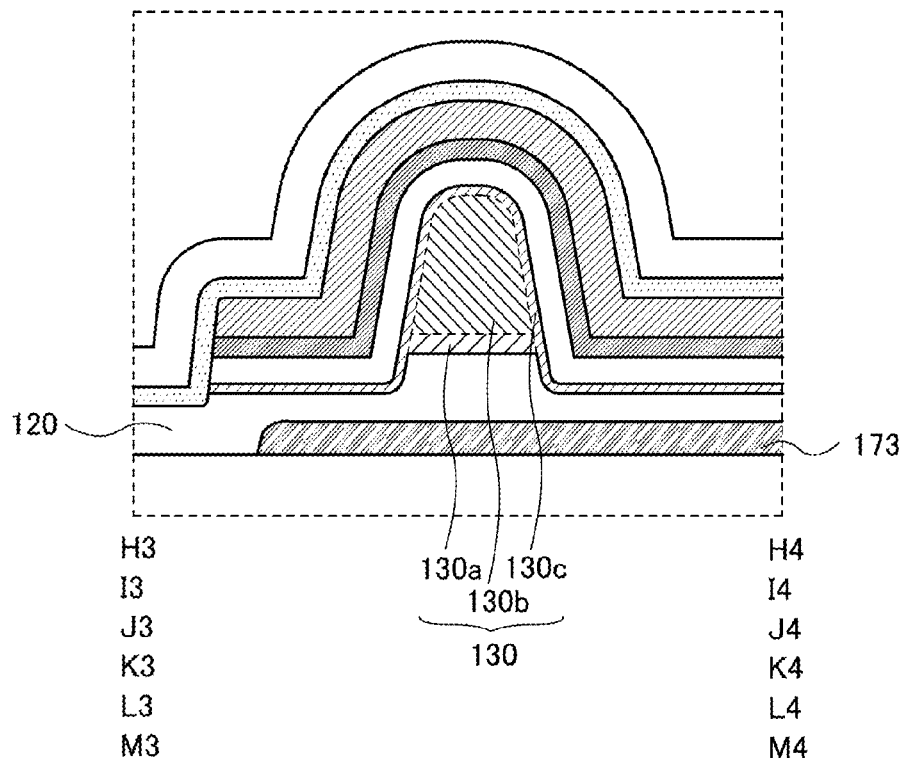
FIGS. 24A and 24B each illustrate a cross section of a transistor in a channel width direction.
Figure 24B:
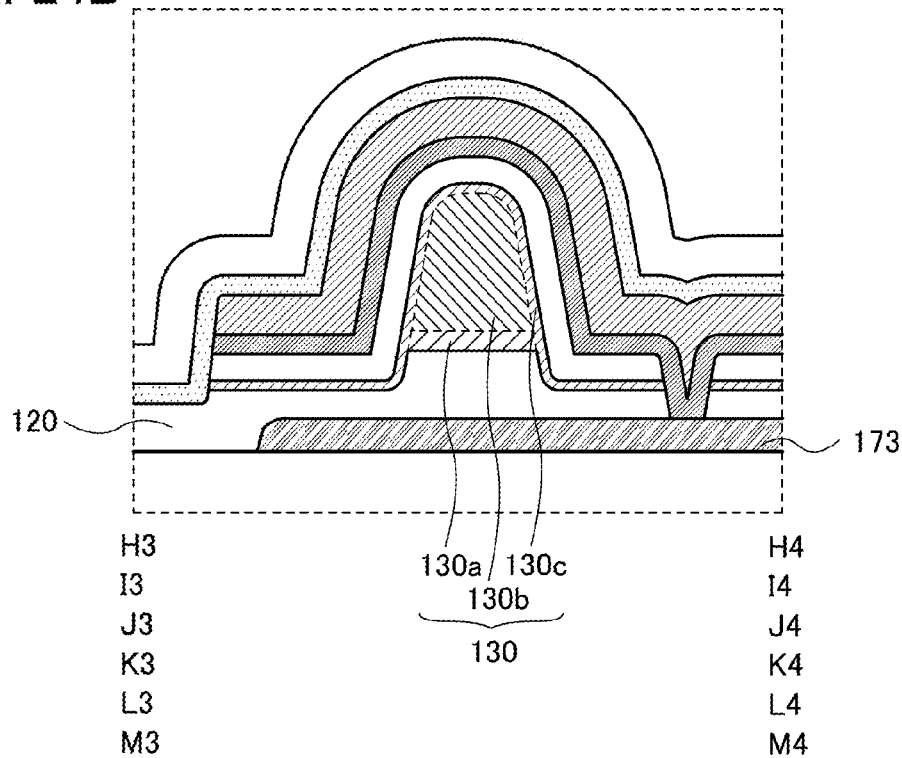

The transistor of one embodiment of the present invention may include the conductive layer 173 between the oxide semiconductor layer 130 and the substrate 115 as illustrated in the cross-sectional views in the channel length direction in FIGS. 22A to 22C and FIGS. 23A to 23C and the cross-sectional views in the channel width direction in FIGS. 24A and 24B. When the conductive layer is used as a second gate electrode layer (back gate), the on-state current can be increased or the threshold voltage can be controlled. In the cross-sectional views in FIGS. 22A to 22C and FIGS. 23A to 23C, the width of the conductive layer 173 may be shorter than that of the oxide semiconductor layer 130. Moreover, the width of the conductive layer 173 may be shorter than that of the conductive layer 170.

In the transistor of one embodiment of the present invention (any of the transistors 101 to 109), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layer 130b and the oxide semiconductor layer 130c and the transistor including the oxide semiconductor layer 130a, the oxide semiconductor layer 130b, and the oxide semiconductor layer 130c, selecting appropriate materials for the two or three layers forming the oxide semiconductor layer 130 allows current to flow in the oxide semiconductor layer 130b. Since current flows in the oxide semiconductor layer 130b, the current is hardly influenced by interface scattering, leading to a high on-state current. Note that increasing the thickness of the oxide semiconductor layer 130b can increase the on-state current. The thickness of the oxide semiconductor layer 130b may be, for example, 100 nm to 200 nm.

A semiconductor device using a transistor with any of the above structures can have favorable electrical characteristics.

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

This embodiment can be combined with any of the other embodiments in this specification as appropriate.

Embodiment 3

In this embodiment, components of the transistors described in Embodiment 2 will be described in detail.

The substrate 115 is not limited to a simple supporting substrate, and may be a substrate where another device such as a transistor is formed. In that case, at least one of the gate electrode layer (the conductive layer 170), the source electrode layer (the conductive layer 140), and the drain electrode layer (the conductive layer 150) of the transistor may be electrically connected to the above device.

For the substrate 115, for example, a glass substrate, a ceramic substrate, a quartz substrate, a sapphire substrate, or the like can be used. Alternatively, a single crystal semiconductor substrate or a polycrystalline semiconductor substrate of silicon or silicon carbide, a compound semiconductor substrate of silicon germanium, a silicon-on-insulator (SOI) substrate, or the like can be used.

The insulating layer 120 can have a function of supplying oxygen to the oxide semiconductor layer 130 as well as a function of preventing diffusion of impurities from the substrate 115. For this reason, the insulating layer 120 is preferably an insulating film containing oxygen and further preferably, the insulating layer 120 is an insulating film containing oxygen in which the oxygen content is higher than that in the stoichiometric composition. The insulating layer 120 is a film of which the amount of released oxygen when converted into oxygen atoms is $1.0 \times 10^{19}$ atoms/cm$^3$ or more in TDS analysis. Note that the temperature of the film surface in the TDS analysis is preferably higher than or equal to 100° C. and lower than or equal to 700° C., or higher than or equal to 100° C. and lower than or equal to 500° C. In the case where the substrate 115 is provided with another device as described above, the insulating layer 120 also has a function as an interlayer insulating film. In that case, the insulating layer 120 is preferably subjected to planarization treatment such as chemical mechanical polishing (CMP) treatment so as to have a flat surface.

The insulating layer 120 can be formed using, for example, an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a mixed material of any of these. The insulating layer 120 may be a lamination of any of the above materials.

In this embodiment, detailed description is given mainly on the case where the oxide semiconductor layer 130 of the transistor has a three-layer structure in which the oxide semiconductor layer 130a, the oxide semiconductor layer 130b, and the oxide semiconductor layer 130c are stacked in this order from the insulating layer 120 side.

Note that in the case where the oxide semiconductor layer 130 is a single layer, a layer corresponding to the oxide semiconductor layer 130b is used.

In the case where the oxide semiconductor layer 130 has a two-layer structure, a lamination layer in which a layer corresponding to the oxide semiconductor layer 130b and a layer corresponding to the oxide semiconductor layer 130c are stacked in this order from the insulating layer 120 side is used. In such a case, the oxide semiconductor layer 130b and the oxide semiconductor layer 130c can be replaced with each other.

In the case where the oxide semiconductor layer 130 has a lamination of four or more layers, for example, a structure in which another oxide semiconductor layer is stacked over the three-layer stack of the oxide semiconductor layer 130 described in this embodiment or a structure in which another oxide semiconductor layer is inserted in any one of the interfaces in the three-layer stack can be employed.

For the oxide semiconductor layer 130b, for example, an oxide semiconductor whose electron affinity (an energy difference between a vacuum level and the conduction band minimum) is higher than those of the oxide semiconductor layer 130a and the oxide semiconductor layer 130c is used. The electron affinity can be obtained by subtracting an energy difference between a bottom of a conduction band and a top of a valence band (what is called an energy gap)

from an energy difference between the vacuum level and the top of the valence band (what is called an ionization potential).

The oxide semiconductor layer 130a and the oxide semiconductor layer 130c each contain one or more kinds of metal elements contained in the oxide semiconductor layer 130b. For example, the oxide semiconductor layer 130a and the oxide semiconductor layer 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130.

Since the oxide semiconductor layer 130a contains one or more kinds of metal elements contained in the oxide semiconductor layer 130b, an interface state is unlikely to be formed at the interface between the oxide semiconductor layer 130b and the oxide semiconductor layer 130a, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, fluctuations in electrical characteristics of the transistor, such as a threshold voltage, can be reduced. The reliability of the transistor can be improved as well.

Furthermore, since the oxide semiconductor layer 130c contains one or more kinds of metal elements contained in the oxide semiconductor layer 130b, scattering of carriers is unlikely to occur at the interface between the oxide semiconductor layer 130b and the oxide semiconductor layer 130c, compared with the interface between the oxide semiconductor layer 130b and the gate insulating film (the insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layer 130a and the oxide semiconductor layer 130c, for example, a material containing Al, Ti, Ga, Ge, Y, Zr, Sn, La, Ce, or Hf with a higher atomic ratio than that used for the oxide semiconductor layer 130b can be used. Specifically, any of the above metal elements in an atomic ratio 1.5 times or more, preferably 2 times or more, further preferably 3 times or more as much as a metal element of the oxide semiconductor layer is contained. Any of the above metal elements is strongly bonded to oxygen and thus has a function of suppressing generation of an oxygen vacancy in the oxide semiconductor layer and the oxide semiconductor layer. That is, an oxygen vacancy is less likely to be generated in the oxide semiconductor layer 130a and the oxide semiconductor layer 130c than in the oxide semiconductor layer 130b.

An oxide semiconductor that can be used for each of the oxide semiconductor layers 130a, 130b, and 130c preferably contains at least indium (In) or zinc (Zn). Alternatively, both In and Zn are preferably contained. In order to reduce fluctuations in electrical characteristics of the transistors including the oxide semiconductor, the oxide semiconductor preferably contains a stabilizer in addition to In and Zn.

Examples of a stabilizer include gallium (Ga), tin (Sn), hafnium (Hf), aluminum (Al), zirconium (Zr). Other examples of a stabilizer are lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that here, for example, an "In—Ga—Zn oxide" means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

Note that when each of the oxide semiconductor layer 130a, the oxide semiconductor layer 130b, and the oxide semiconductor layer 130c is an In-M-Zn oxide containing at least indium, zinc, and M (M is a metal such as Al, Ti, Ga, Ge, Y, Zr, Sn, La, Ce, or Hf), and when the oxide semiconductor layer 130a has an atomic ratio of In to M and Zn which is $x_1:y_1:z_1$, the oxide semiconductor layer 130b has an atomic ratio of In to M and Zn which is $x_2:y_2:z_2$, and the oxide semiconductor layer 130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is one and a half times or more as large as $y_2/x_2$, preferably twice or more as large as $y_2/x_2$, more preferably three times or more as large as $y_2/x_2$. At this time, when $y_2$ is greater than or equal to $x_2$ in the oxide semiconductor layer 130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layer 130a and the oxide semiconductor layer 130c are preferably less than 50 atomic % and greater than or equal to 50 atomic %, respectively, further preferably less than 25 atomic % and greater than or equal to 75 atomic %, respectively. In the case where Zn and O are not taken into consideration, the proportion of In and the proportion of M in the oxide semiconductor layer 130b are preferably greater than or equal to 25 atomic % and less than 75 atomic %, respectively, further preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of M has higher mobility than an oxide having a composition in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, further preferably greater than or equal to 5 nm and less than or equal to 25 nm. The thickness of the oxide semiconductor layer 130b is greater than or equal to 3 nm and less than or equal to 200 nm, preferably greater than or equal to 10 nm and less than or equal to 150 nm, further preferably greater than or equal to 15 nm and less than or equal to 100 nm. The thickness of the oxide semiconductor layer 130c is greater than or equal to 1 nm and less than or equal to 50 nm, preferably greater than or equal to 2 nm and less than or equal to 30 nm, further preferably greater than or equal to 3 nm and less than or equal to 15 nm. In addition, the oxide semiconductor layer 130b is preferably thicker than the oxide semiconductor layer 130a and the oxide semiconductor layer 130c.

Note that in order that a transistor in which an oxide semiconductor layer serves as a channel have stable electric characteristics, it is effective to reduce the concentration of impurities in the oxide semiconductor layer to make the oxide semiconductor layer intrinsic or substantially intrinsic (i-type). The term "substantially intrinsic" refers to the state where an oxide semiconductor layer has a carrier density which is lower than lower than $1 \times 10^{15}/cm^3$, preferably lower than $1 \times 10^{13}/cm^3$, further preferably lower than $8 \times 10^{11}/cm^3$, still further preferably lower than $1 \times 10^{8}/cm^3$, and is higher than or equal to $1 \times 10^{-9}/cm^3$.

In the oxide semiconductor layer, hydrogen, nitrogen, carbon, silicon, and metal elements except for main components are impurities. For example, hydrogen and nitrogen form donor levels to increase the carrier density, and silicon forms impurity levels in the oxide semiconductor layer. The impurity levels serve as traps and might cause the electrical characteristics of the transistor to deteriorate. The impurity level becomes a trap, which might deteriorate the electric characteristics of the transistor. Accordingly, in the oxide semiconductor layer 130a, the oxide semiconductor layer 130b, and the oxide semiconductor layer 130c and at interfaces between these layers, the impurity concentration is preferably reduced.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is preferably lower than $1 \times 10^{19}$ atoms/$cm^3$, further preferably lower than $5 \times 10^{18}$ atoms/$cm^3$, still further preferably lower than $1 \times 10^{18}$ atoms/$cm^3$. Furthermore, the concentration of hydrogen at a certain depth of the oxide semiconductor layer or in a region of the oxide semiconductor layer is preferably lower than or equal to $2 \times 10^{20}$ atoms/$cm^3$, further preferably lower than or equal to $5 \times 10^{19}$ atoms/$cm^3$, still further preferably lower than or equal to $1 \times 10^{19}$ atoms/$cm^3$, yet still further preferably lower than or equal to $5 \times 10^{18}$ atoms/$cm^3$. In addition, the concentration of nitrogen at a certain depth of the oxide semiconductor layer or in a region of the oxide semiconductor layer is preferably lower than $5 \times 10^{19}$ atoms/$cm^3$, further preferably lower than or equal to $5 \times 10^{18}$ atoms/$cm^3$, still further preferably lower than or equal to $1 \times 10^{18}$ atoms/$cm^3$, yet still further preferably lower than or equal to $5 \times 10^{17}$ atoms/$cm^3$.

In the case where the oxide semiconductor layer includes crystals, high concentration of silicon or carbon might reduce the crystallinity of the oxide semiconductor layer. In order not to reduce the crystallinity of the oxide semiconductor layer, for example, the concentration of silicon at a certain depth of the oxide semiconductor layer or in a region of the oxide semiconductor layer may be lower than $1 \times 10^{19}$ atoms/$cm^3$, preferably lower than $5 \times 10^{18}$ atoms/$cm^3$, further preferably lower than $1 \times 10^{18}$ atoms/$cm^3$. Furthermore, the concentration of carbon at a certain depth of the oxide semiconductor layer or in a region of the oxide semiconductor layer may be lower than $1 \times 10^{19}$ atoms/$cm^3$, preferably lower than $5 \times 10^{18}$ atoms/$cm^3$, further preferably lower than $1 \times 10^{18}$ atoms/$cm^3$, for example.

A transistor in which a highly purified oxide semiconductor film is used for a channel formation region as described above has extremely low off-state current. In the case where the voltage between a source and a drain is set to approximately 0.1 V, 5 V, or 10 V, for example, the off-state current standardized on the channel width of the transistor can be as low as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the oxide semiconductor layer, which serves as a channel, not be in contact with the gate insulating film for the above-described reason. In the case where a channel is formed at the interface between the gate insulating film and the oxide semiconductor layer, scattering of carriers occurs at the interface, whereby the field-effect mobility of the transistor is reduced in some cases. Also from the view of the above, it is preferable that the region of the oxide semiconductor layer, which serves as a channel, be separated from the gate insulating film.

Accordingly, with the oxide semiconductor layer 130 having a lamination including the oxide semiconductor layer 130a, the oxide semiconductor layer 130b, and the oxide semiconductor layer 130c, a channel can be formed in the oxide semiconductor layer 130b; thus, the transistor can have a high field-effect mobility and stable electrical characteristics.

In a band structure, the conduction band minimums of the oxide semiconductor layer 130a, the oxide semiconductor layer 130b, and the oxide semiconductor layer 130c are continuous. This can be understood also from the fact that the compositions of the oxide semiconductor layer 130a, the oxide semiconductor layer 130b, and the oxide semiconductor layer 130c are close to one another and oxygen is easily diffused among the oxide semiconductor layer 130a, the oxide semiconductor layer 130b, and the oxide semiconductor layer 130c. Thus, the oxide semiconductor layer 130a, the oxide semiconductor layer 130b, and the oxide semiconductor layer 130c have a continuous physical property although they have different compositions and form a lamination. In the drawings of this specification, interfaces between the oxide semiconductor layers of the laminated structure are indicated by dotted lines.

The oxide semiconductor layer 130 in which layers containing the same main components are laminated is formed to have not only a simple lamination of the layers but also a continuous energy band (here, in particular, a well structure having a U shape in which energies of the bottoms of the conduction bands are changed continuously between layers). In other words, the lamination is formed such that there exists no impurities which form a defect level such as a trap center or a recombination center at each interface. If impurities are mixed between the stacked oxide semiconductor layers, the continuity of the energy band is lost and carriers disappear by a trap or recombination.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layer $130a$ and the oxide semiconductor layer $130c$, and an In—Ga—Zn oxide whose atomic ratio of In to Ga and Zn is 1:1:1, 2:1:3, 5:5:6, or 3:1:2, can be used for the oxide semiconductor layer $130b$. In each of the oxide semiconductor layers $130a$, $130b$, and $130c$, the proportion of each atom in the above atomic ratios may vary within a range of ±20% as an error.

The oxide semiconductor layer $130b$ of the oxide semiconductor layer 130 serves as a well, so that a channel is formed in the oxide semiconductor layer $130b$ in a transistor including the oxide semiconductor layer 130. Note that since the energies of the bottoms of the conduction bands are changed continuously, the oxide semiconductor layer 130 can also be referred to as a U-shaped well. A channel formed to have such a structure can also be referred to as a buried channel.

Note that trap levels due to impurities or defects might be formed in the vicinity of the interface between an insulating layer such as a silicon oxide film and each of the oxide semiconductor layer $130a$ and the oxide semiconductor layer $130c$. The oxide semiconductor layer $130b$ can be distanced away from the trap levels owing to existence of the oxide semiconductor layer $130a$ and the oxide semiconductor layer $130c$.

However, when the energy differences between the conduction band minimum of the oxide semiconductor layer $130b$ and the conduction band minimum of each of the oxide semiconductor layer $130a$ and the oxide semiconductor layer $130c$ are small, an electron in the oxide semiconductor layer $130b$ might reach the trap level by passing over the energy differences. When the electron is trapped in the trap level, a negative charge is generated at the interface with the insulating layer, whereby the threshold voltage of the transistor is shifted in the positive direction.

Thus, to reduce fluctuations in the threshold voltage of the transistor, energy differences of at least certain values between the conduction band minimum of the oxide semiconductor layer $130b$ and the conduction band minimum of each of the oxide semiconductor layer $130a$ and the oxide semiconductor layer $130c$ are necessary. Each of the energy differences is preferably greater than or equal to 0.1 eV, further preferably greater than or equal to 0.15 eV.

The oxide semiconductor layer $130a$, the oxide semiconductor layer $130b$, and the oxide semiconductor layer $130c$ preferably include crystal parts. In particular, when a crystal in which c-axes are aligned is used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a lamination formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus allows subsequent process temperatures to be relatively high. It is also possible to use a lamination of any of the above materials and Cu or an alloy such as Cu—Mn, which has low resistance. Note that in the transistors 105, 106, 111, and 112, for example, it is possible to use W for the conductive layer 141 and the conductive layer 151 and use a lamination of Ti and Al for the conductive layer 142 and the conductive layer 152.

These materials are capable of extracting oxygen from an oxide semiconductor film. Therefore, in a region of the oxide semiconductor layer that is in contact with any of the above materials, oxygen is released from the oxide semiconductor film and an oxygen vacancy is formed. Hydrogen slightly contained in the layer and the oxygen vacancy are bonded to each other, whereby the region is markedly changed to an n-type region. Accordingly, the n-type regions can serve as a source or a drain region of the transistor.

The insulating layer 160 serving as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a lamination of any of the above materials. The insulating layer 160 may contain lanthanum (La), nitrogen, or zirconium (Zr) as an impurity. Note that the insulating layer 160 may serve as a block layer 165.

An example of a lamination of the insulating layer 160 is described. The insulating layer 160 contains, for example, oxygen, nitrogen, silicon, or hafnium. Specifically, the insulating layer 160 preferably contains hafnium oxide and silicon oxide or silicon oxynitride.

Hafnium oxide and aluminum oxide have higher dielectric constant than silicon oxide and silicon oxynitride. Thus, a physical thickness can be made larger than an equivalent oxide thickness; as a result, even in the case where the equivalent oxide thickness is less than or equal to 10 nm or less than or equal to 5 nm, leakage current due to tunnel current can be low. This means that a transistor with low off-state current can be provided. Moreover, hafnium oxide with a crystalline structure has higher dielectric constant than hafnium oxide with an amorphous structure. Thus, it is preferable to use hafnium oxide with a crystalline structure in order to manufacture a transistor with low off-state current. Examples of the crystalline structure include a monoclinic crystal structure and a cubic crystal structure. Note that one embodiment of the present invention is not limited to the above examples.

A surface over which the hafnium oxide having a crystal structure is formed might have interface states due to defects. The interface states might function as trap centers. Thus, in the case where the hafnium oxide is provided close to the channel region of the transistor, the electric characteristics of the transistor might deteriorate because of the interface states. To reduce the influence of the interface states, it is in some cases preferable to provide another film between the channel region and the hafnium oxide in the transistor so that the channel region and the hafnium oxide are apart from each other. The film has a buffering function. The film having a buffering function may be included in the insulating layer 160 or the oxide semiconductor film. In other words, silicon oxide, silicon oxynitride, an oxide semiconductor, or the like can be used for the film having a buffering function. Note that an insulator or a semiconductor that has a larger energy gap than a semiconductor to be the channel region is used for the film having a buffering function, for example. Alternatively, for example, an insulator or a semiconductor that has smaller electron affinity than a semiconductor to be the channel region is used for the film having a buffering function. Further alternatively, for example, an insulator or a semiconductor having larger ionization energy than a semiconductor to be the channel region is used for the film having a buffering function.

In some cases, the threshold voltage of the transistor can be controlled by trapping charge in the interface states (trap centers) of a surface over which the hafnium oxide having a crystal structure is formed. In order that the charge stably exists, for example, an insulator having a larger energy gap than the hafnium oxide is provided between the channel region and the hafnium oxide. Alternatively, an insulator or a semiconductor having smaller electron affinity than the hafnium oxide is provided. The film having a buffer function may be formed using an insulator or a semiconductor having higher ionization energy than the hafnium oxide. With the use of such an insulator inhibits discharge of the charge trapped by the interface states, so that the charge can be retained for a long time.

Examples of such an insulator include silicon oxide and silicon oxynitride. In order to make the interface states in the insulating layer 160 trap charge, electrons are transferred from the oxide semiconductor layer 130 toward the gate electrode layer (the conductive layer 170). As a specific example, the potential of the gate electrode layer (the conductive layer 170) is kept higher than the potential of the source or drain electrode under high temperature conditions (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a predetermined amount of electrons are trapped in interface states in the insulating layer 160 or the like shifts in the positive direction. The amount of electrons to be trapped (the amount of change in threshold voltage) can be controlled by adjusting a voltage of the gate electrode layer (the conductive layer 170) or time in which the voltage is applied. Note that a location in which charge is trapped is not necessarily limited to the inside of the insulating layer 160 as long as charge can be trapped therein. A lamination having a similar structure may be used as another insulating layer.

A region in which the density of states due to nitrogen oxide in the energy gap of the oxide semiconductor is low may be included in the insulating layers 120 and 160 in contact with the oxide semiconductor layer 130. As the oxide insulating layer with a low density of states of a nitrogen oxide, a silicon oxynitride film that releases less nitrogen oxide, an aluminum oxynitride film that releases less nitrogen oxide, or the like can be used.

Note that a silicon oxynitride film that releases less nitrogen oxide is a film of which the amount of released ammonia is larger than the amount of released nitrogen oxide in thermal desorption spectroscopy (TDS) analysis; the amount of released ammonia is typically greater than or equal to $1 \times 10^{18}$ molecules/cm$^3$ and less than or equal to $5 \times 10^{19}$ molecules/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

By using the above oxide insulating layer for the insulating layer 120 and the insulating layer 160, a shift in the threshold voltage of the transistor can be reduced, which leads to reduced fluctuations in the electrical characteristics of the transistor.

For the conductive layer 170 serving as a gate electrode layer, for example, a conductive film of Al, Ti, Cr, Co, Ni, Cu, Y, Zr, Mo, Ru, Ag, Mn, Nd, Sc, Ta, W, or the like can be used. It is also possible to use an alloy or a conductive nitride of any of these materials. It is also possible to use a lamination of a plurality of materials selected from these materials, alloys of these materials, and conductive nitrides of these materials. As a typical example, tungsten, a lamination of tungsten and titanium nitride, a lamination of tungsten and tantalum nitride, or the like can be used. It is also possible to use Cu or an alloy such as Cu—Mn, which has low resistance, or a lamination of any of the above materials and Cu or an alloy such as Cu—Mn. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 2, using an insulating film containing hydrogen as the insulating layer 175 allows the oxide semiconductor layer to be partly changed to n-type. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has the effect of preventing entry of impurities such as hydrogen and moisture, which cause variations in the electrical characteristics of the transistor, into the oxide semiconductor layer 130, preventing release of oxygen, which is a main component of the oxide semiconductor layer 130, from the oxide semiconductor layer, and preventing unnecessary release of oxygen from the insulating layer 120. Oxygen contained in the aluminum oxide film can be diffused in the oxide semiconductor layer.

The insulating layer 180 is preferably formed over the insulating layer 175. The insulating layer can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating layer may be a lamination of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with the oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. A decrease in channel width causes a reduction in on-state current.

In the transistors 107 to 112 of embodiments of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor of one embodiment of the present invention, as described above, the gate electrode layer (the conductive layer 170) is formed to electrically surround a cross-section perpendicular to the substantially planar surface of the oxide semiconductor layer 130 in the channel width direction; accordingly, a gate electric field is applied to the oxide semiconductor layer 130 in the side surface direction in addition to the perpendicular direction. In other words, a gate electric field is applied to the entire channel formation layer and an effective channel width is increased, leading to a further increase in the on-state current.

Furthermore, in the transistor of one embodiment of the present invention in which the oxide semiconductor layer 130 has a two-layer structure or a three-layer structure, since the oxide semiconductor layer 130b where a channel is formed is provided over the oxide semiconductor layer 130a, the effect of making an interface state less likely to be formed is obtained. In the transistor of one embodiment of the present invention in which the oxide semiconductor layer 130 has a three-layer structure, since the oxide semiconductor layer 130b is positioned at the middle of the three-layer structure, the effect of eliminating the influence of an impurity that enters from upper and lower layers on the oxide semiconductor layer 130b is obtained as well. Therefore, the transistor can achieve not only the increase in the on-state current of the transistor but also stabilization of the threshold voltage and a reduction in the S value (subthreshold value). Thus, Icut (current when gate voltage VG is 0 V) can be reduced and power consumption can be reduced. Further, the threshold voltage of the transistor becomes stable; thus, long-term reliability of the semiconductor device can be improved. In addition, the transistor of one embodiment of the present invention is suitable for a highly integrated semiconductor device because deterioration of electrical characteristics due to miniaturization is reduced.

This embodiment can be combined with any of the other embodiments in this specification as appropriate.

Embodiment 4

In this embodiment, a method for forming the transistor 102 described in Embodiment 2 and the transistor 107 is described.

First, a method for manufacturing the transistor 102 is described with reference to FIGS. 25A to 25C and FIGS. 26A to 26C. A cross section of the transistor in the channel length direction is shown on the left side, and a cross section of the transistor in the channel width direction is shown on the right side. The cross-sectional views in the channel width direction are enlarged views; therefore, components on the left side and those on the right side differ in apparent thickness.

The case where the oxide semiconductor layer 130 has a three-layer structure of the oxide semiconductor layer 130a, the oxide semiconductor layer 130b, and the oxide semiconductor layer 130c is described as an example. In the case where the oxide semiconductor layer 130 has a two-layer structure, the oxide semiconductor layer 130a and the oxide semiconductor layer 130b are used. In the case where the oxide semiconductor layer 130 has a single-layer structure, the oxide semiconductor layer 130b is used.

First, the insulating layer 120 is formed over the substrate 115. Embodiment 3 can be referred to for description of the kinds of the substrate 115 and a material used for the insulating layer 120. The insulating layer 120 can be formed by a sputtering method, a CVD method, a molecular beam epitaxy (MBE) method, or the like.

Oxygen may be added to the insulating layer 120 by an ion implantation method, an ion doping method, a plasma immersion ion implantation method, plasma treatment, or the like. Adding oxygen enables the insulating layer 120 to supply oxygen much easily to the oxide semiconductor layer 130.

In the case where a surface of the substrate 115 is made of an insulator and there is no influence of impurity diffusion to the oxide semiconductor layer 130 to be formed later, the insulating layer 120 is not necessarily provided.

Figure 25A:
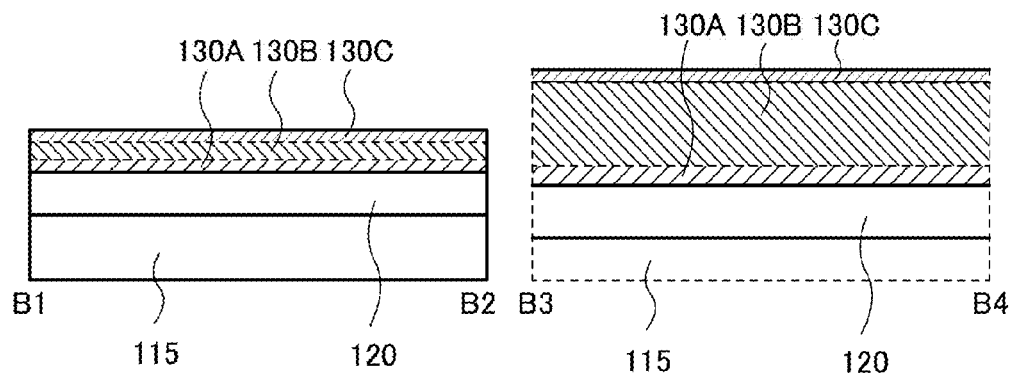
FIGS. 25A to 25C illustrate a method for manufacturing a transistor.
Figure 25B:
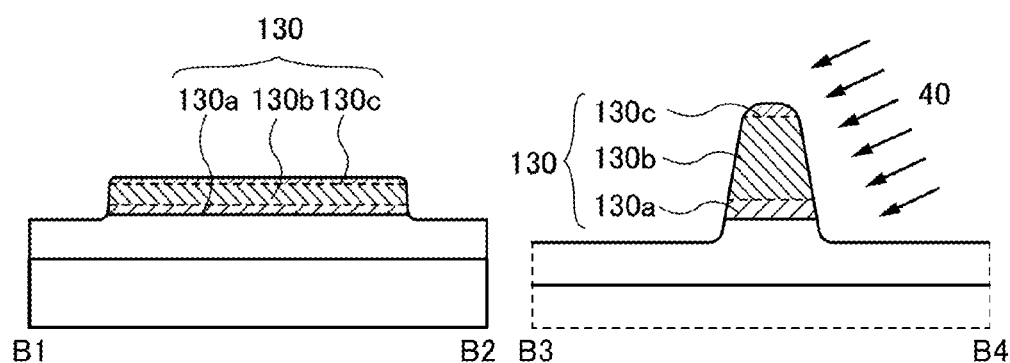
Figure 25C:
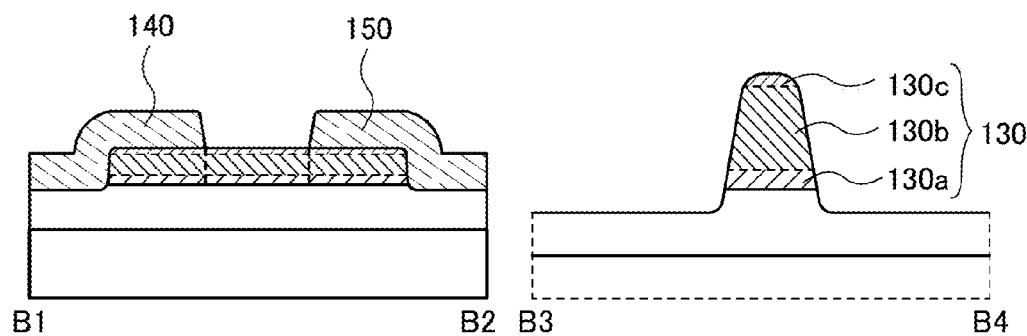

Next, an oxide semiconductor film 130A to be the oxide semiconductor layer 130a, an oxide semiconductor film 130B to be the oxide semiconductor layer 130b, and an oxide semiconductor film 130C to be the oxide semiconductor layer 130c are formed over the insulating layer 120 by a sputtering method, a CVD method, an MBE method, or the like (see FIG. 25A).

In the case where the oxide semiconductor layer 130 is made in the form of lamination, oxide semiconductor films are preferably formed successively without exposure to the air with the use of a multi-chamber deposition apparatus (e.g., a sputtering apparatus) including a load lock chamber. It is preferable that each chamber of the sputtering apparatus be able to be evacuated to a high vacuum (approximately $5 \times 10^{-7}$ Pa to $1 \times 10^{-4}$ Pa) by an adsorption vacuum evacuation pump such as a cryopump and that the chamber be able to heat a substrate over which a film is to be deposited to 100° C. or higher, preferably 500° C. or higher, so that water and the like acting as impurities of an oxide semiconductor are removed as much as possible. Alternatively, a combination of a turbo molecular pump and a cold trap is preferably used to prevent back-flow of a gas containing a carbon component, moisture, or the like from an exhaust system into the chamber. Alternatively, a combination of a turbo molecular pump and a cryopump may be used as an exhaust system.

Not only high vacuum evacuation of the chamber but also high purity of a sputtering gas is necessary to obtain a highly purified intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor film can be prevented as much as possible.

For the oxide semiconductor film 130A, the oxide semiconductor film 130B, and the oxide semiconductor film 130C, any of the materials described in Embodiment 3 can be used. For example, an In—Ga—Zn oxide whose atomic ratio of In to Ga and Zn is 1:3:6, 1:3:4, 1:3:3, or 1:3:2 can be used for the oxide semiconductor film 130A, an In—Ga—Zn oxide whose atomic ratio of In to Ga and Zn is 1:1:1, 3:1:2, 5:5:6, can be used for the oxide semiconductor film 130B, and an In—Ga—Zn oxide whose atomic ratio of In to Ga and Zn is 1:3:6, 1:3:4, 1:3:3, or 1:3:2 can be used for the oxide semiconductor film 130C. For the oxide semiconductor film 130A and the oxide semiconductor film 130C, an oxide semiconductor like gallium oxide may be used. In each of the oxide semiconductor films 130A, 130B, and 130C, the proportion of each atom in the atomic ratio varies within a range of ±20% as an error. In the case where a sputtering method is used for deposition, the above material can be used as a target.

Note that as described in detail in Embodiment 3, a material that has an electron affinity higher than that of the oxide semiconductor film 130A and that of the oxide semiconductor film 130C is used for the oxide semiconductor film 130B.

Note that the oxide semiconductor films are preferably formed by a sputtering method. As a sputtering method, an RF sputtering method, a DC sputtering method, an AC sputtering method, or the like can be used.

After the oxide semiconductor film 130C is formed, first heat treatment may be performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate released oxygen. The first heat treatment can increase the crystallinity of the oxide semiconductor film 130A, the oxide semiconductor film 130B, and the oxide semiconductor film 130C and remove impurities such as water and hydrogen from the insulating layer 120, the oxide semiconductor film 130A, the oxide semiconductor film 130B, and the oxide semiconductor film 130C. Note that the first heat treatment may be performed after etching for forming the oxide semiconductor layer 130a, the oxide semiconductor layer 130b, and the oxide semiconductor layer 130c described later.

Next, a first conductive layer is formed over the oxide semiconductor film 130A. The first conductive layer can be, for example, formed by the following method.

First, a first conductive film is formed over the oxide semiconductor film 130A. As the first conductive film, a single layer or a lamination can be formed using a material selected from Al, Cr, Cu, Ta, Ti, Mo, W, Ni, Mn, Nd, and Sc and alloys of any of these metal materials.

Next, a negative resist film is formed over the first conductive film and the resist film is exposed to light by electron beam exposure, liquid immersion exposure, or EUV exposure and developed, so that a first resist mask is formed. An organic coating film is preferably formed as an adherence agent between the first conductive film and the resist film. Alternatively, the first resist mask may be formed by nanoimprint lithography.

Then, the first conductive film is selectively etched using the first resist mask and the first resist mask is subjected to ashing; thus, the conductive layer is formed.

Next, the oxide semiconductor film 130A, the oxide semiconductor film 130B, and the oxide semiconductor film 130C are selectively etched using the conductive layer as a hard mask and the conductive layer is removed; thus, the oxide semiconductor layer 130 including a lamination of the oxide semiconductor layer 130a, the oxide semiconductor layer 130b, and the oxide semiconductor layer 130c is formed. It is also possible to form the oxide semiconductor layer 130 using the first resist mask, without forming the conductive layer. Note that the structure of the transistor 105 can be formed using the conductive layer.

Next, implantation of the oxygen ions 40 is performed on the top surface of the oxide semiconductor layer and the side surfaces of the oxide semiconductor layer in a cross-section perpendicular to the substantially planar surface in the channel width direction of the oxide semiconductor layer (see FIG. 25B) from an angle of 45°, for example (an angle θ perpendicular to the substantially planar surface of the substrate 115 or the insulating layer 120 is set to 0° and an angle θ parallel to the substantially planar surface is set to 90°).

Oxygen ion implantation may be performed under the conditions that ion species are $^{16}O_2^+$, acceleration voltage is 0.2 kV to 5 kV, and a dosage is greater than or equal to 1E13 $cm^{-2}$ and less than 1E16 $cm^{-2}$ or under the conditions that ion species are $16O^+$, acceleration voltage is 0.2 kV to 5 kV, and a dosage is greater than or equal to 1E13 $cm^{-2}$ and less than 1E15 $cm^{-2}$.

Next, a second conductive film is formed to cover the oxide semiconductor layer 130. The second conductive film can be formed using a material that can be used for the conductive layer 140 and the conductive layer 150 described in Embodiment 3. A sputtering method, a CVD method, an MBE method, or the like can be used for the formation of the second conductive film.

Then, a second resist mask is formed over portions to be a source region and a drain region. Then, part of the second conductive film is etched, whereby the conductive layer 140 and the conductive layer 150 are formed (see FIG. 25C).

Next, an insulating film 160A serving as a gate insulating film is formed over the oxide semiconductor layer 130, the conductive layer 140, and the conductive layer 150. The insulating film 160A can be formed using a material that can be used for the insulating layer 160 described in Embodiment 3. A sputtering method, a CVD method, an MBE method, or the like can be used for the formation of the insulating film 160A.

After that, second heat treatment may be performed. The second heat treatment can be performed in a condition similar to that of the first heat treatment. The second heat treatment can make oxygen implanted into the oxide semiconductor layer 130 into the entire oxide semiconductor layer 130. Note that it is possible to obtain this effect by third heat treatment, without performing the second heat treatment.

Then, a third conductive film 171A and a fourth conductive film 172A to be the conductive layer 170 are formed over the insulating film 160A. The third conductive film 171A and the fourth conductive film 172A can be formed using materials that can be used for the conductive layer 171 and the conductive layer 172 described in Embodiment 3. A sputtering method, a CVD method, an MBE method, or the like can be used for the formation of the third conductive film 171A and the fourth conductive film 172A.

Figure 26A:
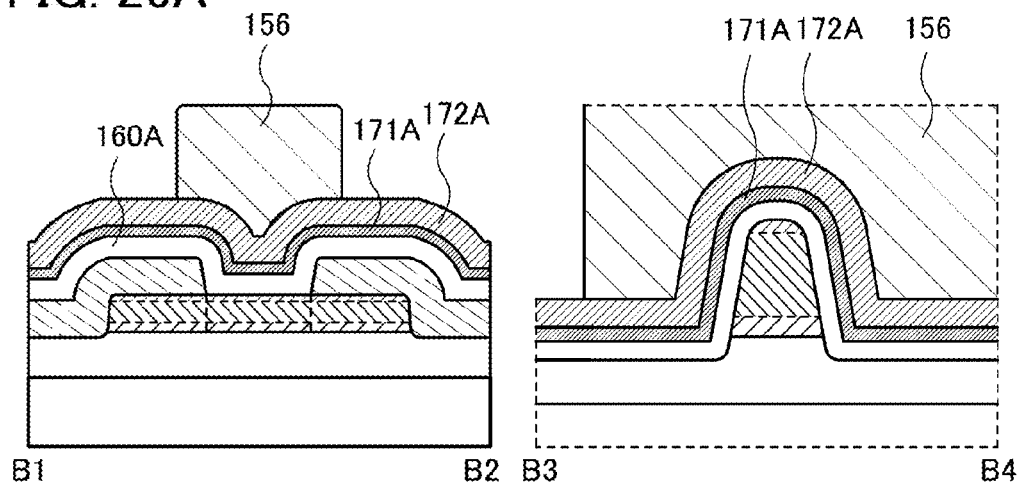
FIGS. 26A to 26C illustrate a method for manufacturing a transistor.
Figure 26B:
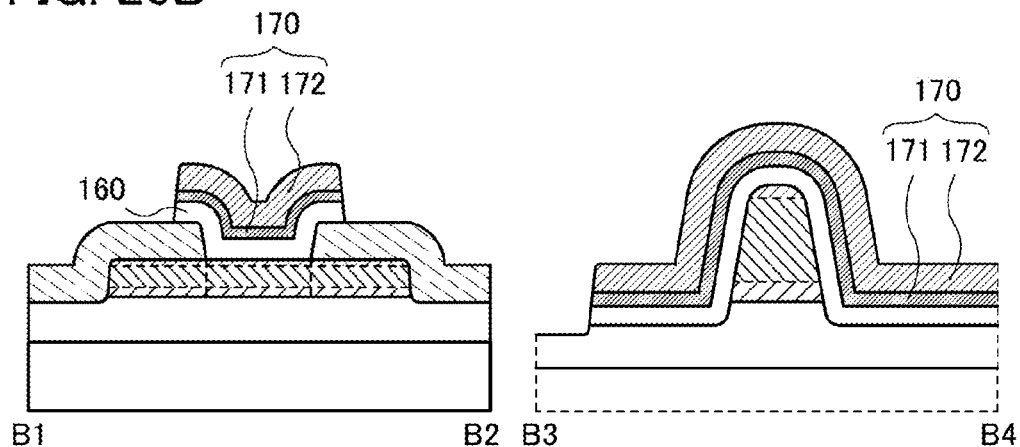

Next, a third resist mask 156 is formed over the fourth conductive film 172A (see FIG. 26A). The third conductive film 171A, the fourth conductive film 172A, and the insulating film 160A are selectively etched using the resist mask, whereby the conductive layer 170 including the conductive layer 171 and the conductive layer 172 and the insulating layer 160 are formed (see FIG. 26B). Note that if the insulating film 160A is not etched, the transistor 102 can be manufactured.

After that, the insulating layer 175 is formed over the oxide semiconductor layer 130, the conductive layer 140, the conductive layer 150, the insulating layer 160, and the conductive layer 170. Embodiment 3 can be referred to for description of a material used for the insulating layer 175. In the transistor 101, an aluminum oxide film is preferably used. The insulating layer 175 can be formed by a sputtering method, a CVD method, an MBE method, or the like.

Figure 26C:
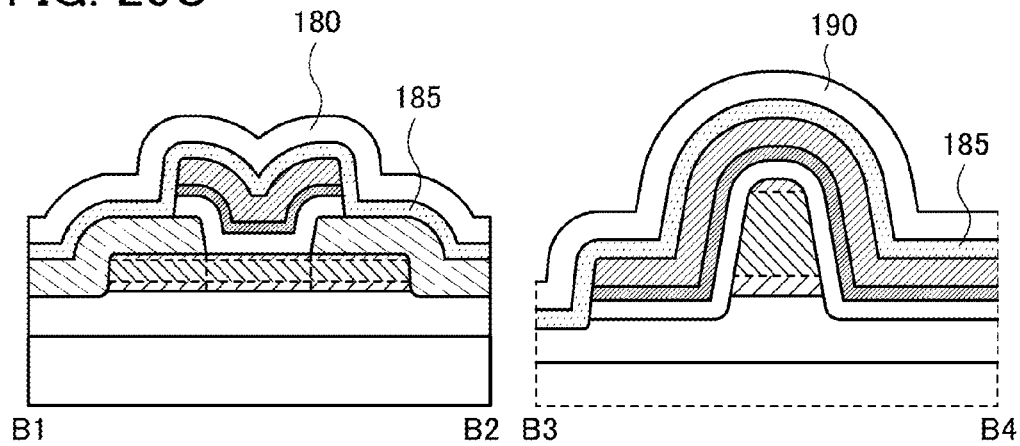

Next, the insulating layer 180 is formed over the insulating layer 175 (see FIG. 26C). Embodiment 3 can be referred to for description of a material used for the insulating layer 180. The insulating layer 180 can be formed by a sputtering method, a CVD method, an MBE method, or the like.

Oxygen may be added to the insulating layer 175 and/or the insulating layer 180 by an ion implantation method, an ion doping method, a plasma immersion ion implantation method, plasma treatment, or the like. Adding oxygen enables the insulating layer 175 and/or the insulating layer 180 to supply oxygen much easily to the oxide semiconductor layer 130.

Next, third heat treatment may be performed. The third heat treatment can be performed in a condition similar to that of the first heat treatment. By the third heat treatment, excess oxygen is easily released from the insulating layer 120, the insulating layer 175, and the insulating layer 180, so that oxygen vacancies in the oxide semiconductor layer 130 can be reduced.

Figure 71:
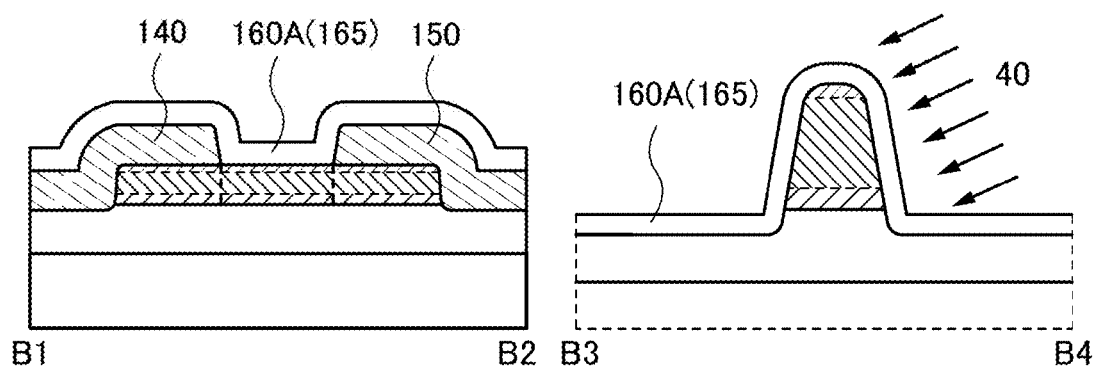
FIG. 71 is a cross-sectional view illustrating a method for manufacturing a transistor.

Note that when the mode shown in FIGS. 69A and 69B are used, after the insulating film 160A to be a gate insulating film is formed, implantation of the oxygen ions 40 may be performed on the top surface of the oxide semiconductor layer and the side surfaces of the oxide semiconductor layer in a cross-section perpendicular to the substantially planar surface in the channel width direction of the oxide semiconductor layer through the insulating film 160A (the block layer 165) (see FIG. 71).

A method for manufacturing the transistor 107 in FIGS. 15A and 15B will be described. Note that detailed description of steps similar to those for manufacturing the transistor 102 described above is omitted.

Figure 27A:
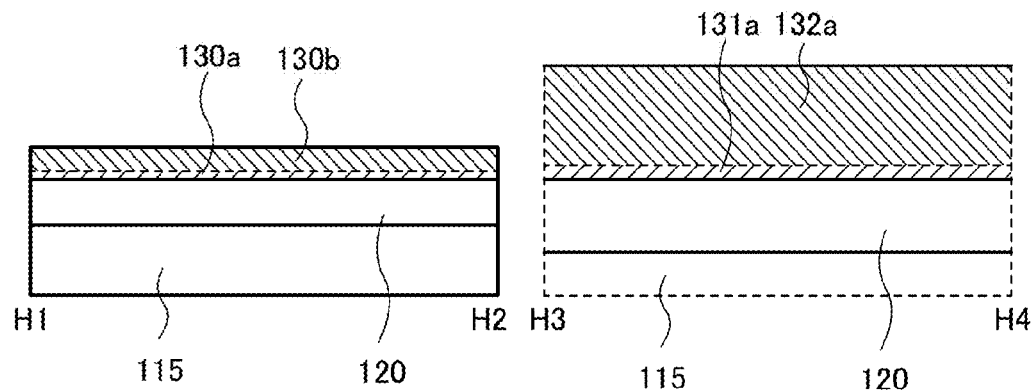
FIGS. 27A to 27C illustrate a method for manufacturing a transistor.

The insulating layer 120 is formed over the substrate 115, and the oxide semiconductor film 130A to be the oxide semiconductor layer 130a and the oxide semiconductor film 130B to be the oxide semiconductor layer 130b are formed over the insulating layer 120 by a sputtering method, a CVD method, an MBE method, or the like (see FIG. 27A).

Next, a first conductive film is formed over the oxide semiconductor film 130B, and a conductive layer is formed using a first resist mask by a method similar to the above. Then, the oxide semiconductor film 130A and the oxide semiconductor film 130B are selectively etched using the conductive layer as a hard mask, whereby a lamination layer of the oxide semiconductor layer 130a and the oxide semiconductor layer 130b is formed. It is also possible to form the lamination using the first resist mask, without forming the hard mask.

Figure 27B:
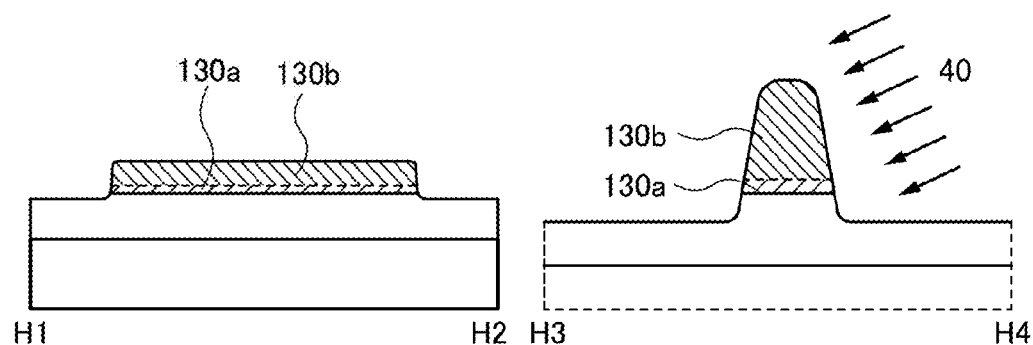

Next, the conductive layer is removed and implantation of the oxygen ions 40 is performed on the top surface of the lamination layer and the side surfaces of the lamination layer in a cross-section perpendicular to the substantially planar surface in the channel width direction of the lamination layer (see FIG. 27B) from an angle of 45°, for example (an angle θ perpendicular to the substantially planar surface of the substrate 115 or the insulating layer 120 is set to 0° and an angle θ parallel to the substantially planar surface is set to 90°). Note that the structure of the transistor 111 can be formed using the conductive layer.

The similar conditions in manufacturing the transistor 107 can be used as the conditions for oxygen ion implantation.

Figure 27C:
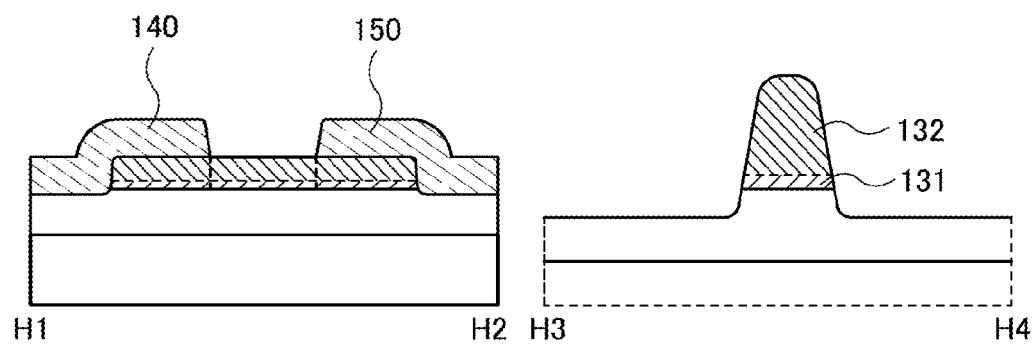

Next, a second conductive film is formed to cover the lamination. Then, a second resist mask is formed over portions to be a source region and a drain region, and part of the second conductive film is etched using the second resist mask, whereby the conductive layer 140 and the conductive layer 150 are formed (see FIG. 27C).

After that, the oxide semiconductor film 130C to be the oxide semiconductor layer 130c is formed over the lamination of the oxide semiconductor layer 130a and the oxide semiconductor layer 130b, the conductive layer 140, and the conductive layer 150. Furthermore, the insulating film 160A serving as a gate insulating film and the third conductive film 171A and the fourth conductive film 172A to be the conductive layer 170 are formed over the oxide semiconductor film 130C.

Figure 28A:
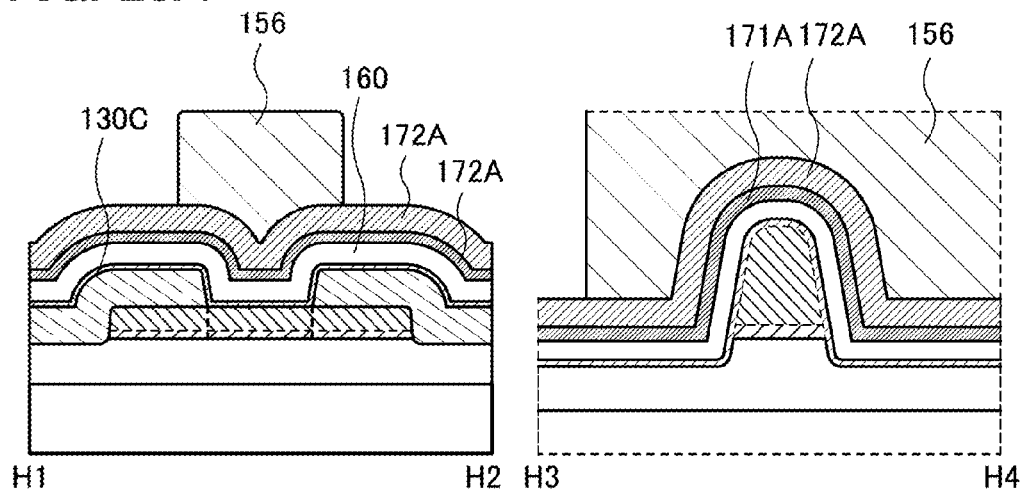
FIGS. 28A to 28C illustrate a method for manufacturing a transistor.
Figure 28B:
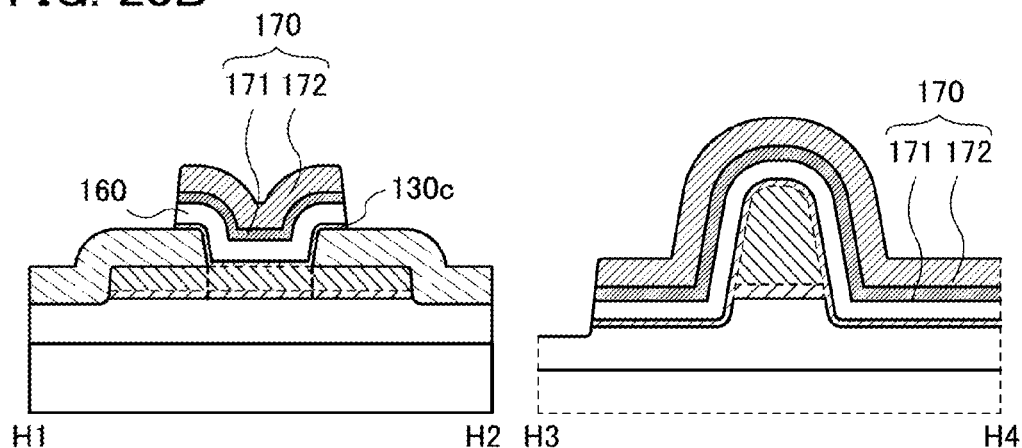

Then, the third resist mask 156 is formed over the fourth conductive film 172A (see FIG. 28A). The third conductive film 171A, the fourth conductive film 172A, the insulating film 160A, and the oxide semiconductor film 130C are selectively etched using the resist mask, whereby the conductive layer 170 including the conductive layer 171 and the conductive layer 172, the insulating layer 160, and the oxide semiconductor layer 130c are formed (see FIG. 28B). Note that if the insulating film 160A and the oxide semiconductor film 130C are etched using a fourth resist mask, the transistor 108 can be manufactured.

Figure 28C:
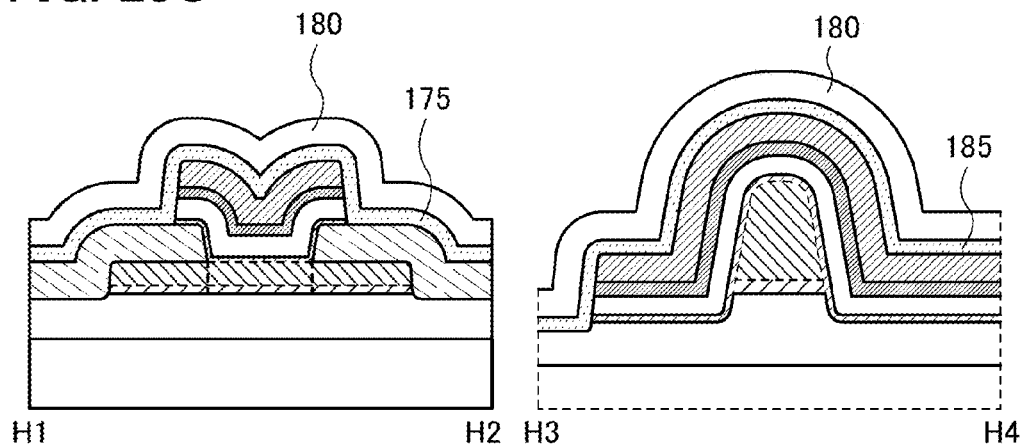

Next, the insulating layer 175 and the insulating layer 180 are formed over the insulating layer 120, the oxide semiconductor layer 130 (the oxide semiconductor layer 130a, the oxide semiconductor layer 130b, and the oxide semiconductor layer 130c), the conductive layer 140, the conductive layer 150, the insulating layer 160, and the conductive layer 170 (see FIG. 28C).

Figure 72:
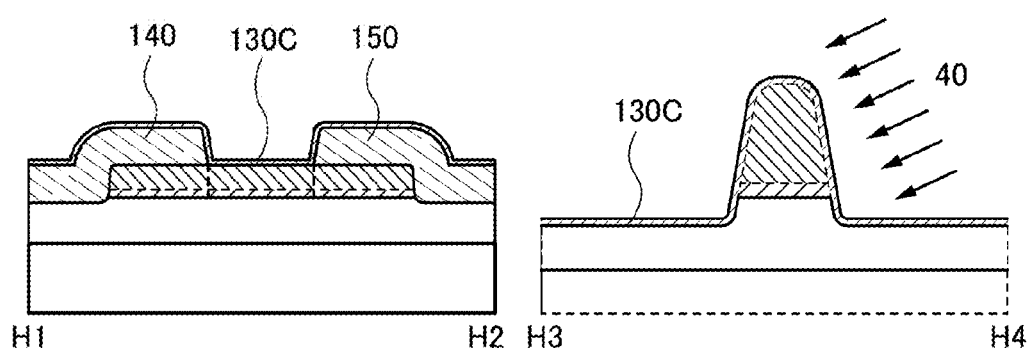
FIG. 72 is a view illustrating a method for manufacturing a transistor.

Note that when the mode shown in FIGS. 69A and 69B are used, after the oxide semiconductor film 130C is formed, implantation of the oxygen ions 40 may be performed on the top surface of the lamination layer and the side surfaces of the lamination layer in a cross-section perpendicular to the substantially planar surface in the channel width direction of the lamination layer (the oxide semiconductor layers 130a and 130b) through the oxide semiconductor film 130C (the block layer 165) (see FIG. 72).

Through the above steps, the transistor 107 shown in FIGS. 15A and 15B can be manufactured.

Although the variety of films such as the metal films, the semiconductor films, and the inorganic insulating films which are described in this embodiment typically can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the semiconductor film, and the inorganic insulating film which have been disclosed in the embodiments can be formed by a thermal CVD method such as a MOCVD method or an ALD method. For example, in the case where an In—Ga—Zn—$O_x$ (x>0) film is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

In the case where a hafnium oxide film is formed using a deposition apparatus employing ALD, for example, two kinds of gases, i.e., ozone ($O_3$) as an oxidizer and a source gas which is obtained by vaporizing liquid containing a solvent and a hafnium precursor compound (a hafnium alkoxide solution typified by tetrakis(dimethylamide)hafnium (TDMAH)), are used. Note that the chemical formula of tetrakis(dimethylamide)hafnium is $Hf[N(CH_3)_2]_4$. Examples of another material liquid include tetrakis(ethylmethylamide)hafnium.

In the case where an aluminum oxide film is formed using a deposition apparatus employing ALD, for example, two kinds of gases, i.e., $H_2O$ as an oxidizer and a source gas which is obtained by vaporizing liquid containing a solvent and an aluminum precursor compound (e.g., trimethylaluminum (TMA)), are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

In the case where a silicon oxide film is formed using a deposition apparatus employing ALD, for example, hexachlorodisilane is adsorbed on a surface where a film is to be formed, chlorine contained in the adsorbate is removed, and radicals of an oxidizing gas ($O_2$ or dinitrogen monoxide) are supplied to react with the adsorbate.

In the case where a tungsten film is formed using a deposition apparatus employing ALD, for example, a $WF_6$ gas and a $B_2H_6$ gas are sequentially introduced plural times to form an initial tungsten film, and then a $WF_6$ gas and an $H_2$ gas are introduced at a time, so that the tungsten film is formed. Note that an $SiH_4$ gas may be used instead of a $B_2H_6$ gas.

In the case where an oxide semiconductor film, e.g., an In—Ga—Zn—$O_X$ (X>0) film is formed using a deposition apparatus employing ALD, for example, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Although an $H_2O$ gas which is obtained by bubbling with an inert gas such as an Ar gas may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be combined with any of the other embodiments in this specification as appropriate.

Embodiment 5

In this embodiment, an oxide semiconductor film that can be used for a transistor of one embodiment of the present invention is described.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that an angle formed between two straight lines is 80 to 100°; thus, an angle greater than or equal to 85° and less than or equal to 95° is also included.

In this specification, trigonal and rhombohedral crystal systems are included in a hexagonal crystal system.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure.

For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 29A:
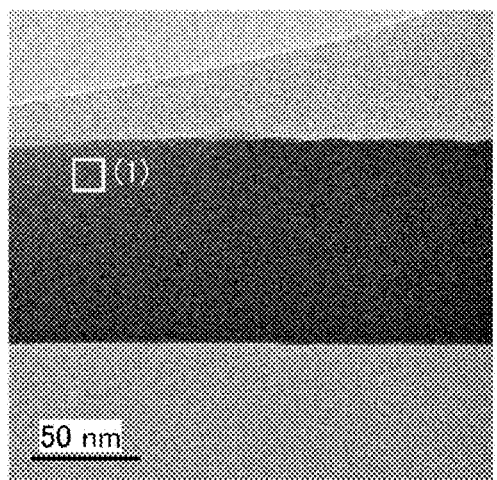
FIGS. 29A to 29D are Cs-corrected high-resolution TEM images of a cross section of a CAAC-OS and a cross-sectional schematic view of a CAAC-OS.

A CAAC-OS observed with TEM is described below. FIG. 29A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 29B:
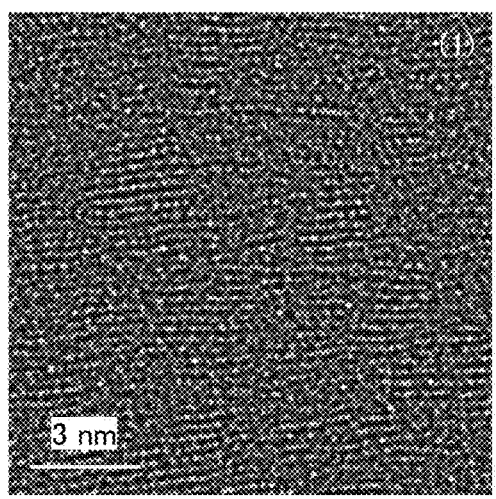

FIG. 29B is an enlarged Cs-corrected high-resolution TEM image of a region (1) in FIG. 29A. FIG. 29B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 29C:
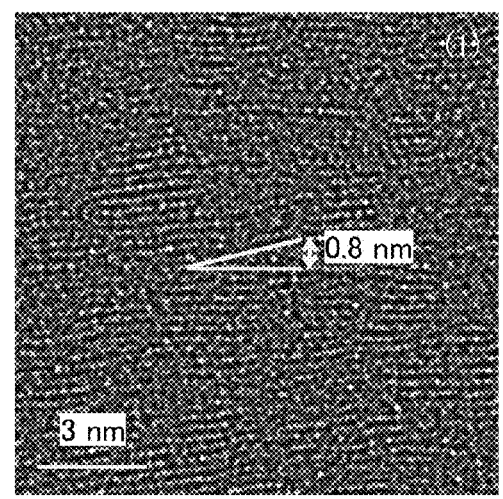

As shown in FIG. 29B, the CAAC-OS has a characteristic atomic arrangement. The characteristic atomic arrangement is denoted by an auxiliary line in FIG. 29C. FIGS. 29B and 29C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 29D:
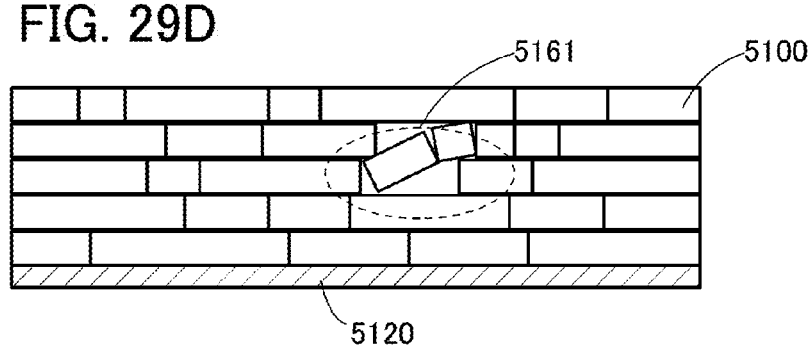

Here, according to the Cs-corrected high-resolution TEM images, the schematic arrangement of pellets 5100 of a CAAC-OS over a substrate 5120 is illustrated by such a structure in which bricks or blocks are stacked (see FIG. 29D). The part in which the pellets are tilted as observed in FIG. 29C corresponds to a region 5161 shown in FIG. 29D.

FIG. 30A shows a Cs-corrected high-resolution TEM image of a plane of the CAAC-OS observed from a direction substantially perpendicular to the sample surface. FIGS. 30B, 30C, and 30D are enlarged Cs-corrected high-resolution TEM images of regions (1), (2), and (3) in FIG. 30A, respectively. FIGS. 30B, 30C, and 30D indicate that metal atoms are arranged in a triangular, quadrangular, or hexagonal configuration in a pellet. However, there is no regularity of arrangement of metal atoms between different pellets.

Figure 31A:
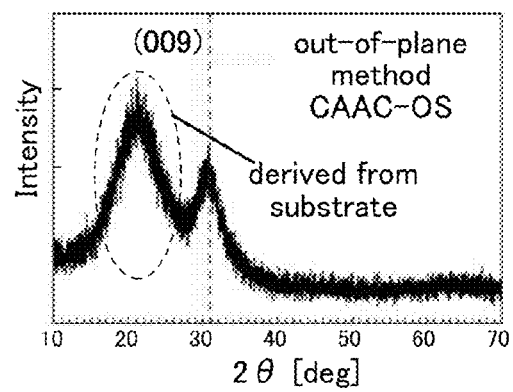
FIGS. 31A to 31C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 31A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 31B:
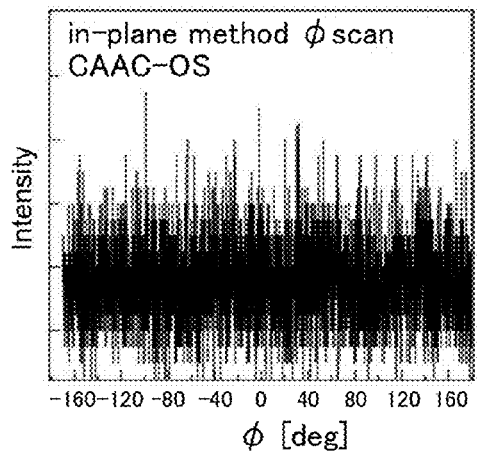
Figure 31C:
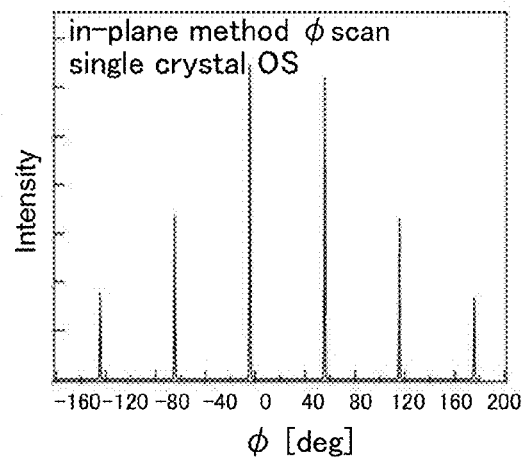

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (ϕ scan) is performed with 2θ fixed at around 56° and with the sample rotated using a normal vector of the sample surface as an axis (ϕ axis), as shown in FIG. 31B, a peak is not clearly observed. In contrast, in the case of a single crystal oxide semiconductor of InGaZnO$_4$, when ϕ scan is performed with 2θ fixed at around 56°, as shown in FIG. 31C, six peaks which are derived from crystal planes equivalent to the (110) plane are observed. Accordingly, the structural analysis using XRD shows that the directions of a-axes and b-axes are irregularly oriented in the CAAC-OS.

Figure 73A:
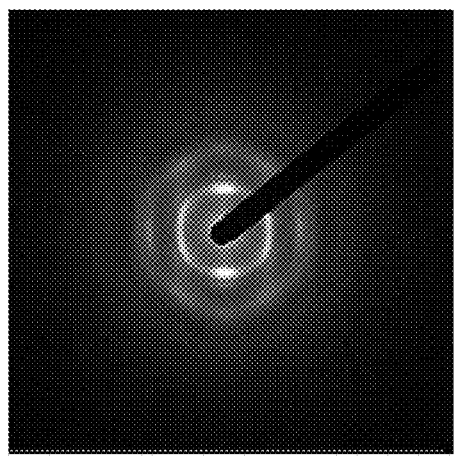
FIGS. 73A and 73B show electron diffraction patterns of a CAAC-OS.
Figure 73B:
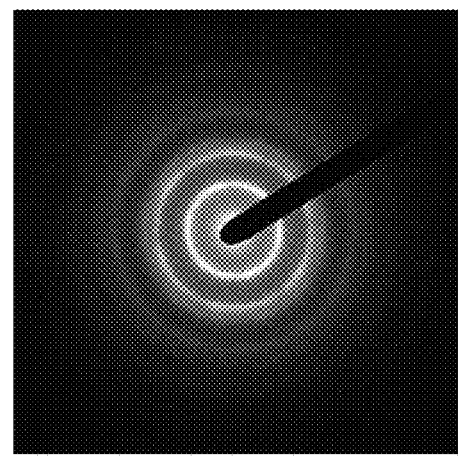

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 73A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 73B shows a diffraction pattern obtained in such a manner that an electron beam with a probe diameter of 300 nm is incident on the same sample in a direction perpendicular to the sample surface. As shown in FIG. 73B, a ring-like diffraction pattern is observed. Thus, the electron diffraction also indicates that the a-axes and b-axes of the pellets included in the CAAC-OS do not have regular alignment. The first ring in FIG. 73B is considered to be derived from the (010) plane, the (100) plane, and the like of the InGaZnO$_4$ crystal. The second ring in FIG. 73B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 74:
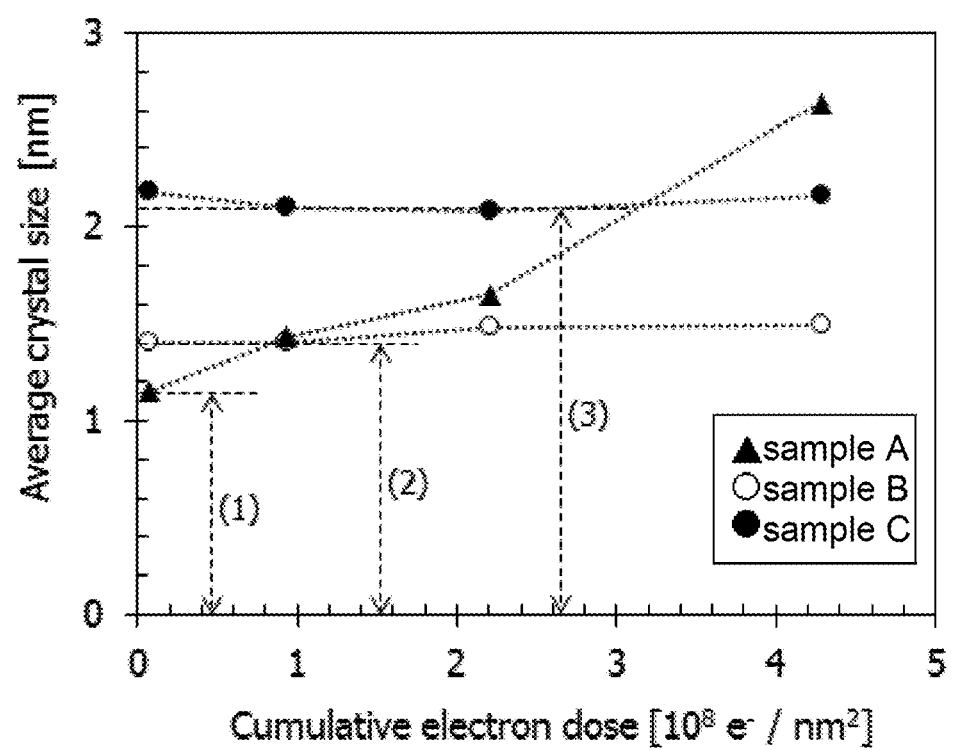
FIG. 74 shows a change of crystal part of an In—Ga—Zn oxide induced by electron irradiation.

FIG. 74 shows change in the average size of crystal parts (at 22 points to 45 points) in each sample. Note that the crystal part size corresponds to the length of a lattice fringe. FIG. 74 indicates that the crystal part size in the a-like OS increases with an increase in the cumulative electron dose. Specifically, as shown by (1) in FIG. 74, a crystal part of approximately 1.2 nm (also referred to as an initial nucleus) at the start of TEM observation grows to a size of approximately 2.6 nm at a cumulative electron dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. Specifically, as shown by (2) and (3) in FIG. 74, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

This embodiment can be combined with any of the other embodiments in this specification as appropriate.

Embodiment 6

Figure 32A:
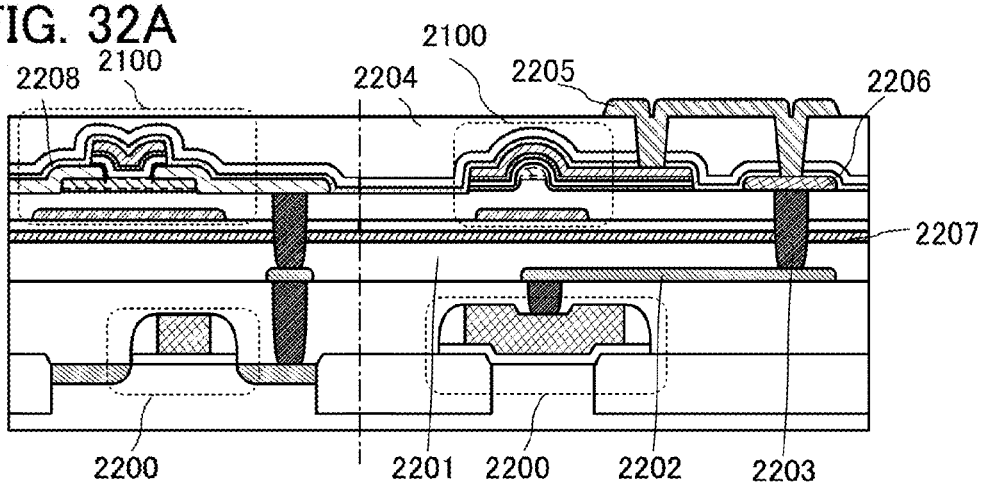
FIGS. 32A to 32D are cross-sectional views and circuit diagrams of semiconductor devices.

In this embodiment, an example of a circuit including the transistor of one embodiment of the present invention will be described with reference to drawings.
[Cross-Sectional Structure]
FIG. 32A is a cross-sectional view of a semiconductor device of one embodiment of the present invention. The semiconductor device illustrated in FIG. 32A includes a transistor 2200 containing a first semiconductor material in a lower portion and a transistor 2100 containing a second semiconductor material in an upper portion. In FIG. 32A, an example is described in which the transistor described in the above embodiment as an example is used as the transistor 2100 containing the second semiconductor material. A cross-sectional view of the transistors in a channel length direction is on the left side of a dashed-dotted line, and a cross-sectional view of the transistors in a channel width direction is on the right side of the dashed-dotted line.

Here, the first and second semiconductor materials preferably have different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor including an oxide semiconductor has low off-state current.

The transistor 2200 may be either an n-channel transistor or a p-channel transistor; an appropriate transistor is used depending on a circuit. Furthermore, the specific structure of the semiconductor device, such as the material or the structure used for the semiconductor device, is not necessarily limited to those described here except for the use of the transistor of one embodiment of the present invention which includes an oxide semiconductor.

FIG. 32A illustrates a structure in which the transistor 2100 is provided over the transistor 2200 with an insulating layer 2201 and an insulating layer 2207 provided therebetween. A plurality of wirings 2202 are provided between the transistor 2200 and the transistor 2100. Furthermore, wirings and electrodes provided over and under the insulating layers are electrically connected to each other through a plurality of plugs 2203 embedded in the insulating layers. An insulating layer 2204 covering the transistor 2100, a wiring 2205 over the insulating layer 2204, and a wiring 2206 formed by processing a conductive layer that is also used for a pair of electrodes of the transistor 2100 are provided.

Since the two kinds of transistors are stacked, the area occupied by the circuit can be reduced, allowing a plurality of circuits to be highly integrated.

Here, in the case where a silicon-based semiconductor material is used for the transistor 2200 provided in a lower portion, hydrogen in an insulating layer provided in the vicinity of the semiconductor layer of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating layer provided in the vicinity of the semiconductor layer of the transistor 2100 becomes a factor of generating carriers in the oxide semiconductor; thus, the reliability of the transistor 2100 might be decreased. Therefore, in the case where the transistor 2100 formed using an oxide semiconductor is provided over the transistor 2200 formed using a silicon-based semiconductor material, it is particularly effective that the insulating layer 2207 having a function of preventing diffusion of hydrogen is provided between the transistors 2100 and 2200. The insulating layer 2207 makes hydrogen remain in the lower portion, thereby improving the reliability of the transistor 2200. In addition, since the insulating layer 2207 suppresses diffusion of hydrogen from the lower portion to the upper portion, the reliability of the transistor 2100 can also be improved.

The insulating layer 2207 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking layer 2208 (corresponding to the insulating layer 175 in the transistors 101 to 112) having a function of preventing diffusion of hydrogen is preferably formed over the transistor 2100 to cover the transistor 2100 including an oxide semiconductor layer. For the blocking layer 2208, a material that is similar to that of the insulating layer 2207 can be used, and in particular, an aluminum oxide layer is preferably used. The aluminum oxide layer has a high shielding (blocking) effect of preventing penetration of both oxygen and impurities such as hydrogen and moisture. Thus, by using the aluminum oxide layer as the blocking layer 2208 covering the transistor 2100, release of oxygen from the oxide semiconductor layer included in the transistor 2100 and entry of water and hydrogen into the oxide semiconductor layer can be prevented.

Note that the transistor 2200 can be a transistor of various types without being limited to a planar type transistor. For example, the transistor 2200 can be a fin-type transistor, a tri-gate transistor, or the like. An example of a cross-sectional view in such a case is shown in FIG. 32D. An insulating layer 2212 is provided over a semiconductor substrate 2211. The semiconductor substrate 2211 has a projecting portion with a thin tip (also referred to a fin). Note that an insulating layer may be provided over the projecting portion. The insulating layer functions as a mask for preventing the semiconductor substrate 2211 from being etched when the projecting portion is formed. The projecting portion does not necessarily have the thin tip; a cuboid-like projecting portion and a projecting portion with a thick tip are permitted, for example. A gate insulating layer 2214 is provided over the projecting portion of the semiconductor substrate 2211, and a gate electrode 2213 is provided over the gate insulating layer 2214. Source and drain regions 2215 are formed in the semiconductor substrate 2211. Note that here is shown an example in which the semiconductor substrate 2211 has the projecting portion; however, the semiconductor device of one embodiment of the present invention is not limited thereto. For example, a semiconductor region having a projecting portion may be formed by processing an SOI substrate.

[Circuit Configuration Example]

In the above structure, electrodes of the transistors 2100 and 2200 can be connected in a variety of ways; thus, a variety of circuits can be configured. Examples of circuit configurations which can be achieved by using the semiconductor device of one embodiment of the present invention will be described below.

[CMOS Circuit]

Figures 32B, 32C:
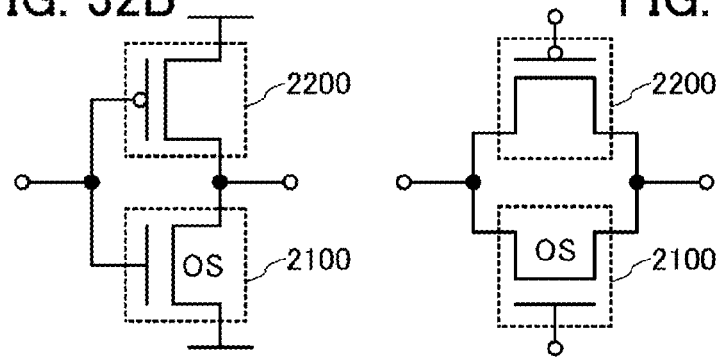
Figure 32D:
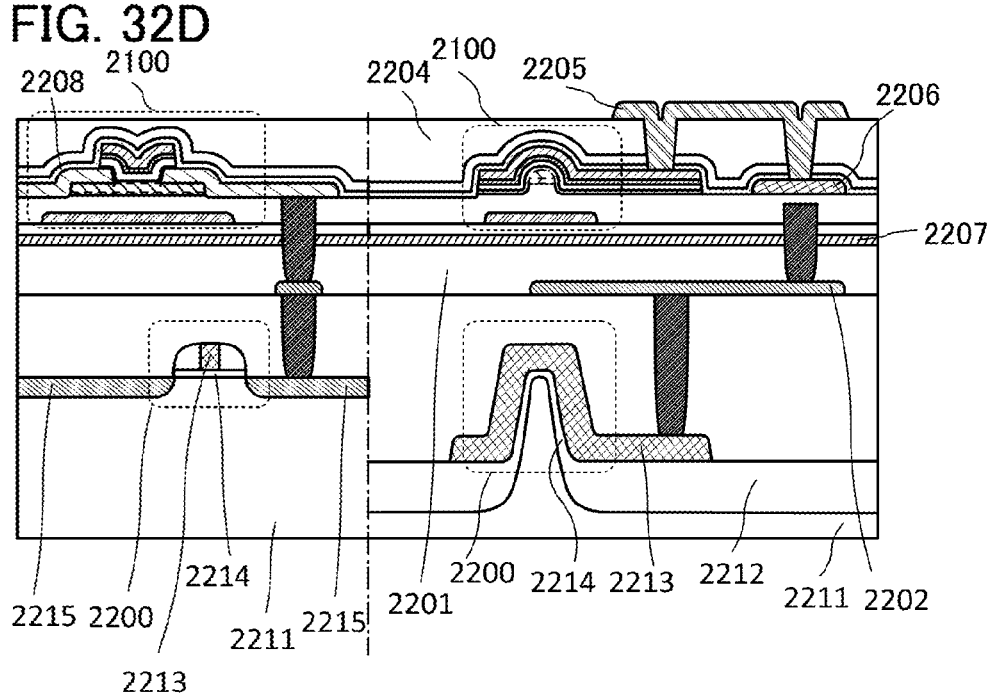

A circuit diagram in FIG. 32B shows a configuration of what is called a CMOS circuit in which the p-channel transistor 2200 and the n-channel transistor 2100 are connected to each other in series and in which gates of them are connected to each other.

[Analog Switch]

A circuit diagram in FIG. 32C shows a configuration in which sources of the transistors 2100 and 2200 are connected to each other and drains of the transistors 2100 and 2200 are connected to each other. With such a configuration, the transistors can function as what is called an analog switch.

[Example of Memory Device]

Figure 33A:
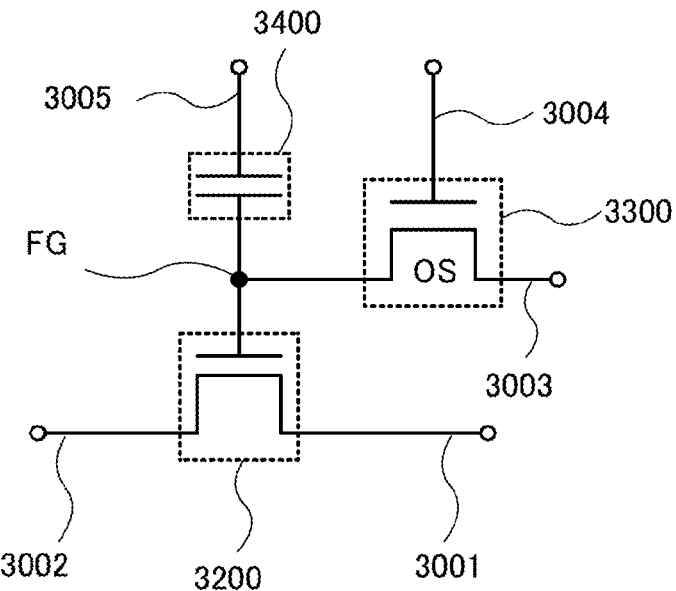
FIGS. 33A to 33C are a cross-sectional view and circuit diagrams of memory devices.
Figure 33B:
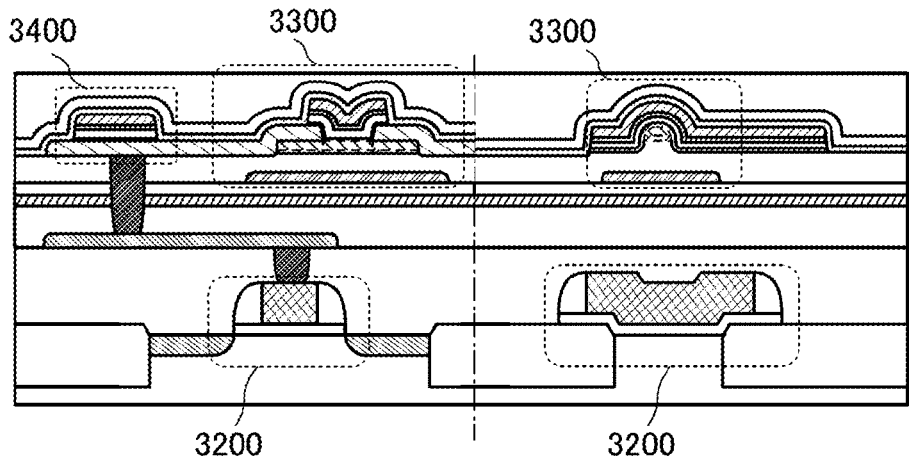
Figure 33C:
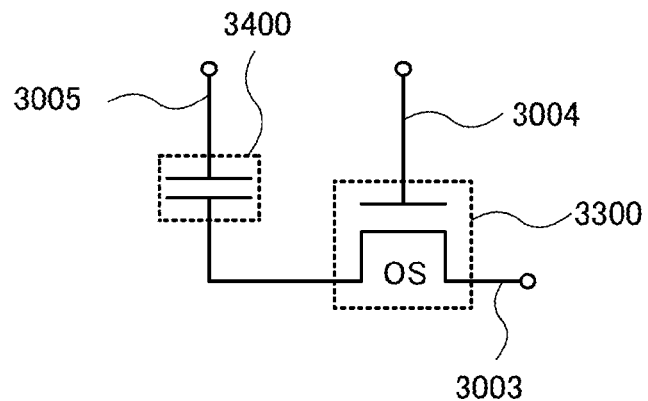

Examples of a semiconductor device (memory device) which includes the transistor of one embodiment of the present invention, which can retain stored data even when not powered, and which has an unlimited number of write cycles are shown in FIGS. 33A to 33C.

The semiconductor device illustrated in FIG. 33A includes a transistor 3200 containing a first semiconductor material, a transistor 3300 containing a second semiconductor material, and a capacitor 3400. Note that any of the above-described transistors can be used as the transistor 3300.

FIG. 33B is a cross-sectional view of the semiconductor device illustrated in FIG. 33A. The semiconductor device in the cross-sectional view has a structure in which the transistor 3300 is provided with a back gate; however, a structure without a back gate may be employed.

In the transistor 3300, a channel is formed in a semiconductor layer including an oxide semiconductor. Since the off-state current of the transistor 3300 is low, stored data can be retained for a long time. In other words, power consumption can be sufficiently reduced because a semiconductor memory device in which refresh operation is unnecessary or the frequency of refresh operation is extremely low can be provided.

In FIG. 33A, a wiring 3001 is electrically connected to a source electrode of the transistor 3200. A wiring 3002 is electrically connected to a drain electrode of the transistor 3200. A wiring 3003 is electrically connected to one of a source electrode and a drain electrode of the transistor 3300. A wiring 3004 is electrically connected to a gate electrode of the transistor 3300. A gate electrode of the transistor 3200 is electrically connected to the other of the source electrode and the drain electrode of the transistor 3300 and a one terminal of the capacitor 3400. A wiring 3005 is electrically connected to the other terminal of the capacitor 3400.

The semiconductor device in FIG. 33A has a feature that the potential of the gate electrode of the transistor 3200 can be retained, and thus enables writing, retaining, and reading of data as follows.

Writing and retaining of data are described. First, the potential of the wiring 3004 is set to a potential at which the transistor 3300 is turned on, so that the transistor 3300 is turned on. Accordingly, the potential of the wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely low, the charge of the gate electrode of the transistor 3200 is retained for a long time.

Next, reading of data is described. An appropriate potential (a reading potential) is supplied to the wiring 3005 while a predetermined potential (a constant potential) is supplied to the wiring 3001, whereby the potential of the wiring 3002 varies depending on the amount of charge retained in the gate electrode of the transistor 3200. This is because in general, when an n-channel transistor is used as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the wiring 3005 which is needed to turn on the transistor 3200. Thus, the potential of the wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the wiring 3005 is $V_0$ ($>V_{th\_H}$), the transistor 3200 is turned on. In the case where the low-level charge is supplied to the gate electrode of the transistor 3200 in writing, the transistor 3200 remains off even when the potential of the wiring 3005 is $V_0$ ($<V_{th\_L}$). Thus, the data retained in the gate electrode of the transistor 3200 can be read by determining the potential of the wiring 3002.

Note that in the case where memory cells are arrayed, it is necessary that only data of a desired memory cell be able to be read. The wiring 3005 in the case where data is not read may be supplied with a potential at which the transistor 3200 is turned off regardless of the state of the gate electrode, that is, a potential lower than $V_{th\_H}$. Alternatively, the wiring 3005 may be supplied with a potential at which the transistor 3200 is turned on regardless of the state of the gate electrode, that is, a potential higher than $V_{th\_L}$.

The semiconductor device illustrated in FIG. 33C is different from the semiconductor device illustrated in FIG. 33A in that the transistor 3200 is not provided. In this case, writing and retaining operation of data can be performed in a manner similar to that of the semiconductor device illustrated in FIG. 33A.

Here, reading of data is described. When the transistor 3300 is turned on, the wiring 3003 which is in a floating state and the capacitor 3400 are electrically connected to each other, and charge is redistributed between the wiring 3003 and the capacitor 3400. As a result, the potential of the wiring 3003 is changed. The amount of change in potential of the wiring 3003 varies depending on the potential of the first terminal of the capacitor 3400 (or the charge accumulated in the capacitor 3400).

For example, the potential of the wiring 3003 after the charge redistribution is $(C_B \times V_{B0} + C \times V)/(C_B + C)$, where V is the potential of the first terminal of the capacitor 3400, C is the capacitance of the capacitor 3400, $C_B$ is the capacitance component of the wiring 3003, and $V_{B0}$ is the potential of the wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the wiring 3003 in the case of retaining the potential $V_1$ ($=(C_B \times V_{B0} + C \times V_1)/(C_B + C)$) is higher than the potential of the wiring 3003 in the case of retaining the potential $V_0$ ($=(C_B \times V_{B0} + C \times V_0)/(C_B + C)$).

Then, by comparing the potential of the wiring 3003 with a predetermined potential, data can be read.

In this case, a transistor containing the first semiconductor material may be used in a driver circuit for driving a memory cell, and a transistor containing the second semiconductor material may be stacked over the driver circuit as the transistor 3300.

When a transistor having a channel formation region formed using an oxide semiconductor and having extremely low off-state current is applied to the semiconductor device described in this embodiment, the semiconductor device can retain stored data for an extremely long time. In other words, refresh operation becomes unnecessary or the frequency of the refresh operation can be extremely low, leading to a sufficient reduction in power consumption. Moreover, stored data can be retained for a long time even when not powered (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating layer is unlikely to be caused. That is, the semiconductor device of the disclosed invention does not have a limit on the number of times data can be rewritten, which is a problem of a conventional nonvolatile memory, and the reliability thereof is drastically improved. Moreover, since data is written depending on the state of the transistor (on or off), high-speed operation can be easily achieved.

This embodiment can be combined with any of the other embodiments in this specification as appropriate.

Embodiment 7

In this embodiment, an RF tag that includes the transistor described in the above embodiments or the memory device described in the above embodiment is described with reference to FIG. 34.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 34. FIG. 34 is a block diagram illustrating a configuration example of an RF tag.

Figure 34:
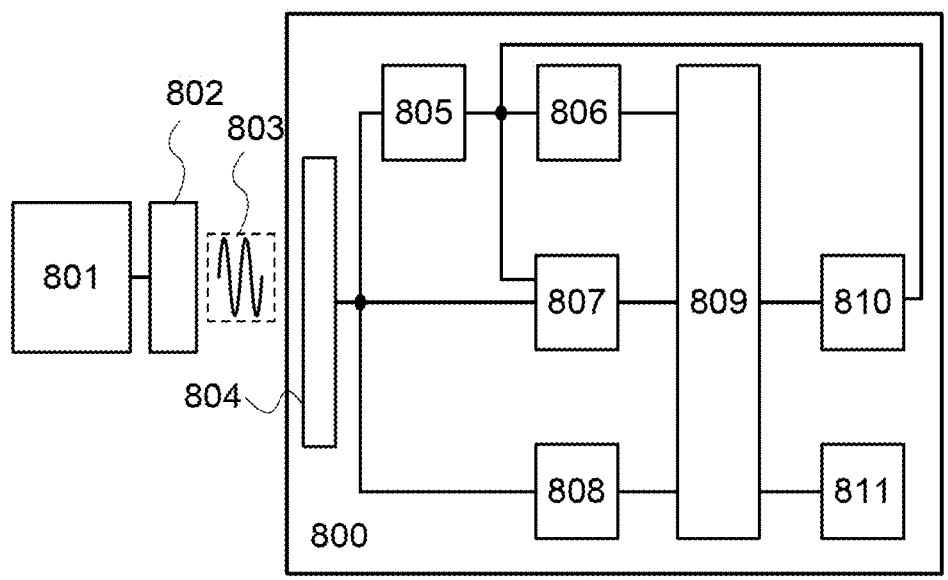
FIG. 34 illustrates a configuration example of an RF tag.

As shown in FIG. 34, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables reverse current to be low enough, for example, an oxide semiconductor. This can suppress the phenomenon of a rectifying function becoming weaker due to generation of reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

This embodiment can be combined with any of the other embodiments in this specification as appropriate.

Embodiment 8

In this embodiment, a CPU that includes the memory device described in the above embodiment is described.

Figure 35:
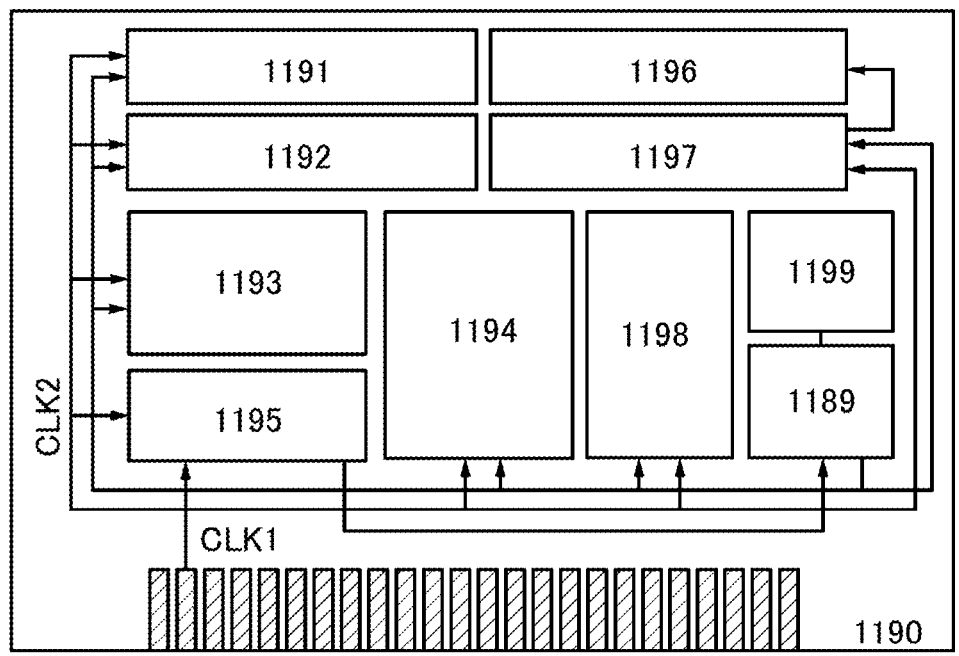
FIG. 35 illustrates a configuration example of a CPU.

FIG. 35 is a block diagram illustrating a configuration example of a CPU at least partly including any of the transistors described in the above embodiments as a component.

The CPU illustrated in FIG. 35 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 35 is just an example in which the configuration is simplified, and an actual CPU may have a variety of configurations depending on the application. For example, the CPU may have the following configuration: a structure including the CPU illustrated in FIG. 35 or an arithmetic circuit is considered as one core; a plurality of the cores are included; and the cores operate parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 35, a memory cell is provided in the register 1196. For the memory cell of the register 1196, any of the transistors described in the above embodiments can be used.

In the CPU illustrated in FIG. 35, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 36:
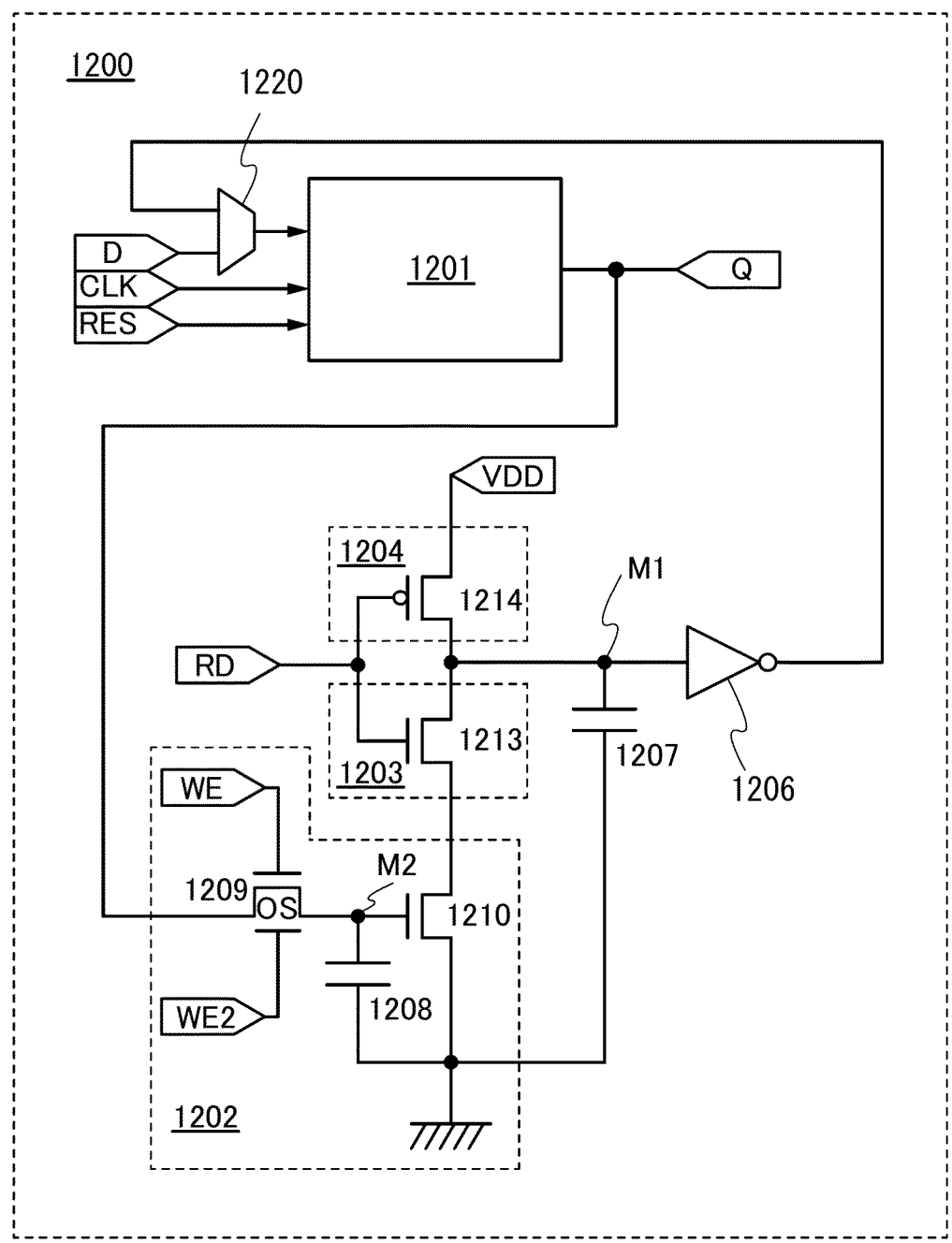
FIG. 36 is a circuit diagram of a memory element.

FIG. 36 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a first gate of the transistor 1209. For example, the first gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

Note that the transistor 1209 in FIG. 36 has a structure with a second gate (second gate electrode; back gate). The control signal WE can be input to the first gate and the control signal WE2 can be input to the second gate. The control signal WE2 is a signal having a constant potential. As the constant potential, for example, a ground potential GND or a potential lower than a source potential of the transistor 1209 is selected. The control signal WE2 is a potential signal for controlling the threshold voltage of the transistor 1209, and the drain current at the gate voltage of 0 V of the transistor 1209 can be further reduced. The control signal WE2 may be a signal having the same potential as that of the control signal WE. Note that as the transistor 1209, a transistor without a second gate may be used.

A signal corresponding to data retained in the circuit 1201 is input to the other of the source and the drain of the transistor 1209. FIG. 36 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 36, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 36, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the reset of the transistors.

As the circuit 1201 in FIG. 36, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

This embodiment can be combined with any of the other embodiments in this specification as appropriate.

Embodiment 9

In this embodiment, configuration examples of a display device using a transistor of one embodiment of the present invention are described.

Configuration Example

Figure 37A:
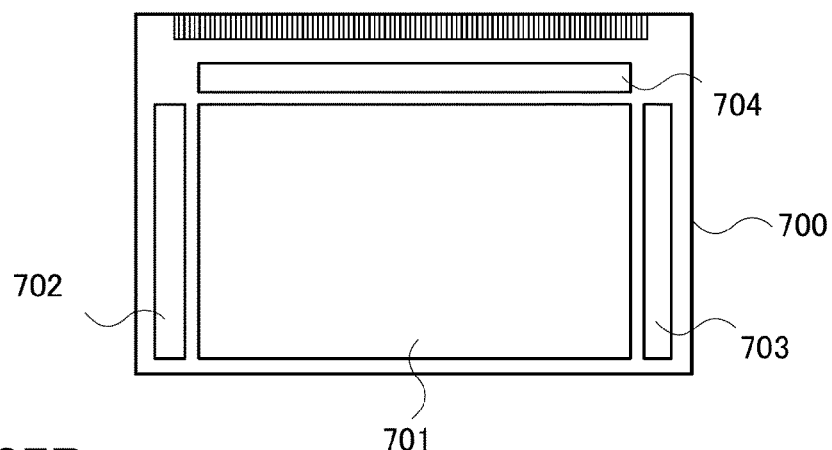
FIG. 37A illustrates a configuration example of a display device.
Figure 37B:
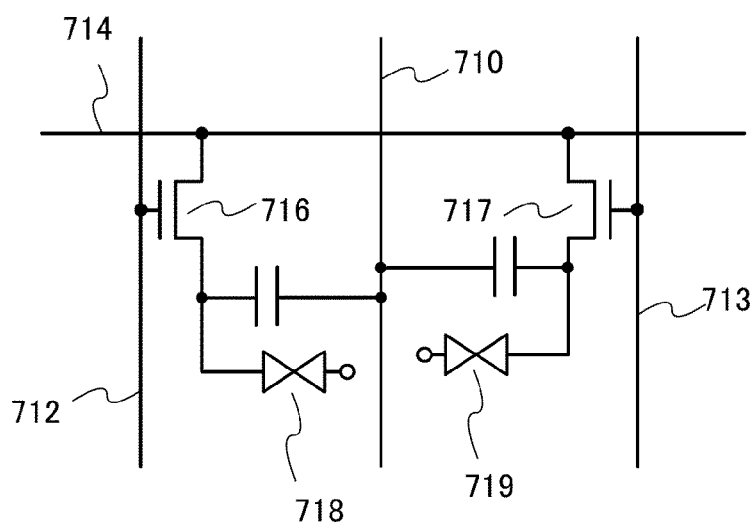
FIGS. 37B and 37C are circuit diagrams of pixels.
Figure 37C:
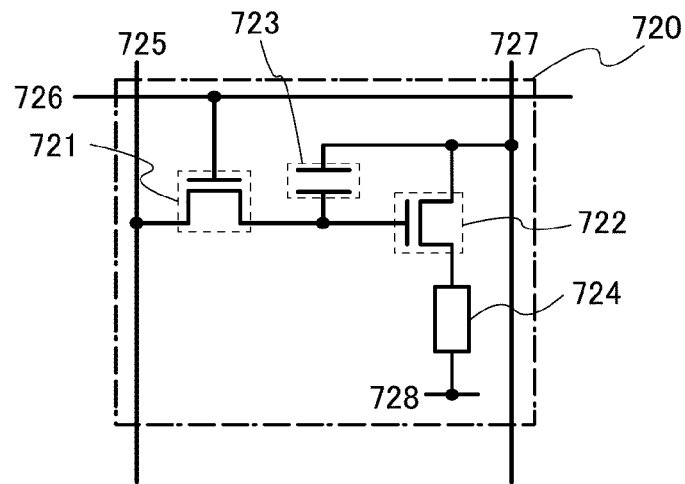

FIG. 37A is a top view of the display device of one embodiment of the present invention. FIG. 37B is a circuit diagram illustrating a pixel circuit that can be used in the case where a liquid crystal element is used in a pixel in the display device of one embodiment of the present invention. FIG. 37C is a circuit diagram illustrating a pixel circuit that can be used in the case where an organic EL element is used in a pixel in the display device of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 37A illustrates an example of a top view of an active matrix display device. A pixel portion 701, a scan line driver circuit 702, a scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the scan line driver circuit 702 and the scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 37A, the scan line driver circuit 702, the scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Display Device]

FIG. 37B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a data line 714 is shared by the transistors 716 and 717. The transistor described in any of the above embodiments can be used as appropriate as each of the transistors 716 and 717. Thus, a highly reliable liquid crystal display device can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 37B. For example, a switch, a resistor, a capacitor, a transistor, a sensor, a logic circuit, or the like may be added to the pixel illustrated in FIG. 37B.

[Organic EL Display Device]

FIG. 37C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 37C illustrates an applicable example of a pixel circuit. Here, one pixel includes two n-channel transistors. Note that a metal oxide film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, any of the transistors described in other embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage greater than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 37C. For example, a switch, a resistor, a capacitor, a sensor, a transistor, a logic circuit, or the like may be added to the pixel circuit illustrated in FIG. 37C.

In the case where the transistor shown in any of the above embodiments is used for the circuit shown in FIGS. 37A to 37C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

In this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by electrical or magnetic action may be included. Note that examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

This embodiment can be combined with any of the other embodiments in this specification as appropriate.

Embodiment 10

In this embodiment, a display module using a semiconductor device of one embodiment of the present invention is described with reference to FIG. 38.

Figure 38:
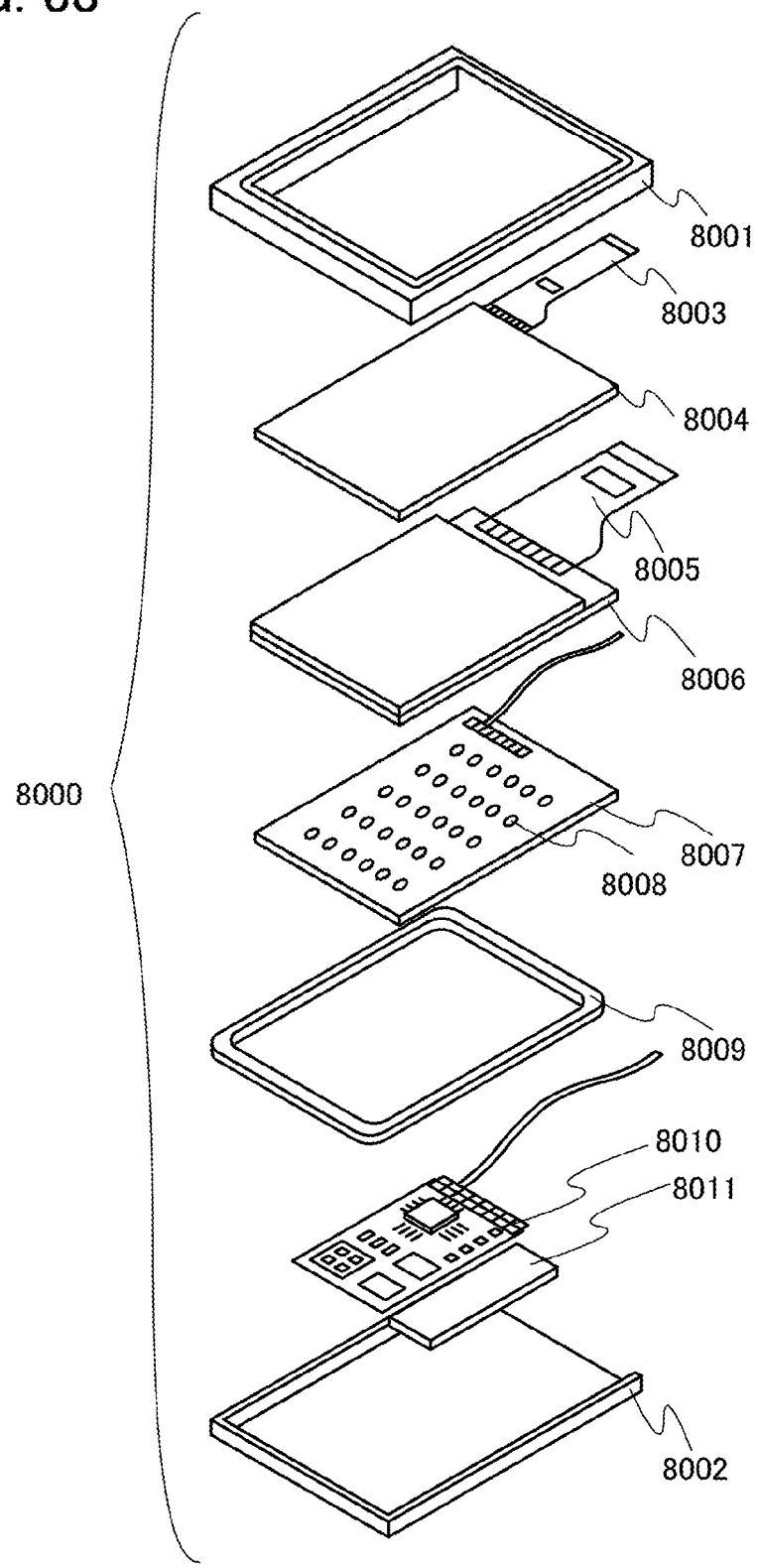
FIG. 38 illustrates a display module.

In a display module 8000 in FIG. 38, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. A counter substrate (sealing substrate) of the display panel 8006 can have a touch panel function. A photosensor may be provided in each pixel of the display panel 8006 so that an optical touch panel is obtained. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. Note that the battery 8011 is not necessary in the case where a commercial power source is used.

The display module 8000 can be additionally provided with a member such as a polarizing plate, a retardation plate, or a prism sheet.

This embodiment can be combined with any of the other embodiments in this specification as appropriate.

Embodiment 11

A band structure of the transistor of one embodiment of the present invention in an arbitrary cross section will be described.

FIG. 39A is a cross-sectional view of a transistor according to one embodiment of the present invention.

The transistor illustrated in FIG. 39A includes an insulating layer 401 over a substrate 400, a conductive layer 404a over the insulating layer 401, a conductive layer 404b over the conductive layer 404a, an insulating layer 402a over the insulating layer 401, the conductive layer 404a, and the conductive layer 404b, an insulating layer 402b over the insulating layer 402a, a semiconductor layer 406a over the insulating layer 402b, a semiconductor layer 406b over the semiconductor layer 406a, an insulating layer 412 over the semiconductor layer 406b, a conductive layer 414a over the insulating layer 412, a conductive layer 414b over the conductive layer 414a, an insulating layer 408 over the insulating layer 402b, the semiconductor layer 406a, the semiconductor layer 406b, the insulating layer 412, the conductive layer 414a, and the conductive layer 414b, an insulating layer 418 over the insulating layer 408, a conductive layer 416a1 and a conductive layer 416b1 over the insulating layer 418, a conductive layer 416a2 and a conductive layer 416b2 respectively over the conductive layer 416a1 and the conductive layer 416b1, and an insulating layer 428 over the insulating layer 418, the conductive layer 416a2, and the conductive layer 416b2.

In some cases, the insulating layer 401 has a function of suppressing entry of impurities to a channel formation region of the transistor. In the case where the conductive layer 404b or the like includes an impurity for the semiconductor layer 406a or 406b, such as copper, for example, the insulating layer 401 has a function of blocking copper or the like in some cases.

The lamination of the conductive layers 404a and 404b are collectively referred to as a conductive layer 404. The conductive layer 404 has a function of a gate electrode of the transistor in some cases. The conductive layer 404 has a function of shielding the channel formation region of the transistor from light in some cases.

The insulating layers 402a and 402b are collectively referred to as an insulating layer 402. The insulating layer 402 has a function of a gate insulating layer of the transistor in some cases. Furthermore, in some cases, the insulating layer 402a has a function of suppressing entry of impurities to the channel formation region of the transistor. In the case where the conductive layer 404b or the like includes an impurity for the semiconductor layer 406a or 406b, such as copper, for example, the insulating layer 402a has a function of blocking copper or the like in some cases.

The semiconductor layers 406a and 406b are collectively referred to as a semiconductor layer 406. In some cases, the semiconductor layer 406 has a function of the channel formation region of the transistor. For example, the semiconductor layer 406a and the semiconductor layer 406b correspond to the oxide semiconductor layer 130b and the oxide semiconductor layer 130c described in the above embodiment, respectively.

The semiconductor layer 406a includes a region 407a1 and a region 407b1 which overlap with none of the insulating layer 412, the conductive layer 414a, the conductive layer 414b, and the like. Furthermore, the semiconductor layer 406b includes a region 407a2 and a region 407b2 which overlap with none of the insulating layer 412, the conductive layer 414a, the conductive layer 414b, and the like. The region 407a1 and the region 407b1 have lower resistance than the region overlapping with the insulating layer 412, the conductive layer 414a, the conductive layer 414b, and the like in the semiconductor layer 406a. The region 407a2 and the region 407b2 have lower resistance than the region overlapping with the insulating layer 412, the conductive layer 414a, the conductive layer 414b, and the like in the semiconductor layer 406b. Note that the region with low resistance can also be referred to as a region with high carrier density.

The region 407a1 and the region 407a2 are collectively referred to as a region 407a. The region 407b1 and the region 407b2 are collectively referred to as a region 407b. The region 407a and the region 407b have functions of the source region and the drain region of the transistor, in some cases.

The conductive layers 414a and 414b are collectively referred to as a conductive layer 414. The conductive layer 414 has a function of a gate electrode of the transistor in some cases. The conductive layer 414 has a function of shielding the channel formation region of the transistor from light in some cases.

The insulating layer 412 has a function of a gate insulating layer of the transistor in some cases.

In some cases, the insulating layer 408 has a function of suppressing entry of impurities to the channel formation region of the transistor. In the case where the conductive layer 416a2, the conductive layer 416b2, or the like includes an impurity for the semiconductor layer 406a or 406b, such as copper, for example, the insulating layer 408 has a function of blocking copper or the like in some cases.

The insulating layer 418 has a function of an interlayer insulating layer of the transistor, in some cases. For example, parasitic capacitance between wirings of the transistor can be reduced by the insulating layer 418 in some cases.

The conductive layers 416a1 and 416a2 are collectively referred to as a conductive layer 416a. The conductive layers 416b1 and 416b2 are collectively referred to as a conductive layer 416b. The conductive layer 416a and the conductive layer 416b have functions of the source electrode and the drain electrode of the transistor, in some cases.

In some cases, the insulating layer 428 has a function of suppressing entry of impurities to the channel formation region of the transistor.

Here, a band structure in the P1-P2 cross section including the channel formation regions of the transistor is illustrated in FIG. 39B. Note that the semiconductor layer 406a is assumed to have a narrower energy gap than the semiconductor layer 406b. Furthermore, the insulating layer 402a, the insulating layer 402b, and the insulating layer 412 are assumed to have wider energy gaps than the semiconductor layer 406a and the semiconductor layer 406b. Furthermore, the Fermi levels (denoted by Ef) of the semiconductor layer 406a, the semiconductor layer 406b, the insulating layer 402a, the insulating layer 402b, and the insulating layer 412 are assumed to be equal to the intrinsic Fermi levels thereof (denoted by Ei). Furthermore, work functions of the conductive layer 404 and the conductive layer 414 are assumed equal to the Fermi levels.

When a gate voltage is set to be higher than or equal to the threshold voltage of the transistor, an electron flows preferentially in the semiconductor layer 406a owing to the difference between the energies of the conduction band minimums of the semiconductor layers 406a and 406b. That is, it is probable that an electron is embedded in the semiconductor layer 406a. Note that the energy at the conduction band minimum is denoted by Ec, and the energy at the valence band maximum is denoted by Ev.

Accordingly, in the transistor according to one embodiment of the present invention, the embedment of an electron reduces the influence of interface scattering. Therefore, the channel resistance of the transistor according to one embodiment of the present invention is low.

Next, FIG. 39C shows a band structure in the Q1-Q2 cross section including the source region or the drain region of the transistor. Note that the regions 407a1, 407b1, 407a2, and 407b2 are assumed to be in a degenerate state. Furthermore, the Fermi level of the semiconductor layer 406a is assumed to be approximately the same as the energy of the conduction band minimum in the region 407b1. Furthermore, the Fermi level of the semiconductor layer 406a is assumed to be approximately the same as the energy of the conduction band minimum in the region 407b2. The same can apply to the regions 407a1 and 407a2.

At this time, an ohmic contact is made between the conductive layer 416b functioning as a source electrode or a drain electrode and the region 407b2 because an energy barrier therebetween is sufficiently low. Furthermore, an ohmic contact is made between the region 407b2 and the region 407b1. Similarly, an ohmic contact is made between the conductive layer 416a functioning as a source electrode or a drain electrode and the region 407a2 because an energy barrier therebetween is sufficiently low. Furthermore, an ohmic contact is made between the region 407a2 and the region 407a1. Therefore, electron transfer is conducted smoothly between the conductive layers 416a and 416b and the semiconductor layers 406a and 406b.

As described above, the transistor according to one embodiment of the present invention is a transistor in which the channel resistance is low and electron transfer between the channel formation region and the source and the drain electrodes is conducted smoothly. That is, the transistor has excellent switching characteristics.

This embodiment can be combined as appropriate with any of the other embodiments in this specification.

Embodiment 12

In this embodiment, effects of an oxygen vacancy in an oxide semiconductor layer and hydrogen that enters the oxygen vacancy are described below.

<(1) Ease of Formation and Stability of $V_oH$>

In the case where an oxide semiconductor film (hereinafter referred to as IGZO) is a complete crystal, H preferentially diffuses along the a-b plane at a room temperature. In heat treatment at 450° C., H diffuses along the a-b plane and in the c-axis direction. Here, description is made on whether H easily enters an oxygen vacancy $V_o$ if the oxygen vacancy $V_o$ exists in IGZO. A state in which H is in an oxygen vacancy $V_o$ is referred to as $V_oH$.

Figure 40:
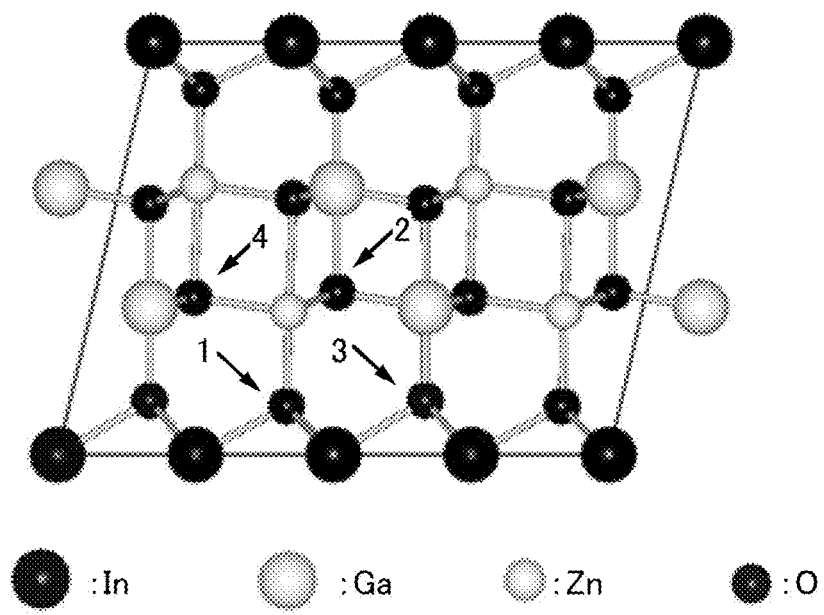
FIG. 40 shows a calculation model.

An $InGaZnO_4$ crystal model shown in FIG. 40 was used for calculation. The activation barrier ($E_a$) along the reaction path where H in $V_oH$ is released from $V_o$ and bonded to oxygen was calculated by a nudged elastic band (NEB) method. The calculation conditions are shown in Table 2.

TABLE 2

| Software | VASP |
|---|---|
| Calculation method | NEB method |
| Functional | GGA-PBE |
| Pseudopotential | PAW |
| Cut-off energy | 500 eV |
| Sampling point k | 2 × 2 × 3 |

In the InGaZnO$_4$ crystal model, there are oxygen sites 1 to 4 as shown in FIG. 40 which differ from each other in metal elements bonded to oxygen and the number of bonded metal elements. Here, calculation was made on the oxygen sites 1 and 2 in which an oxygen vacancy V$_o$ is easily formed.

First, calculation was made on the oxygen site 1 in which an oxygen vacancy V$_o$ is easily formed, which is herein the oxygen site that was bonded to three In atoms and one Zn atom.

Figure 41A:
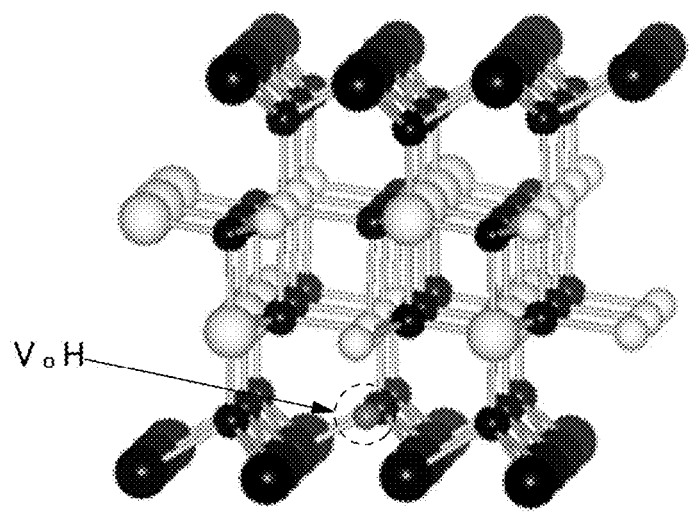
FIGS. 41A and 41B show the initial state and the final state, respectively.
Figure 41B:
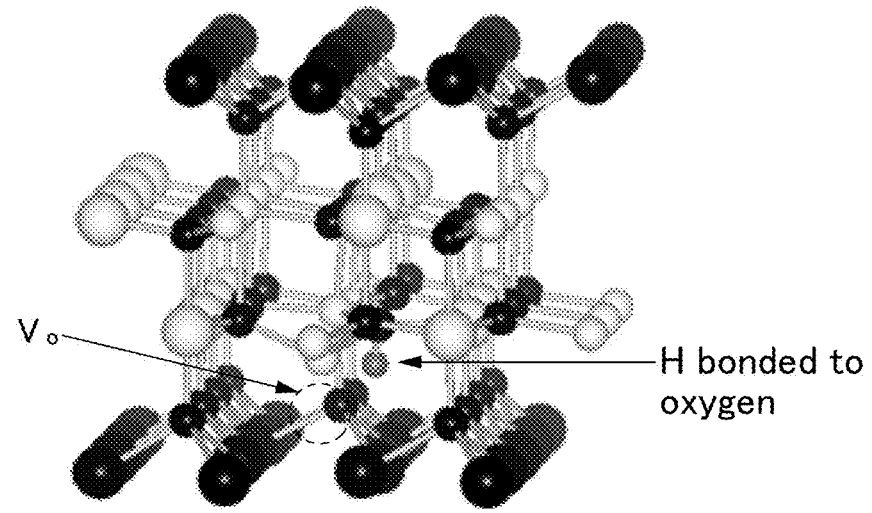
Figure 42:
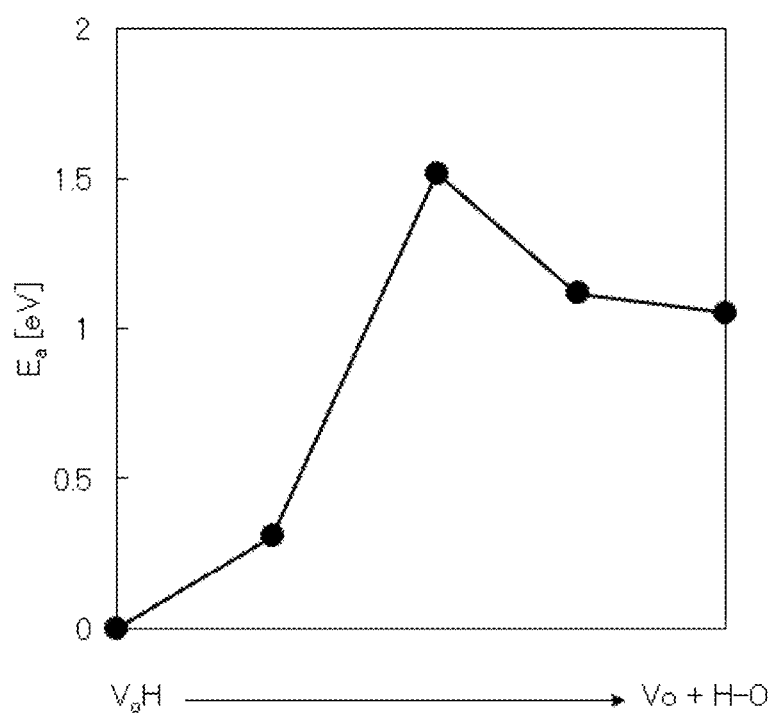
FIG. 42 shows an activation barrier.

FIG. 41A shows a model in the initial state and FIG. 41B shows a model in the final state. FIG. 42 shows the calculated activation barrier (E$_a$) in the initial state and the final state. Note that here, the initial state refers to a state in which H exists in an oxygen vacancy V$_o$ (V$_o$H), and the final state refers to a structure including an oxygen vacancy V$_o$ and a state in which H is bonded to oxygen bonded to one Ga atom and two Zn atoms (H—O).

From the calculation results, bonding of H in an oxygen vacancy V$_o$ to another oxygen atom needs an energy of approximately 1.52 eV, while entry of H bonded to O into an oxygen vacancy V$_o$ needs an energy of approximately 0.46 eV.

Reaction frequency (Γ) was calculated with use of the activation barriers (E$_a$) obtained by the calculation and Formula 2. In Formula 2, k$_B$ represents the Boltzmann constant and T represents the absolute temperature.

$$\Gamma = \nu \exp\left(-\frac{E_a}{k_B T}\right) \quad \text{[Formula 2]}$$

The reaction frequency at 350° C. was calculated on the assumption that the frequency factor $\nu=10^{13}$ [1/sec]. The frequency of H transfer from the model shown in FIG. 41A to the model shown in FIG. 41B was 5.52×10$^0$ [1/sec], whereas the frequency of H transfer from the model shown in FIG. 41B to the model shown in FIG. 41A was 1.82×10$^9$ [1/sec]. This suggests that H diffusing in IGZO is likely to form V$_o$H if an oxygen vacancy V$_o$ exists in the neighborhood, and H is unlikely to be released from the oxygen vacancy V$_o$ once V$_o$H is formed.

Next, calculation was made on the oxygen site 2 in which an oxygen vacancy V$_o$ is easily formed, which is herein the oxygen site that was bonded to one Ga atom and two Zn atoms.

Figure 43A:
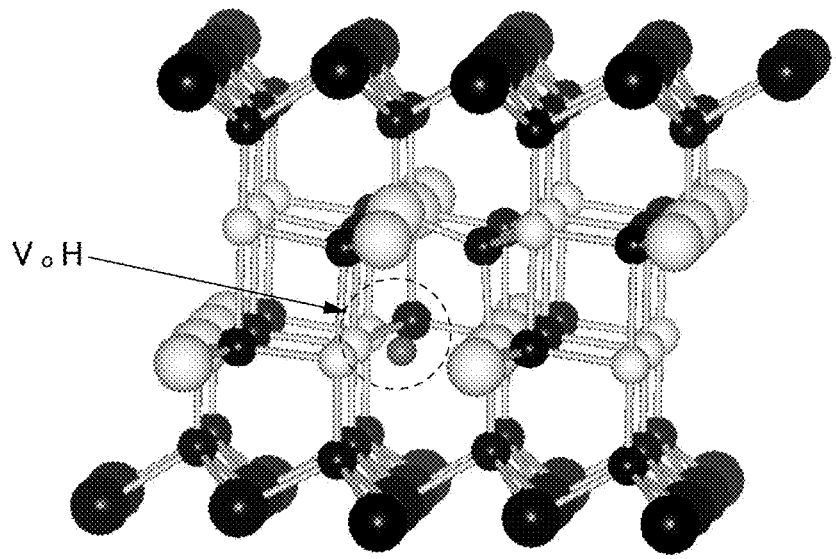
FIGS. 43A and 43B show the initial state and the final state, respectively.
Figure 43B:
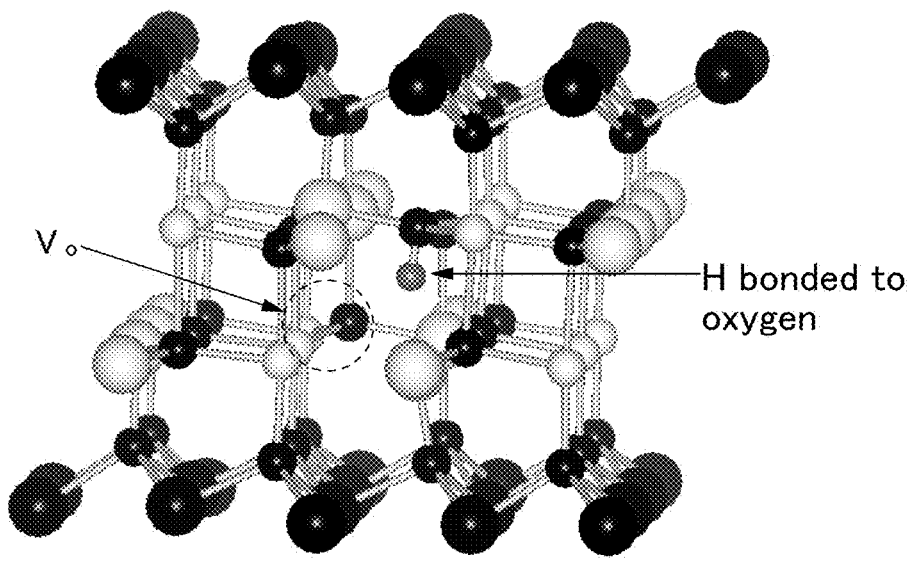
Figure 44:
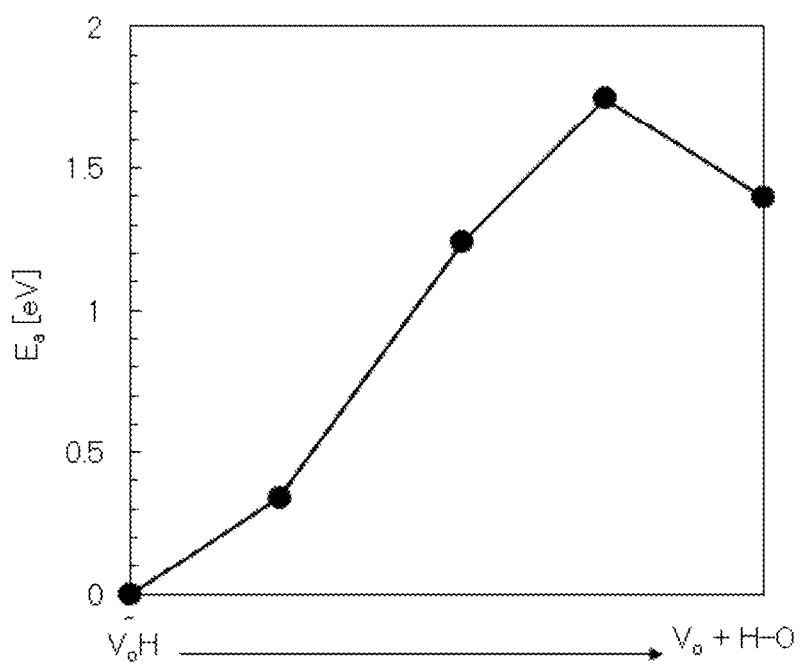
FIG. 44 shows an activation barrier.

FIG. 43A shows a model in the initial state and FIG. 43B shows a model in the final state. FIG. 44 shows the calculated activation barrier (E$_a$) in the initial state and the final state. Note that here, the initial state refers to a state in which H exists in an oxygen vacancy V$_o$ (V$_o$H), and the final state refers to a structure including an oxygen vacancy V$_o$ and a state in which H is bonded to oxygen bonded to one Ga atom and two Zn atoms (H—O).

From the calculation results, bonding of H in an oxygen vacancy V$_o$ to another oxygen atom needs an energy of approximately 1.75 eV, while entry of H bonded to O in an oxygen vacancy V$_o$ needs an energy of approximately 0.35 eV.

Reaction frequency (Γ) was calculated with use of the activation barriers (E$_a$) obtained by the calculation and Formula 2.

The reaction frequency at 350° C. was calculated on the assumption that the frequency factor $\nu=10^{13}$ [1/sec]. The frequency of H transfer from the model shown in FIG. 43A to the model shown in FIG. 43B was 7.53×10$^{-2}$ [1/sec], whereas the frequency of H transfer from the model shown in FIG. 43B to the model shown in FIG. 43A was 1.44×10$^{10}$ [1/sec]. This suggests that H is unlikely to be released from the oxygen vacancy V$_o$ once V$_o$H is formed.

From the above results, it was found that H in IGZO easily diffused in annealing and if an oxygen vacancy V$_o$ existed, H was likely to enter the oxygen vacancy V$_o$ to be V$_o$H.

<(2) Transition Level of V$_o$H>

The calculation by the NEB method, which was described in <(1) Ease of formation and stability of V$_o$H>, indicates that in the case where an oxygen vacancy V$_o$ and H exist in IGZO, the oxygen vacancy V$_o$ and H easily form V$_o$H and V$_o$H is stable. To determine whether V$_o$H is related to a carrier trap, the transition level of V$_o$H was calculated.

The model used for calculation is the InGaZnO$_4$ crystal model (112 atoms) shown in FIG. 40. V$_o$H models of the oxygen sites 1 and 2 shown in FIG. 40 were made to calculate the transition levels. The calculation conditions are shown in Table 3.

TABLE 3

| Software | VASP |
|---|---|
| Model | InGaZnO$_4$ crystal (112 atoms) |
| Functional | HSE06 |
| Ratio of exchange terms | 0.25 |
| Pseudopotential | GGA-PBE |
| Cut-off energy | 800 eV |
| Sampling point k | 1 × 1 × 1 |

The ratio of exchange terms was adjusted to have a band gap close to the experimental value. As a result, the band gap of the InGaZnO$_4$ crystal model without defects was 3.08 eV that was close to the experimental value, 3.15 eV.

The transition level (∈(q/q')) of a model having defect D can be calculated by the following Formula 3. Note that ΔE(D$^q$) represents the formation energy of defect D at charge q, which is calculated by Formula 4.

$$\varepsilon(q/q') = \frac{\Delta E(D^q) - \Delta E(D^{q'})}{q' - q} \quad \text{[Formula 3]}$$

$$\Delta E(D^q) = \quad \text{[Formula 4]}$$
$$E_{tot}(D^q) - E_{tot}(\text{bulk}) + \sum_i \Delta n_i \mu_i + q(\varepsilon_{VBM} + \Delta V_q + E_F)$$

In Formulae 3 and 4, E$_{tot}$(D$^q$) represents the total energy of the model having defect D at the charge q in, E$_{tot}$(bulk) represents the total energy in a model without defects (complete crystal), Δn$_i$ represents a change in the number of atoms i contributing to defects, μ$_i$ represents the chemical potential of atom i, ∈$_{VBM}$ represents the energy of the valence band maximum in the model without defects, ΔV$_q$ represents the correction term relating to the electrostatic potential, and $E_F$ represents the Fermi energy.

Figure 45:
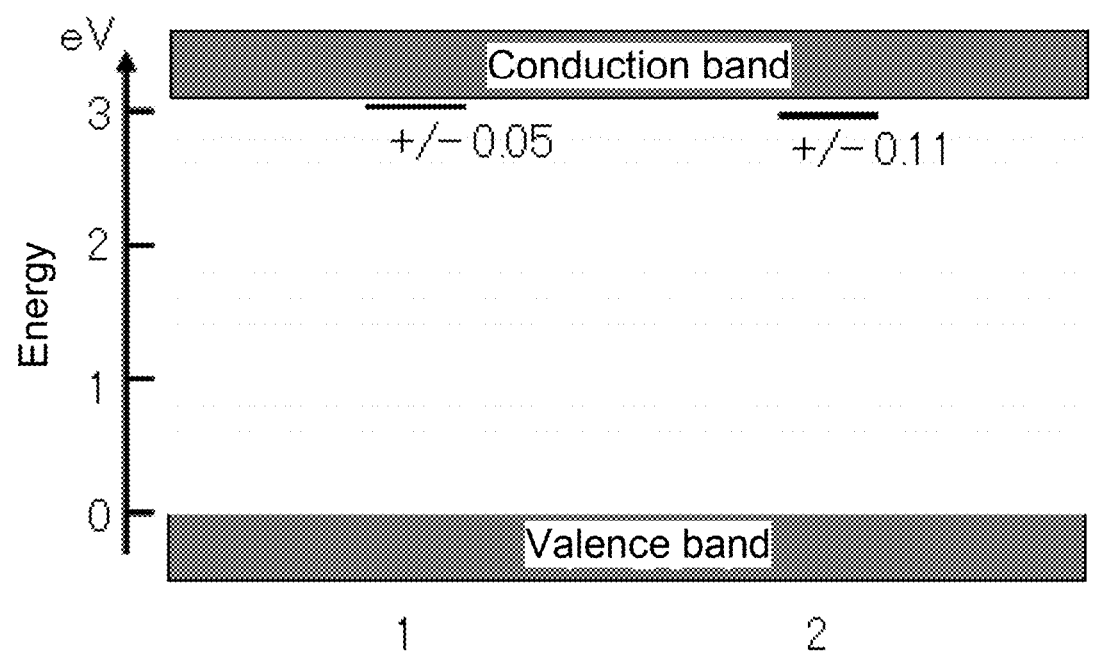
FIG. 45 shows the transition levels of VoH.

FIG. 45 shows the transition levels of $V_oH$ obtained from the above formulae. The numbers in FIG. 45 represent the depth from the conduction band minimum. In FIG. 45, the transition level of $V_oH$ in the oxygen site 1 is at 0.05 eV from the conduction band minimum, and the transition level of $V_oH$ in the oxygen site 2 is at 0.11 eV from the conduction band minimum. Therefore, these $V_oH$ seems to be related to electron traps, that is, $V_oH$ seems to behave as a donor. Furthermore, IGZO including $V_oH$ has conductivity.

Note that this embodiment can be combined with other embodiment in this specification as appropriate.

Embodiment 13

<Deposition Model>

Examples of deposition models of a CAAC-OS and nc-OS are described below.

Figure 46A:
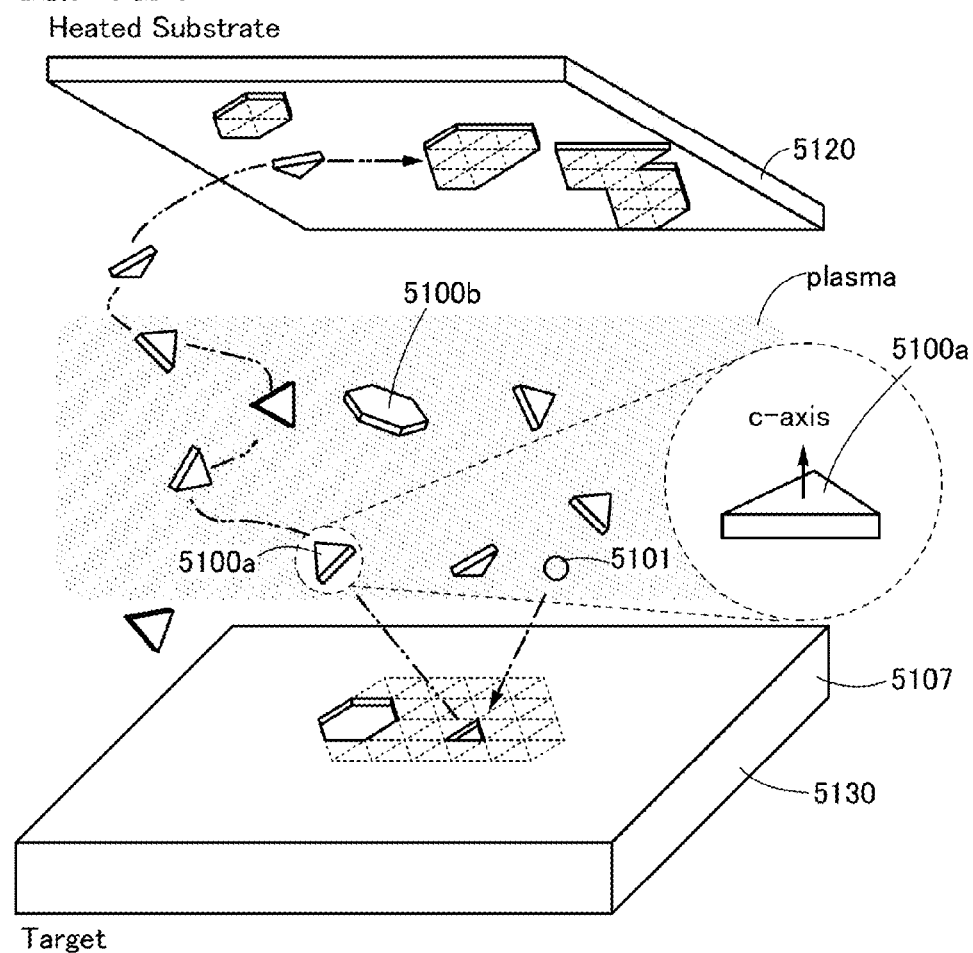
FIG. 46A schematically illustrates a CAAC-OS deposition model.

FIG. 46A is a schematic diagram of a deposition chamber illustrating a state where the CAAC-OS film is formed by a sputtering method.

A target 5130 is attached to a backing plate. Under the target 5130 and the backing plate, a plurality of magnets are provided. The plurality of magnets cause a magnetic field over the target 5130. A sputtering method in which the disposition speed is increased by utilizing a magnetic field of magnets is referred to as a magnetron sputtering method.

The target 5130 has a polycrystalline structure in which a cleavage plane exists in at least one crystal grain. Note that the details of the cleavage plane are described later.

A substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and controlled to higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. Note that the magnetic field over the target 5130 forms a high-density plasma region. In the high-density plasma region, the deposition gas is ionized, so that an ion 5101 is generated. Examples of the ion 5101 include an oxygen cation ($O^+$) and an argon cation ($Ar^+$).

The ion 5101 is accelerated to the target 5130 side by an electric field, and collides with the target 5130 eventually. At this time, a pellet 5100a and a pellet 5100b which are flat-plate-like or pellet-like sputtered particles are separated and sputtered from the cleavage plane. Note that structures of the pellet 5100a and the pellet 5100b may be distorted by an impact of collision of the ion 5101.

The pellet 5100a is a flat-plate-like or pellet-like sputtered particle having a triangle plane, e.g., a regular triangle plane. The pellet 5100b is a flat-plate-like or pellet-like sputtered particle having a hexagon plane, e.g., regular hexagon plane. Note that flat-plate-like or pellet-like sputtered particles such as the pellet 5100a and the pellet 5100b are collectively called pellets 5100. The shape of a flat plane of the pellet 5100 is not limited to a triangle or a hexagon. For example, the flat plane may have a shape formed by combining greater than or equal to 2 and less than or equal to 6 triangles. For example, a square (rhombus) is formed by combining two triangles (regular triangles) in some cases.

The thickness of the pellet 5100 is determined depending on the kind of the deposition gas and the like. The thicknesses of the pellets 5100 are preferably uniform; the reasons thereof are described later. In addition, the sputtered particle preferably has a pellet shape with a small thickness as compared to a dice shape with a large thickness.

Figure 48:
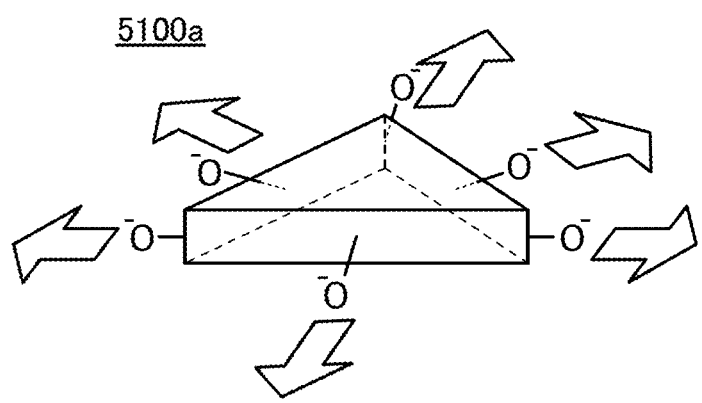
FIG. 48 illustrates a pellet.

The pellet 5100 receives charge when passing through the plasma, so that side surfaces of the pellet 5100 are negatively or positively charged in some cases. The pellet 5100 includes an oxygen atom on its side surface, and the oxygen atom may be negatively charged. For example, a case in which the pellet 5100a includes, on its side surfaces, oxygen atoms that are negatively charged is illustrated in FIG. 48. As in this view, when the side surfaces are charged in the same polarity, charges repel each other, and accordingly, the pellet can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, and a zinc atom is negatively charged.

Figure 49:
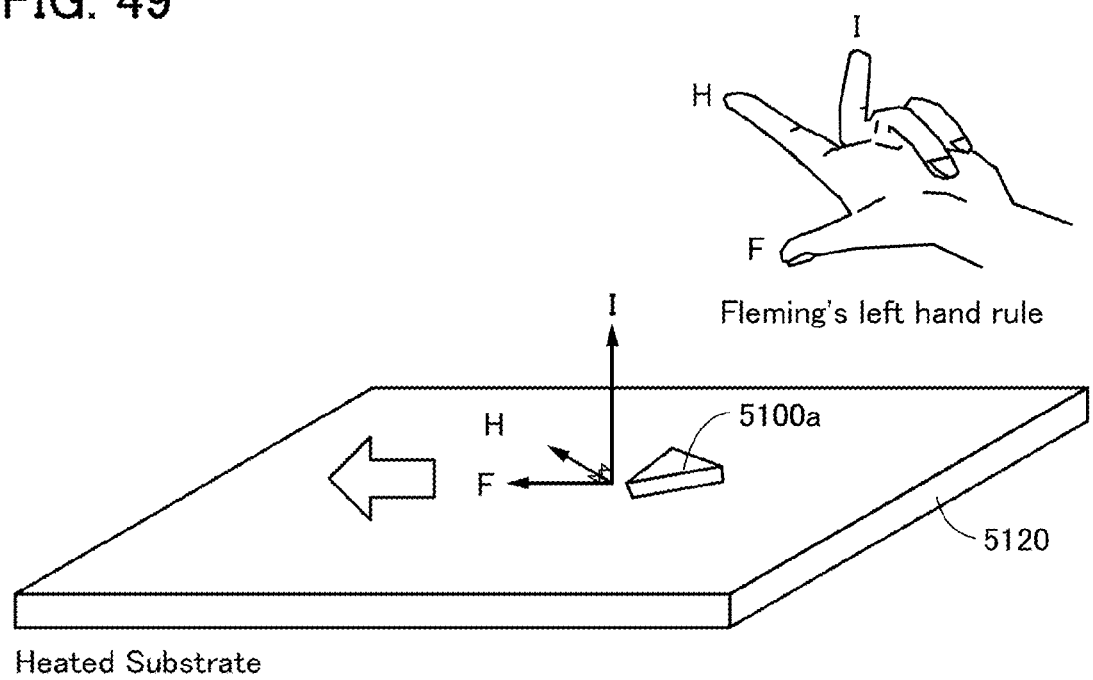
FIG. 49 illustrates force applied to a pellet on a formation surface.

As shown in FIG. 46A, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field is generated in a direction parallel to a top surface of the substrate 5120. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current (see FIG. 49). This is explainable with Fleming's left-hand rule. In order to increase a force applied to the pellet 5100, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate is 1.5 times or higher, preferably twice or higher, further preferably 3 times or higher, still further preferably 5 times or higher as high as the magnetic field in a direction perpendicular to the top surface of the substrate 5120.

Figure 50A:
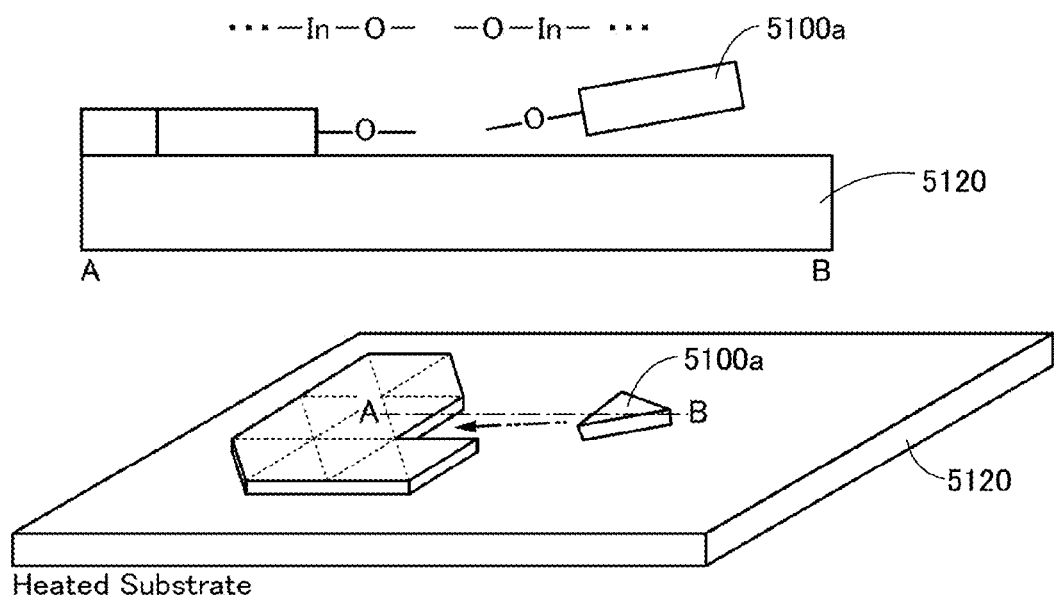
FIGS. 50A and 50B illustrate movement of a pellet on a formation surface.
Figure 50B:
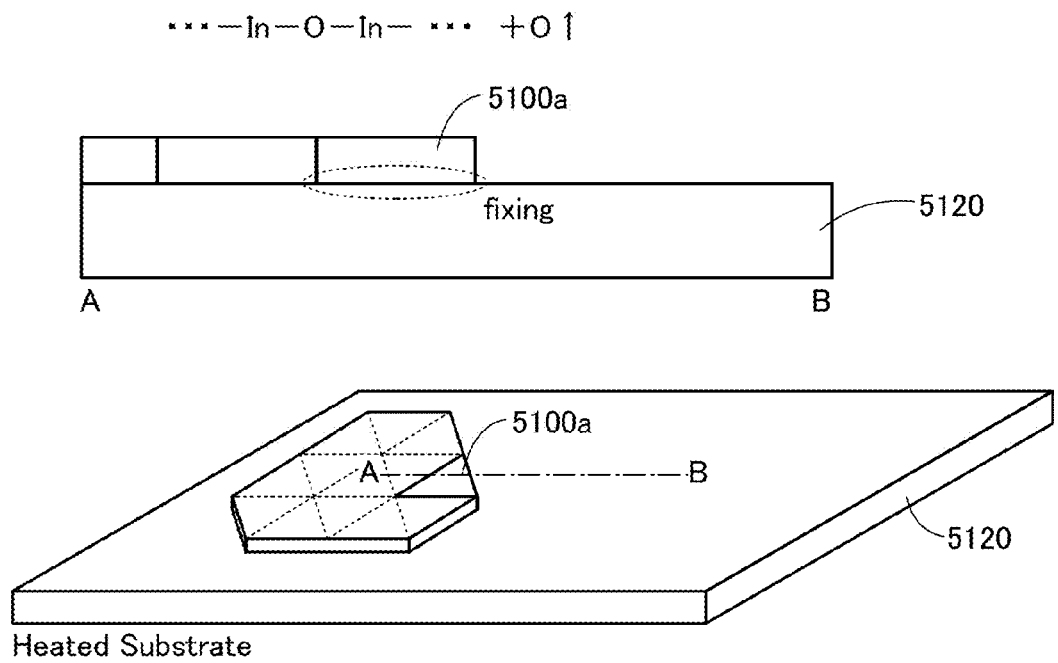

Furthermore, the substrate 5120 is heated, and resistance such as friction between the pellet 5100 and the substrate 5120 is low. As a result, as illustrated in FIG. 50A, the pellet 5100 glides above the surface of the substrate 5120. The glide of the pellet 5100 is caused in a state where the flat plane faces the substrate 5120. Then, as illustrated in FIG. 50B, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS is filled in some cases; thus, the CAAC-OS has a low density of defect states.

Further, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented. Further, the space is filled with elastic metal atoms and the like, whereby the elastic metal atoms have a function, like a highway, of jointing side surfaces of the pellets 5100 which are not aligned with each other.

It is considered that as shown in such a model, the pellets 5100 are deposited over the substrate 5120. Thus, a CAAC-OS film can be deposited even when a surface over which a film is formed (film formation surface) does not have a crystal structure, which is different from film deposition by epitaxial growth. For example, even when a surface (film formation surface) of the substrate 5120 has an amorphous structure, a CAAC-OS film can be formed.

Figure 46B:
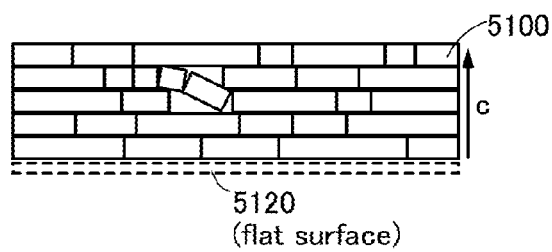
FIGS. 46B and 46C are cross-sectional views of pellets and a CAAC-OS.

Further, it is found that in formation of the CAAC-OS, the pellets 5100 are arranged in accordance with a surface shape of the substrate 5120 that is the film formation surface even when the film formation surface has unevenness besides a flat surface. For example, in the case where the surface of the substrate 5120 is flat at the atomic level, the pellets 5100 are arranged so that flat planes parallel to the a-b plane face downwards; thus, a layer with a uniform thickness, flatness, and high crystallinity is formed. By stacking n layers (n is a natural number), the CAAC-OS can be obtained (see FIG. 46B).

Figure 46C:
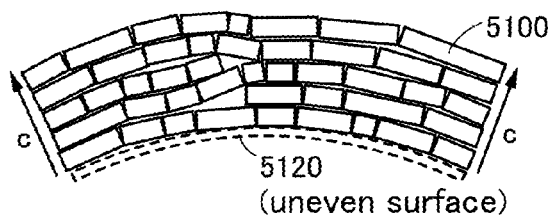

In the case where the top surface of the substrate 5120 has unevenness, a CAAC-OS where n layers (n is a natural number) in each of which the pellets 5100 are arranged along a convex surface are stacked is formed. Since the substrate 5120 has unevenness, a gap is easily generated between in the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be formed (see FIG. 46C).

As a result, laser crystallization is not needed for formation of a CAAC-OS, and a uniform film can be formed even over a large-sized glass substrate.

Since the CAAC-OS film is deposited in accordance with such a model, the sputtered particle preferably has a pellet shape with a small thickness. Note that in the case where the sputtered particle has a dice shape with a large thickness, planes facing the substrate 5120 are not uniform and thus, the thickness and the orientation of the crystals cannot be uniform in some cases.

According to the deposition model described above, a CAAC-OS with high crystallinity can be formed even on a film formation surface with an amorphous structure.

Further, formation of a CAAC-OS can be described with a deposition model including a zinc oxide particle besides the pellet 5100.

The zinc oxide particle reaches the substrate 5120 before the pellet 5100 does because the zinc oxide particle is smaller than the pellet 5100 in mass. On the surface of the substrate 5120, crystal growth of the zinc oxide particle preferentially occurs in the horizontal direction, so that a thin zinc oxide layer is formed. The zinc oxide layer has c-axis alignment. Note that c-axes of crystals in the zinc oxide layer are aligned in the direction parallel to a normal vector of the substrate 5120. The zinc oxide layer serves as a seed layer that makes a CAAC-OS grow and thus has a function of increasing crystallinity of the CAAC-OS. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, a grain boundary is hardly observed.

Thus, in order to deposit a CAAC-OS with high crystallinity, a target containing zinc at a proportion higher than that of the stoichiometric composition is preferably used.

Figure 47:
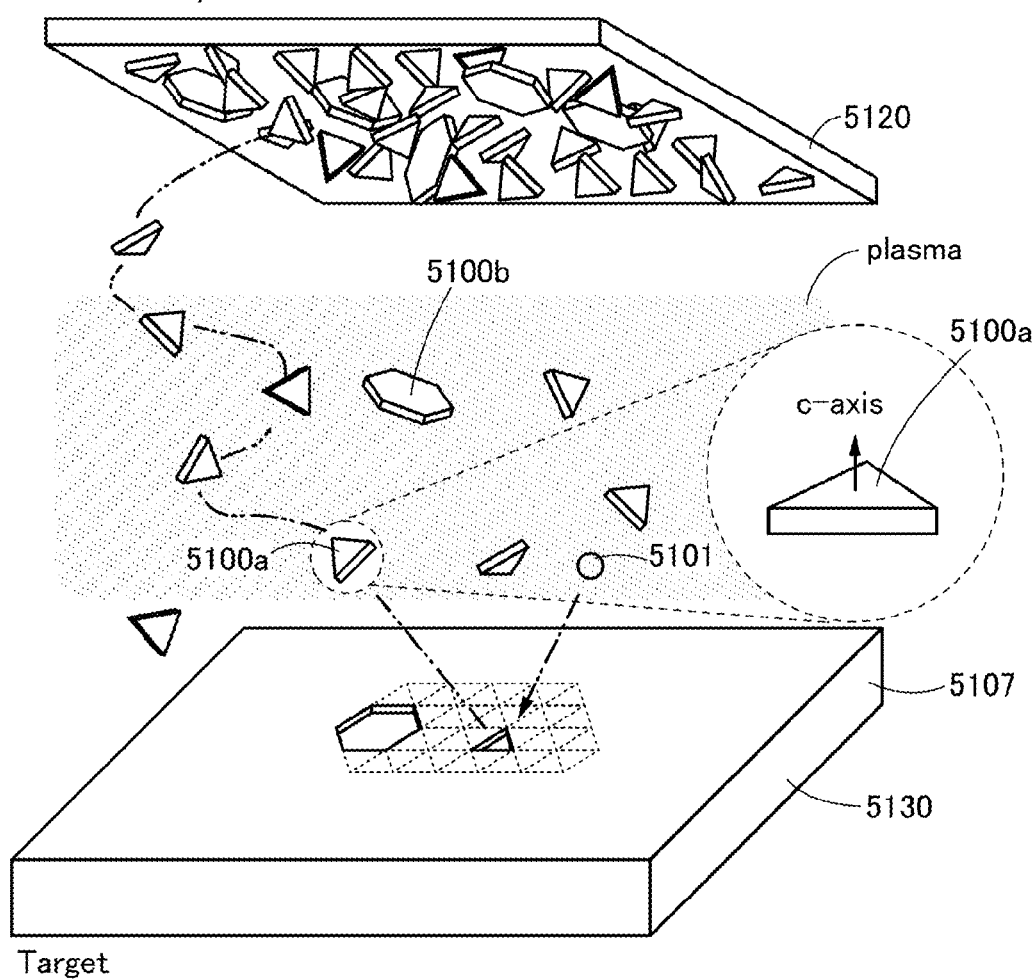
FIG. 47 schematically illustrates a deposition model of an nc-OS and a pellet.

An nc-OS can be understood with a deposition model illustrated in FIG. 47. Note that a difference between FIG. 47 and FIG. 46A lies only in the fact that whether the substrate 5120 is heated or not.

Thus, the substrate 5120 is not heated, and a resistance such as friction between the pellet 5100 and the substrate 5120 is high. As a result, the pellets 5100 cannot glide on the surface of the substrate 5120 and are stacked randomly, thereby forming an nc-OS.

<Cleavage Plane>

A cleavage plane that has been mentioned in the deposition model of the CAAC-OS will be described below.

Figure 51A:
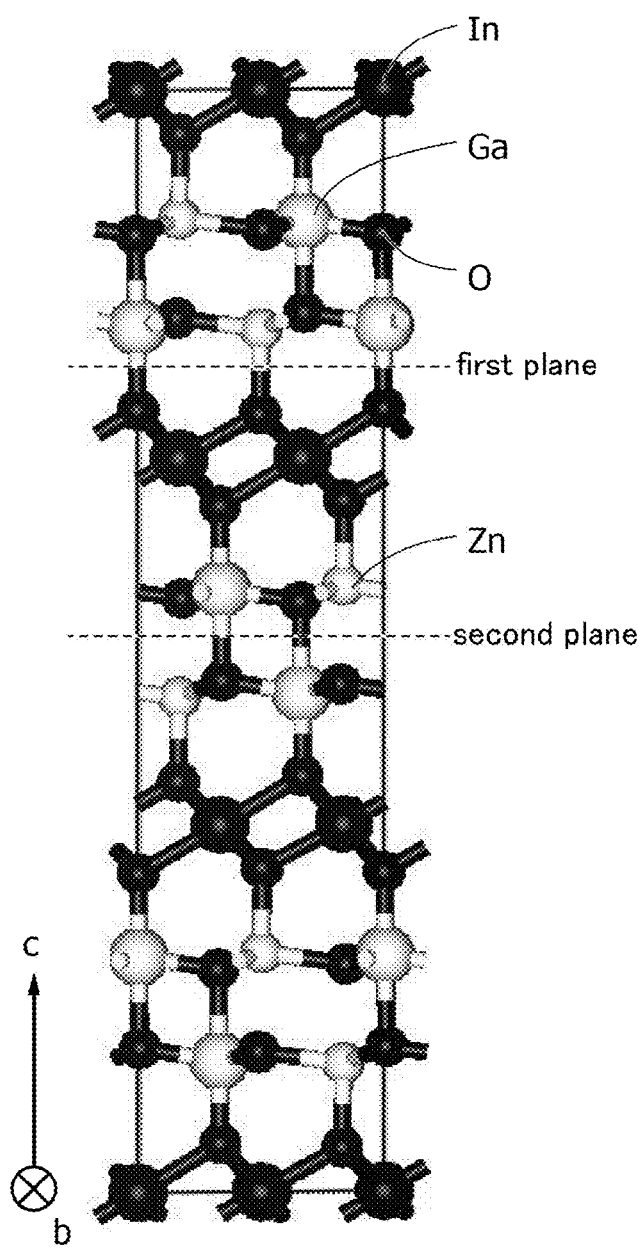
FIGS. 51A and 51B show an InGaZnO$_4$ crystal.
Figure 51B:
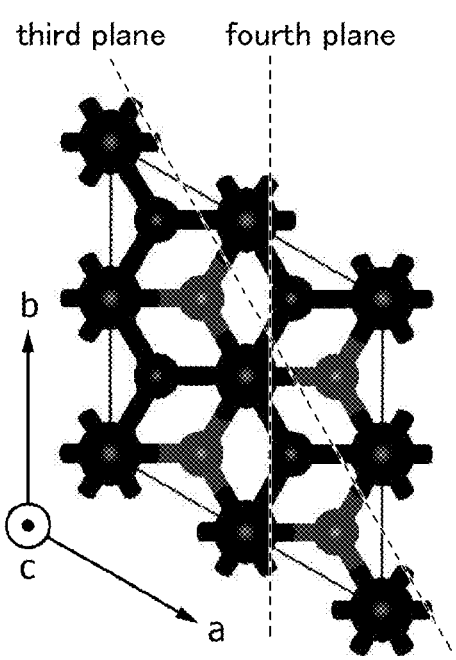

First, a cleavage plane of the target is described with reference to FIGS. 51A and 51B. FIGS. 51A and 51B show the crystal structure of $InGaZnO_4$. Note that FIG. 51A shows the structure of the case where an $InGaZnO_4$ crystal is observed from a direction parallel to the b-axis when the c-axis is in an upward direction. Furthermore, FIG. 51B shows the structure of the case where the $InGaZnO_4$ crystal is observed from a direction parallel to the c-axis.

Energy needed for cleavage at each of crystal planes of the $InGaZnO_4$ crystal is calculated by the first principles calculation. Note that a "pseudopotential" and density functional theory program (CASTEP) using the plane wave basis are used for the calculation. Note that an ultrasoft type pseudopotential is used as the pseudopotential. Further, GGA/PBE is used as the functional. Cut-off energy is 400 eV.

Energy of a structure in an initial state is obtained after structural optimization including a cell size is performed. Further, energy of a structure after the cleavage at each plane is obtained after structural optimization of atomic arrangement is performed in a state where the cell size is fixed.

On the basis of the structure of the $InGaZnO_4$ crystal in FIGS. 51A and 51B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 51A). The second plane is a crystal plane between a Ga—Zn—O layer and a Ga—Zn—O layer and is parallel to the (001) plane (or the a-b plane) (see FIG. 51A). The third plane is a crystal plane parallel to the (110) plane (see FIG. 51B). The fourth plane is a crystal plane parallel to the (100) plane (or the b-c plane) (see FIG. 51B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure indicates energy obtained in such a manner that electronic kinetic energy of electrons included in the structure and interactions between atoms included in the structure, between the atom and the electron, and between the electrons are considered.

As calculation results, the cleavage energy of the first plane was 2.60 $J/m^2$, that of the second plane was 0.68 $J/m^2$, that of the third plane was 2.18 $J/m^2$, and that of the fourth plane was 2.12 $J/m^2$ (see Table 1).

TABLE 4

| | Cleavage energy [J/m$^2$] |
|---|---|
| First plane | 2.6 |
| Second plane | 0.68 |
| Third plane | 2.18 |
| Fourth plane | 2.12 |

From the calculations, in the structure of the InGaZnO$_4$ crystal in FIGS. 51A and 51B, the cleavage energy of the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between the Ga—Zn—O layer and the Ga—Zn—O layer, the InGaZnO$_4$ crystals in FIG. 51A can be separated at a plane equivalent to two second planes. Therefore, in the case where an ion or the like is made to collide with a target, a wafer-like unit (we call this a pellet) which is cleaved at a plane with the lowest cleavage energy is thought to be blasted off as the minimum unit. In that case, a pellet of InGaZnO$_4$ includes three layers: a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and plane that is parallel to the (001) plane (or the a-b plane)), which suggests that most of the flat planes of the pellets have triangle shapes or hexagonal shapes.

Figure 52A:
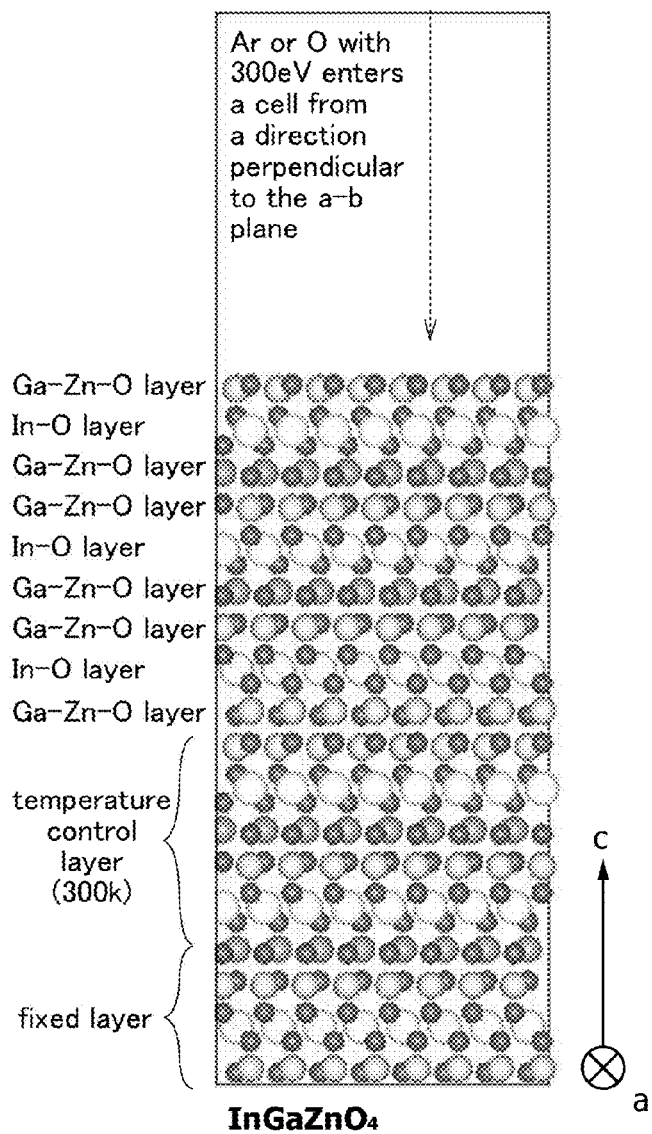
Figure 52B:
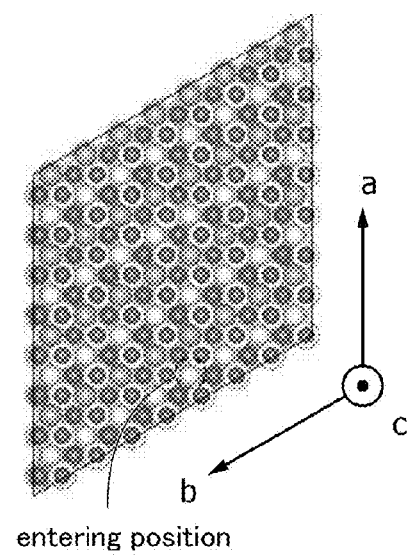

Next, through classical molecular dynamics calculation, on the assumption of an InGaZnO$_4$ crystal having a homologous structure as a target, a cleavage plane in the case where the target is sputtered using argon (Ar) or oxygen (O) is examined. FIG. 52A shows a cross-sectional structure of an InGaZnO$_4$ crystal (2688 atoms) used for the calculation, and FIG. 52B shows a top structure thereof. Note that a fixed layer in FIG. 52A prevents the positions of the atoms from moving. A temperature control layer in FIG. 52A is a layer whose temperature is constantly set to fixed temperature (300 K).

For the classical molecular dynamics calculation, Materials Explorer 5.0 manufactured by Fujitsu Limited. is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the InGaZnO$_4$ crystal under the above-mentioned conditions.

FIG. 53A shows atomic order when 99.9 picoseconds have passed after argon enters the cell including the InGaZnO$_4$ crystal in FIGS. 52A and 52B. FIG. 53B shows atomic order when 99.9 picoseconds have passed after oxygen enters the cell. Note that in FIGS. 53A and 53B, part of the fixed layer in FIG. 52A is omitted.

According to FIG. 53A, in a period from entry of argon into the cell to when 99.9 picoseconds have passed, a crack is formed from the cleavage plane corresponding to the second plane in FIG. 51A. Thus, in the case where argon collides with the InGaZnO$_4$ crystal and the uppermost surface is the second plane (the zero-th), a large crack is found to be formed in the second plane (the second).

On the other hand, according to FIG. 53B, in a period from entry of oxygen into the cell to when 99.9 picoseconds have passed, a crack is found to be formed from the cleavage plane corresponding to the second plane in FIG. 51A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, difference in size of the pellet depending on atoms which are made to collide is studied.

Figure 54A:
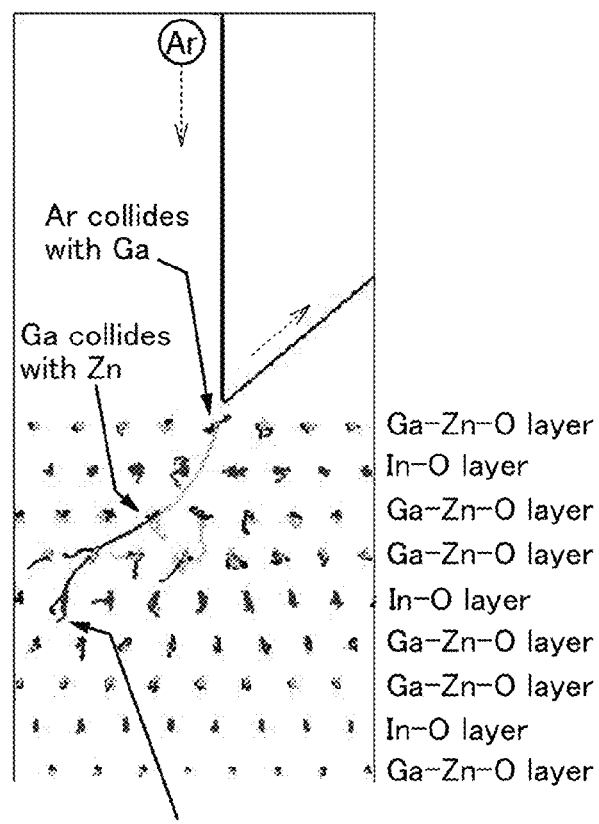
FIGS. 54A and 54B show trajectories of atoms after collision of an atom.

FIG. 54A shows trajectories of the atoms from 0 picosecond to 0.3 picoseconds after argon enters the cell including the InGaZnO$_4$ crystal in FIGS. 52A and 52B. Accordingly, FIG. 54A corresponds to a period from FIGS. 52A and 52B to FIG. 53A.

According to FIG. 54A, when argon collides with gallium (Ga) of the first layer (Ga—Zn—O layer), gallium collides with zinc (Zn) of the third layer (Ga—Zn—O layer) and then, zinc reaches the vicinity of the sixth layer (Ga—Zn—O layer). Note that the argon which collides with the gallium is sputtered to the outside. Accordingly, in the case where argon collides with the target including the InGaZnO$_4$ crystal, a crack is thought to be formed in the second plane (the second) in FIG. 52A.

Figure 54B:
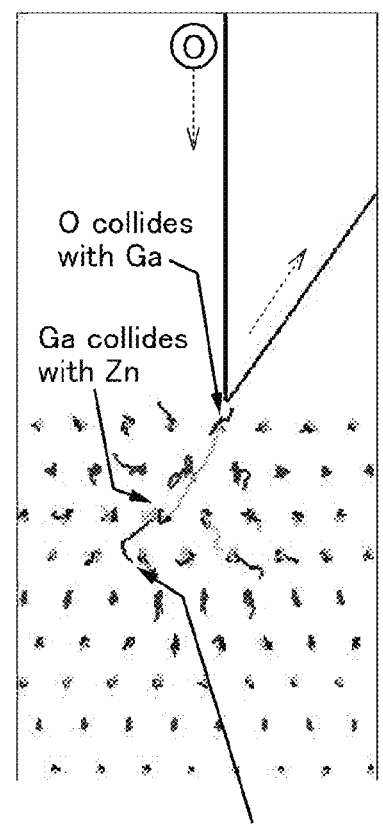

FIG. 54B shows trajectories of the atoms from 0 picosecond to 0.3 picoseconds after oxygen enters the cell including the InGaZnO$_4$ crystal in FIGS. 52A and 52B. Accordingly, FIG. 54B corresponds to a period from FIGS. 52A and 52B to FIG. 53A.

On the other hand, according to FIG. 54B, when oxygen collides with gallium (Ga) of the first layer (Ga—Zn—O layer), gallium collides with zinc (Zn) of the third layer (Ga—Zn—O layer) and then, zinc does not reach the fifth layer (In—O layer). Note that the oxygen which collides with the gallium is sputtered to the outside. Accordingly, in the case where oxygen collides with the target including the InGaZnO$_4$ crystal, a crack is thought to be formed in the second plane (the first) in FIG. 52A.

This calculation also shows that the InGaZnO$_4$ crystal with which an atom (ion) collides is separated from the cleavage plane.

In addition, a difference in depth of a crack is examined in view of conservation laws. The energy conservation law and the law of conservation of momentum can be represented by the following Formula 5 and the following Formula 6. Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

$$E = \frac{1}{2}m_A v_A^2 + \frac{1}{2}m_{Ga} v_{Ga}^2 \quad \text{[Formula 5]}$$

$$m_A v_A + m_{Ga} v_{Ga} = m_A v'_A + m_{Ga} v'_{Ga} \quad \text{[Formula 6]}$$

On the assumption that collision of argon or oxygen is elastic collision, the relationship among $v_A$, $v'_A$, $v_{Ga}$, and $v'_{Ga}$ can be represented by the following Formula 7.

$$v'_A - v'_{Ga} = -(v_A - v_{Ga}) \quad \text{[Formula 7]}$$

From the formulae 4, 5, and 6, on the assumption that $v_{Ga}$ is 0, the speed of gallium $v'_{Ga}$ after collision of argon or oxygen can be represented by the following Formula 8.

$$v'_{Ga} = \frac{\sqrt{m_A}}{m_A + m_{Ga}} \cdot 2\sqrt{2E} \quad \text{[Formula 8]}$$

In Formula 8, mass of argon or oxygen is substituted into $m_A$, whereby the speeds after collision of the atoms are compared. In the case where the argon and the oxygen have the same energy before collision, the speed of gallium in the case where argon collides with the gallium was found to be 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium is found to be higher than that in the case where oxygen collides with the gallium. Accordingly, it is considered that a crack is formed at a deeper position in the case where argon collides with the gallium than in the case where oxygen collides with the gallium.

The above calculation shows that when sputtering is performed using a target including the InGaZnO$_4$ crystal having a homologous structure, separation occurs from the cleavage plane to form a pellet. On the other hand, even when sputtering is performed on a region having another structure of a target without the cleavage plane, a pellet is not formed, and a sputtered particle with an atomic-level size which is minuter than a pellet is formed. Because the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. The model illustrated in FIG. 46A where sputtered pellets are deposited to form a CAAC-OS is a reasonable model.

The CAAC-OS deposited in such a manner has a density substantially equal to that of a single crystal OS. For example, the density of the single crystal OS film having a homologous structure of InGaZnO$_4$ is 6.36 g/cm$^3$, and the density of the CAAC-OS film having substantially the same atomic ratio is approximately 6.3 g/cm$^3$.

Figure 55A:
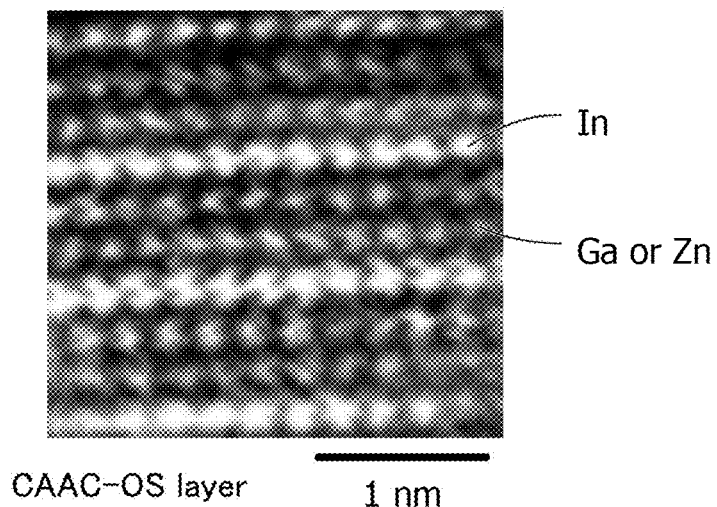
FIGS. 55A and 55B are cross-sectional HAADF-STEM images of a CAAC-OS and a target.
Figure 55B:
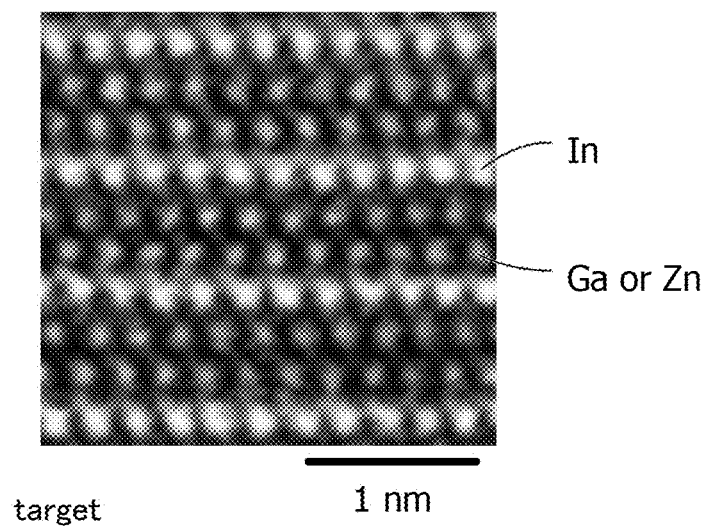

FIGS. 55A and 55B show atomic order of cross sections of an In—Ga—Zn oxide (see FIG. 55A) that is a CAAC-OS deposited by sputtering and a target thereof (see FIG. 55B). For observation of atomic arrangement, a high-angle annular dark field scanning transmission electron microscopy (HAADF-STEM) is used. In the case of observation by HAADF-STEM, the intensity of an image of each atom is proportional to the square of its atomic number. Therefore, Zn (atomic number: 30) and Ga (atomic number: 31), whose atomic numbers are close to each other, are hardly distinguished from each other. A Hitachi scanning transmission electron microscope HD-2700 is used for the HAADF-STEM.

When FIG. 55A and FIG. 55B are compared, it is found that the CAAC-OS and the target each have a homologous structure and atomic order in the CAAC-OS correspond to that in the target. Thus, as illustrated in the deposition model in FIG. 46A, the crystal structure of the target is transferred, whereby a CAAC-OS is formed.

This embodiment can be combined as appropriate with any of the other embodiments in this specification.

Embodiment 14

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 56A to 56F illustrate specific examples of these electronic devices.

Figure 56A:
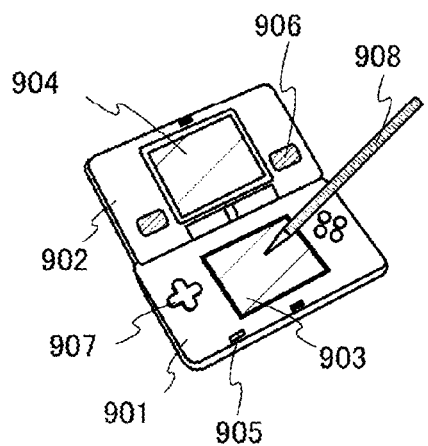
FIGS. 56A to 56F each illustrate an example of an electronic device.

FIG. 56A illustrates a portable game console including a housing 901, a housing 902, a display portion 903, a display portion 904, a microphone 905, a speaker 906, an operation key 907, a stylus 908, and the like. Although the portable game machine in FIG. 46A has the two display portions 903 and 904, the number of display portions included in a portable game machine is not limited to this.

Figure 56B:
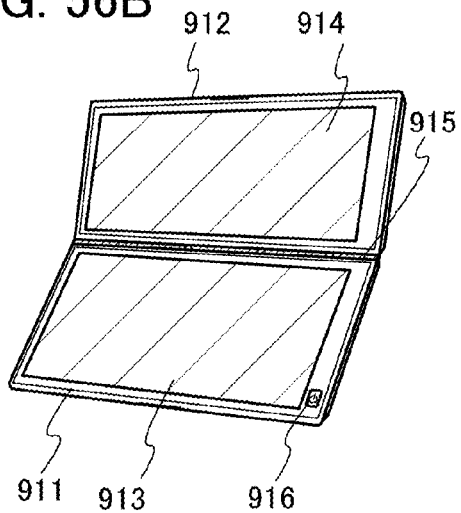

FIG. 56B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 56C:
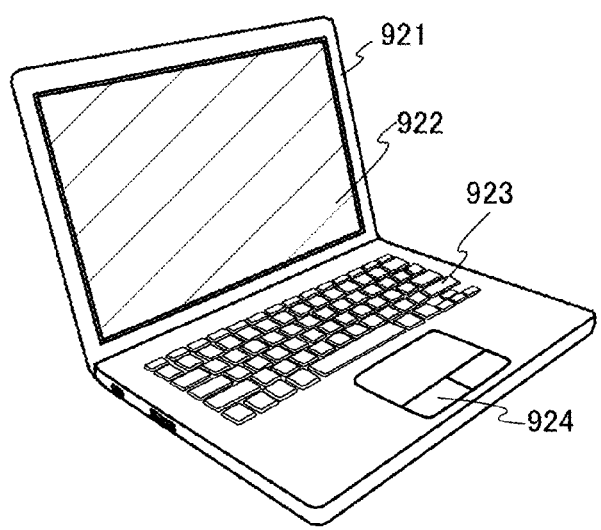

FIG. 56C illustrates a laptop personal computer, which includes a housing 921, a display portion 922, a keyboard 923, a pointing device 924, and the like.

Figure 56D:
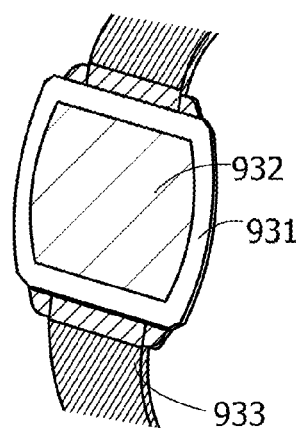

FIG. 56D illustrates a wrist-watch-type information terminal, which includes a housing 931, a display portion 932, a wristband 933, and the like. The display portion 932 may be a touch panel.

Figure 56E:
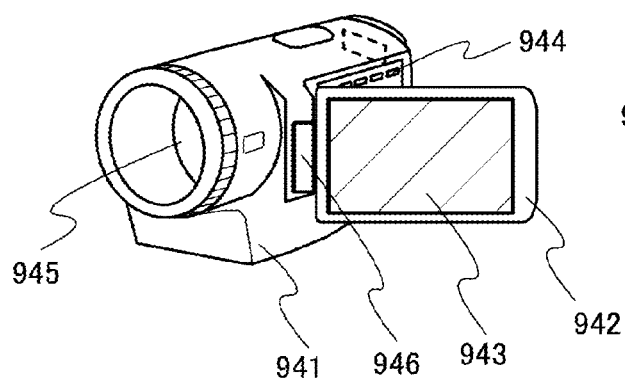

FIG. 56E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 56F:
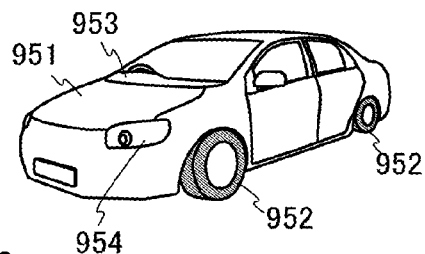

FIG. 56F illustrates an ordinary vehicle including a car body 951, wheels 952, a dashboard 953, lights 954, and the like.

This embodiment can be combined with any of the other embodiments described in this specification as appropriate.

Embodiment 15

In this embodiment, application examples of an RF tag of one embodiment of the present invention will be described with reference to FIGS. 57A to 57F. The RF tag is widely used and can be provided for, for example, products such as bills, coins, securities, bearer bonds, documents (e.g., driver's licenses or resident's cards, see FIG. 57A), vehicles (e.g., bicycles, see FIG. 57B), packaging containers (e.g., wrapping paper or bottles, see FIG. 57C), recording media (e.g., DVD or video tapes, see FIG. 57D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 57E and 57F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

This embodiment can be combined with any of the other embodiments in this specification as appropriate.

Embodiment 16

In this embodiment, modification examples of the transistor described in the above embodiment will be described with reference to FIGS. 66A to 66F, FIGS. 67A to 67F, and FIGS. 68A to 68E. The transistors illustrated in FIGS. 66A to 66F each includes, over a substrate 821, an oxide semiconductor layer 828 over an insulating layer 824, an insulating layer 837 in contact with the oxide semiconductor layer 828, and a conductive layer 840 in contact with the insulating layer 837 and overlapping the oxide semiconductor layer 828. The insulating layer 837 functions as a gate insulating film. The conductive layer 840 functions as a gate electrode layer.

In addition, the transistors are provided with an insulating layer 846 in contact with the oxide semiconductor layer 828 and an insulating layer 847 in contact with the insulating layer 846. Moreover, conductive layers 856 and 857 in contact with the oxide semiconductor layer 828 through the openings in the insulating layer 846 and the insulating layer 847 are provided. The conductive layers 856 and 857 function as a source electrode layer and a drain electrode layer.

As the structures of the transistor described in this embodiment and the conductive layer and the insulating layer in contact with the structures, the structures of the transistor described in the above embodiment and the conductive layer and the insulating layer in contact with the structures can be used as appropriate.

Figure 66A:
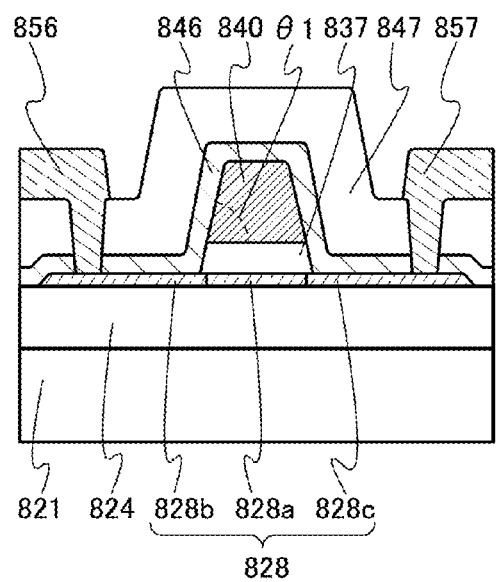
FIGS. 66A to 66F are cross-sectional views each illustrating a transistor.

In the transistor illustrated in FIG. 66A, the oxide semiconductor layer 828 includes a region 828a overlapping the conductive layer 840 and regions 828b and 828c containing an impurity element. The regions 828b and 828c are formed so that the region 828a is sandwiched therebetween. The conductive layers 856 and 857 are in contact with the regions 828b and 828c respectively. The region 828a functions as a channel region. The regions 828b and 828c have lower resistivity than the region 828a and can be referred to as low resistance regions. The regions 828b and 828c function as a source region and a drain region.

Figure 66B:
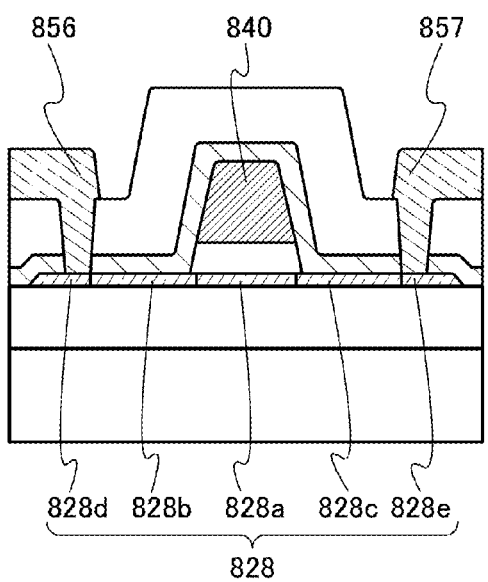

Alternatively, as in the transistor illustrated in FIG. 66B, the oxide semiconductor layer 828 may have a structure in which an impurity element is not added to regions 828d and 828e in contact with the conductive layers 856 and 857. In this case, the regions 828b and 828c containing an impurity element are provided between the region 828a and the regions 828d and 828e in contact with the conductive layers 856 and 857. The regions 828d and 828e have conductivity when the voltage is applied to the conductive layers 856 and 857; thus, the regions 828d and 828e function as a source region and a drain region.

Note that the transistor illustrated in FIG. 66B can be formed in such a manner that after the conductive layers 856 and 857 are formed, an impurity element is added to the oxide semiconductor layer using the conductive layer 840 and the conductive layers 856 and 857 as masks.

An end portion of the conductive layer 840 may have a tapered shape. The angle θ1 formed between a surface where the insulating layer 837 and the conductive layer 840 are in contact with each other and a side surface of the conductive layer 840 may be less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°. When the angle θ1 is less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°, the coverage of the side surfaces of the insulating layer 837 and the conductive layer 840 with the insulating layer 846 can be improved.

Next, modification examples of the regions 828b and 828c are described. FIGS. 66C to 66F are each an enlarged view of the vicinity of the oxide semiconductor layer 828 illustrated in FIG. 66A. The channel length L indicates a distance between a pair of regions containing an impurity element.

Figure 66C:
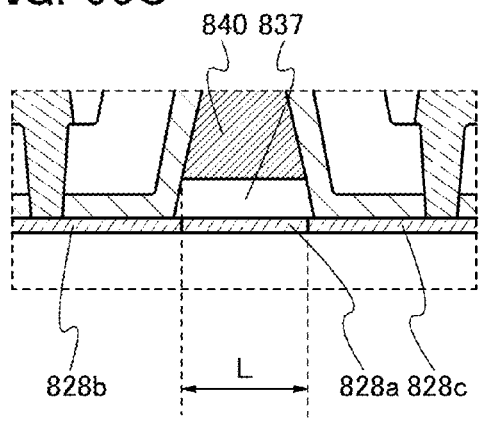

As illustrated in FIG. 66C in a cross-sectional view in the channel length direction, the boundaries between the region 828a and the regions 828b and 828c are aligned or substantially aligned with the end portion of the conductive layer 840 with the insulating layer 837 positioned therebetween. In other words, the boundaries between the region 828a and the regions 828b and 828c are aligned or substantially aligned with the end portion of the conductive layer 840, when seen from the above.

Figure 66D:
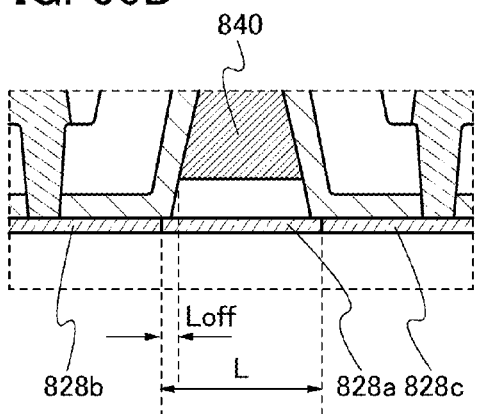

Alternatively, as illustrated in FIG. 66D in a cross-sectional view in the channel length direction, the region 828a has a region that does not overlap the end portion of the conductive layer 840. The region functions as an offset region. The length of the offset region in the channel length direction is referred to as $L_{off}$. Note that when a plurality of offset regions are provided, $L_{off}$ indicates the length of one offset region. $L_{off}$ is included in the channel length L. Note that $L_{off}$ is smaller than 20%, smaller than 10%, smaller than 5%, or smaller than 2% of the channel length L.

Figure 66E:
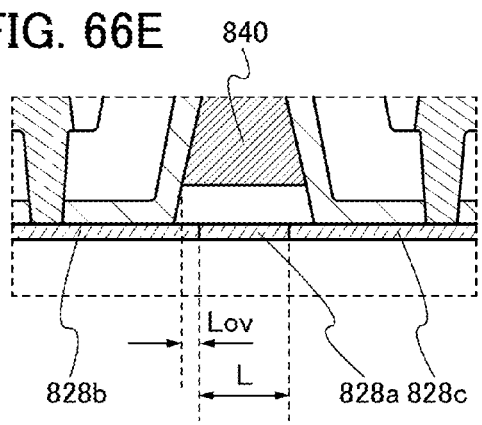

Alternatively, as illustrated in FIG. 66E in a cross-sectional view in the channel length direction, the regions 828b and 828c each have a region overlapping the conductive layer 840 with the insulating layer 837 positioned therebetween. The regions function as an overlap region. The overlap region in the channel length direction is referred to as $L_{ov}$. $L_{ov}$ is smaller than 20%, smaller than 10%, smaller than 5%, or smaller than 2% of the channel length L.

Figure 66F:
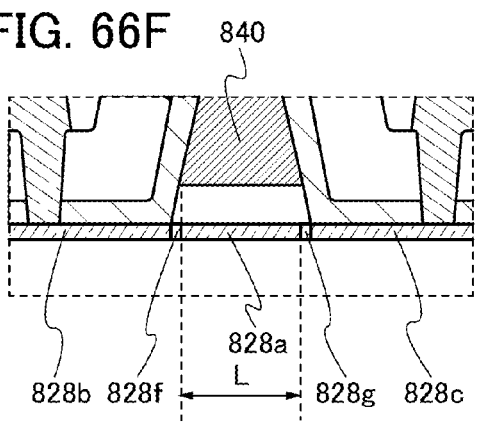

Alternatively, as illustrated in FIG. 66F in a cross-sectional view in the channel length direction, a region 828f is provided between the region 828a and the region 828b, and a region 828g is provided between the region 828a and the region 828c. The regions 828f and 828g have lower concentration of an impurity element and higher resistivity than the regions 828b and 828c. Although the regions 828f and 828g overlap the insulating layer 837 in this case, they may overlap the insulating layer 837 and the conductive layer 840.

Note that in FIGS. 66C to 66F, the transistor illustrated in FIG. 66A is described; however, the transistor illustrated in FIG. 66B can employ any of the structures in FIGS. 66C to 66F as appropriate.

Figure 67A:
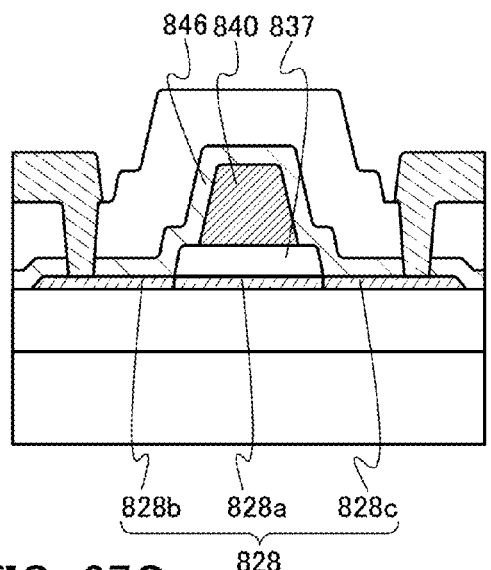
FIGS. 67A to 67F are cross-sectional views each illustrating a transistor.

In the transistor illustrated in FIG. 67A, the end portion of the insulating layer 837 is positioned on an outer side than the end portion of the conductive layer 840. In other words, the insulating layer 837 has a shape such that the end portion extends beyond the end portion of the conductive layer 840. The insulating layer 846 can be kept away from the region 828a; thus, nitrogen, hydrogen, and the like contained in the insulating layer 846 can be prevented from entering the region 828a functioning as a channel region.

Figure 67B:
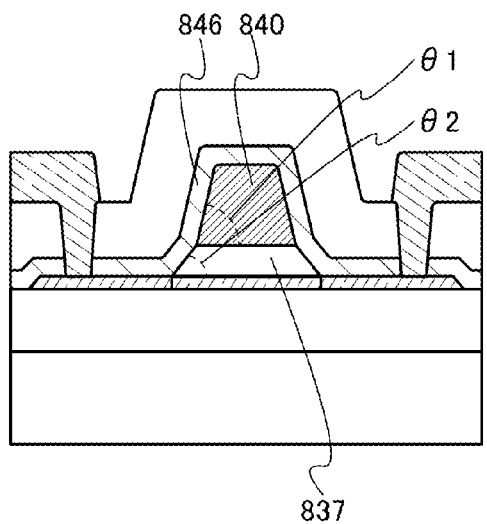

In the transistor illustrated in FIG. 67B, the insulating layer 837 and the conductive layer 840 each have a tapered shape, and the angles of the tapered shapes are different from each other. In other words, the angle θ1 formed between a surface where the insulating layer 837 and the conductive layer 840 are in contact with each other and a side surface of the conductive layer 840 is different from an angle θ2 formed between a surface where the oxide semiconductor layer 828 and the insulating layer 837 are in contact with each other and the side surface of the conductive layer 840. The angle θ2 may be less than 90°, greater than or equal to 30° and less than or equal to 85°, or greater than or equal to 45° and less than or equal to 70°. For example, when the angle θ2 is less than the angle θ1, the coverage with the insulating layer 846 is improved. Alternatively, when the angle θ2 is greater than the angle θ1, the insulating layer 846 can be kept away from the region 828a; thus, nitrogen, hydrogen, or the like contained in the insulating layer 846 can be prevented from entering the region 828a functioning as a channel region.

Next, modification examples of the regions 828b and 828c are described with reference to FIGS. 67C to 67F. Note that FIGS. 67C to 67F are each an enlarged view of the vicinity of the oxide semiconductor layer 828 illustrated in FIG. 67A.

Figure 67C:
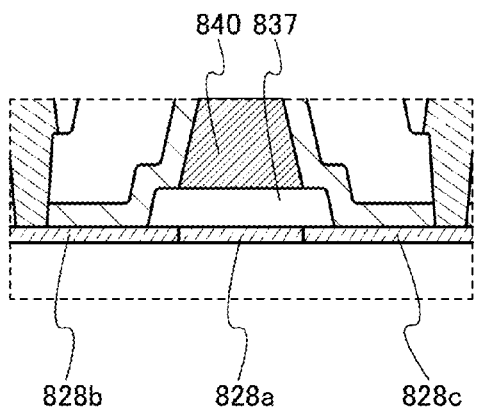

As illustrated in FIG. 67C in a cross-sectional view in the channel length direction, the boundaries between the region 828a and the regions 828b and 828c are aligned or substantially aligned with the end portion of the conductive layer 840 with the insulating layer 837 positioned therebetween. In other words, when seen from the above, the boundaries between the region 828a and the regions 828b and 828c are aligned or substantially aligned with the end portion of the conductive layer 840.

Figure 67D:
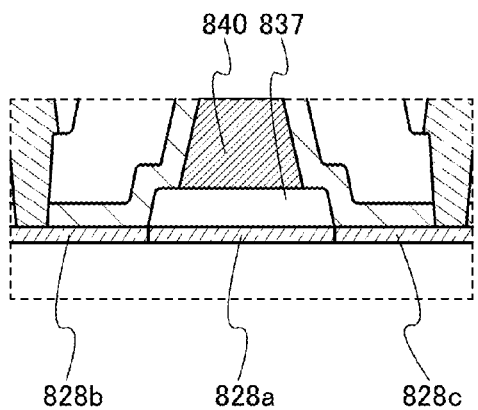

As illustrated in FIG. 67D in a cross-sectional view in the channel length direction, the region 828a has a region that does not overlap the conductive layer 840. The region functions as an offset region. In other words, when seen from the above, the end portions of the regions 828b and 828c are aligned or substantially aligned with the end portion of the insulating layer 837 and do not overlap the end portion of the conductive layer 840.

Figure 67E:
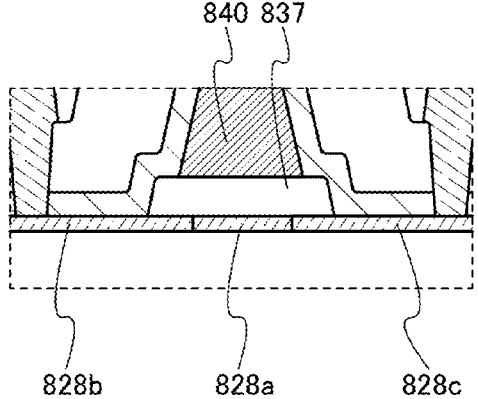

As illustrated in FIG. 67E in a cross-sectional view in the channel length direction, the regions 828b and 828c each have a region overlapping the conductive layer 840 with the insulating layer 837 positioned therebetween. Such a region is referred to as an overlap region. In other words, when seen from the above, the end portions of the regions 828b and 828c overlap the conductive layer 840.

Figure 67F:
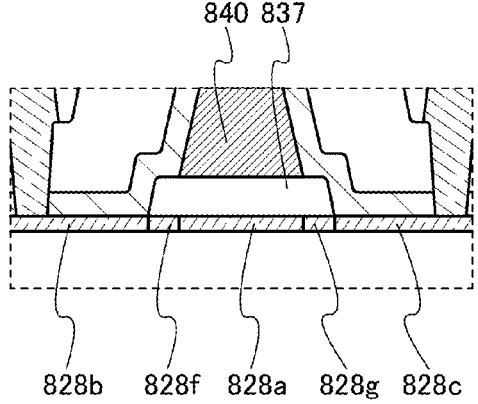

As illustrated in FIG. 67F in a cross-sectional view in the channel length direction, the region 828f is provided between the region 828a and the region 828b, and the region 828g is provided between the region 828a and the region 828c. The regions 828f and 828g have lower concentration of an impurity element and higher resistivity than the regions 828b and 828c. Although the regions 828f and 828g overlap the insulating layer 837 in this case, they may overlap the insulating layer 837 and the conductive layer 840.

Note that in FIGS. 67C to 67F, the transistor illustrated in FIG. 67A is described; however, the transistor illustrated in FIG. 67B can employ any of the structures in FIGS. 67C to 67F as appropriate.

Figure 68A:
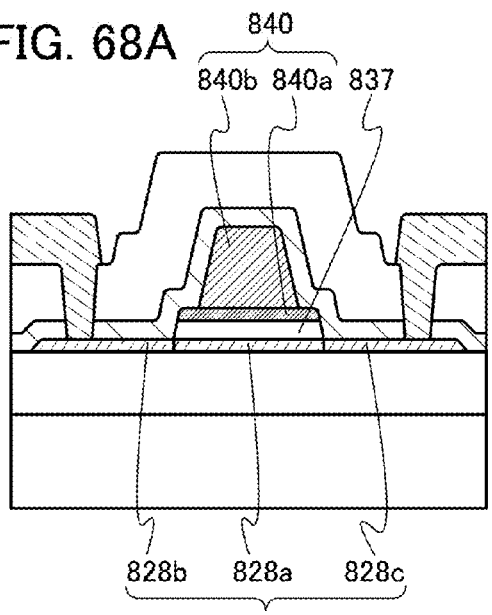
FIGS. 68A to 68E are cross-sectional views each illustrating a transistor.

In the transistor illustrated in FIG. 68A, the conductive layer 840 has a lamination including a conductive layer 840a in contact with the insulating layer 837 and a conductive layer 840b in contact with the conductive layer 840a. The end portion of the conductive layer 840a is positioned on an outer side than the end portion of the conductive layer 840b. In other words, the conductive layer 840a has such a shape that the end portion extends beyond the end portion of the conductive layer 840b.

Next, modification examples of the regions 828b and 828c are described. Note that FIGS. 68B to 68E are each an enlarged view in the vicinity of the oxide semiconductor layer 828 illustrated in FIG. 68A.

Figure 68B:
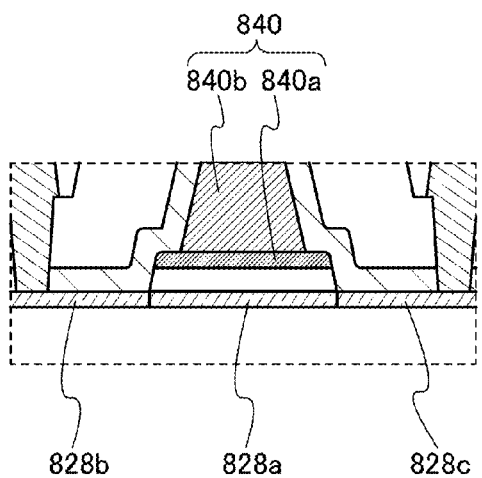

As illustrated in FIG. 68B in a cross-sectional view in the channel length direction, the boundaries between the region 828a and the regions 828b and 828c are aligned or substantially aligned with the end portion of the conductive layer 840a in the conductive layer 840 with the insulating layer 837 positioned therebetween. In other words, when seen from the above, the boundaries between the region 828a and the regions 828b and 828c are aligned or substantially aligned with the end portion of the conductive layer 840.

Figure 68C:
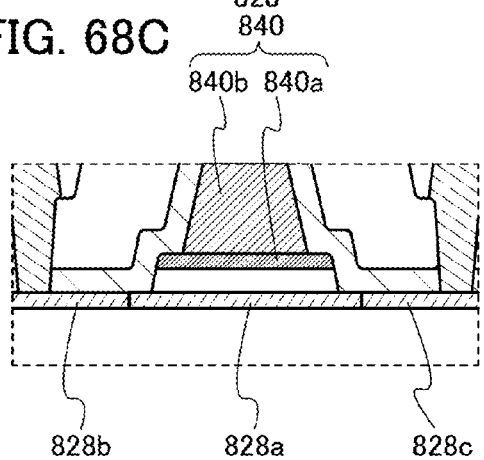

As illustrated in FIG. 68C in a cross-sectional view in the channel length direction, the region 828a has a region that does not overlap the conductive layer 840. The region functions as an offset region. In other words, when seen from the above, the end portions of the regions 828b and 828c are aligned or substantially aligned with the end portion of the insulating layer 837 and do not overlap the end portion of the conductive layer 840.

Figure 68D:
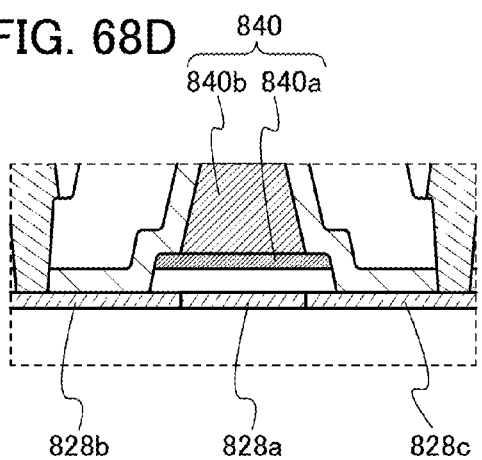

As illustrated in FIG. 68D in a cross-sectional view in the channel length direction, the regions 828b and 828c each have a region overlapping the conductive layer 840, specifically the conductive layer 840a. Such a region is referred to as an overlap region. In other words, when seen from the above, the end portions of the regions 828b and 828c overlap the conductive layer 840a.

Figure 68E:
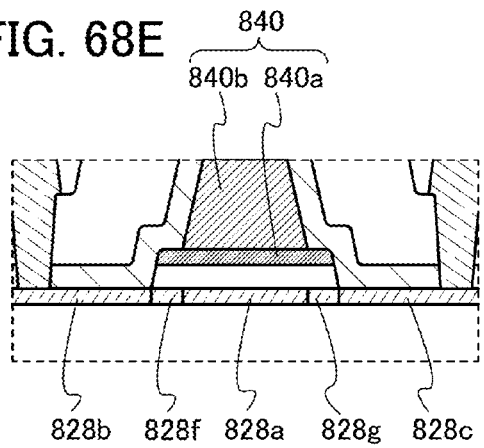

As illustrated in FIG. 68E in a cross-sectional view in the channel length direction, the region 828f is provided between the region 828a and the region 828b, and the region 828g is provided between the region 828a and the region 828c. The impurity element is added to the regions 828f and 828g through the conductive layer 840a; thus, the regions 828f and 828g have lower concentration of impurity element and higher resistivity than the regions 828b and 828c. Although the regions 828f and 828g overlap the conductive layer 840a, they may overlap both the conductive layer 840a and the conductive layer 840b.

The end portion of the insulating layer 837 may be positioned on the outer side than the end portion of the conductive layer 840a.

Alternatively, the side surface of the insulating layer 837 may be curved.

Alternatively, the insulating layer 837 may have a tapered shape. In other words, an angle formed between a surface where the oxide semiconductor layer 828 and the insulating layer 837 are in contact with each other and a side surface of the insulating film layer may be less than 90°, preferably greater than or equal to 30° and less than 90°.

As described with FIGS. 68A to 68E, the oxide semiconductor layer 828 includes the region 828f and the region 828g having lower concentration of an impurity element and higher resistivity than the regions 828b and 828c, whereby the electric field of the drain region can be relaxed. Thus, a deterioration of the transistor due to the electric field of the drain region, such as a shift of the threshold voltage of the transistor, can be inhibited.

Note that content (or may be part of the content) described in one embodiment may be applied to, combined with, or replaced by different content (or may be part of the different content) described in the embodiment and/or content (or may be part of the content) described in one or more different embodiments.

Note that in each embodiment, content described in the embodiment is content described with reference to a variety of diagrams or content described with a text described in the specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in another embodiment or other embodiments, much more diagrams can be formed.

Note that content that is not specified in any drawing or text in the specification can be excluded from one embodiment of the invention. Alternatively, when the range of a value that is defined by the maximum and minimum values is described, the range is narrowed freely or part of the range is removed, so that one embodiment of the invention excluding part of the range can be constructed. In this manner, it is possible to specify the technical scope of one embodiment of the present invention so that a conventional technology is excluded, for example.

As a specific example, a diagram of a circuit including first to fifth transistors is illustrated. In that case, it can be specified that the circuit does not include a sixth transistor in the invention. It can be specified that the circuit does not include a capacitor in the invention. It can be specified that the circuit does not include a sixth transistor with a particular connection in the invention. It can be specified that the circuit does not include a capacitor with a particular connection in the invention. For example, it can be specified that a sixth transistor whose gate is connected to a gate of the third transistor is not included in the invention. It can be specified that a capacitor whose first electrode is connected to the gate of the third transistor is not included in the invention, for example.

As another specific example, when the expression "voltage is preferably higher than or equal to 3 V and lower than or equal to 10 V" is used to describe a given value, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than 9 V and higher than 9 V and lower than or equal to 10 V in the invention. Note that even when the expression "a value is preferably in a certain range" or "a value preferably satisfies a certain condition" is used, for example, the value is not limited to the description. In other words, the description of a value that includes a term "preferable", "preferably", or the like does not necessarily limit the value.

As another specific example, when the expression "voltage is preferably 10 V" is used to describe a given value, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, when the expression "a film is an insulating film" is used to describe properties of a material, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, when the expression "a film is provided between an A film and a B film" is used to describe a given layered structure, for example, it can be specified that the case where the film is a lamination of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including an FET and a light-emitting element, the following case is possible: Company A manufactures and sells semiconductor devices including FETs, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a transistor and a light-emitting element, even when this specification or the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification or the like.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention is clear even when connection portions are not specified. Furthermore, in the case where a connection portion is disclosed in this specification and the like, it can be determined that one embodiment of the invention in which a connection portion is not specified is disclosed in this specification and the like, in some cases. In particular, in the case where the number of portions to which the terminal is connected is plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least the function of a circuit is specified. In other words, one embodiment of the present invention is clear when the function of a circuit is specified. Furthermore, it can be determined that one embodiment of the present invention in which a function is specified is disclosed in this specification and the like in some cases. Thus, when the connection portion of a circuit is specified, the circuit is disclosed as one embodiment of the invention even if a function is not specified, and one embodiment of the invention can be constituted. Alternatively, when the function of a circuit is specified, the circuit is disclosed as one embodiment of the invention even when a connection portion is not specified, and one embodiment of the invention can be constituted.

Note that in this specification and the like, in a diagram or a text described in one embodiment, part of the diagram or the text is taken out, and one embodiment of the invention can be constituted. Thus, in the case where a diagram or a text related to a certain portion is described, the context taken out from part of the diagram or the text is also disclosed as one embodiment of the invention, and one embodiment of the invention can be constituted. One embodiment of the invention is clear. Therefore, for example, in a diagram or a text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, M circuit elements (e.g., transistors or capacitors) (M is an integer, where M<N) are taken out from a circuit diagram in which N circuit elements (e.g., transistors or capacitors) (N is an integer) are provided, and one embodiment of the invention can be constituted. As another example, M layers (M is an integer, where M<N) are taken out from a cross-sectional view in which N layers (N is an integer) are provided, and one embodiment of the invention can be constituted. As another example, M elements (M is an integer, where M<N) are taken out from a flow chart in which N elements (N is an integer) are provided, and one embodiment of the invention can be constituted. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in this specification and the like, in a diagram or a text described in one embodiment, in the case where at least one specific example is described, it will be readily appreciated by those skilled in the art that a broader concept of the specific example can be derived. Thus, in the diagram or the text described in one embodiment, in the case where at least one specific example is described, a broader concept of the specific example is disclosed as one embodiment of the invention, and one embodiment of the invention can be constituted. One embodiment of the invention is clear.

Note that in this specification and the like, content described in at least a diagram (or may be part of the diagram) is disclosed as one embodiment of the invention, and one embodiment of the invention can be constituted. Thus, when certain content is described in a diagram, the content is disclosed as one embodiment of the invention even when the content is not described with a text, and one embodiment of the invention can be constituted. Similarly, part of a diagram that is taken out from the diagram is disclosed as one embodiment of the invention, and one embodiment of the invention can be constituted. One embodiment of the invention is clear.

This embodiment can be combined with any of the other embodiments in this specification as appropriate.

This application is based on Japanese Patent Application serial no. 2014-043577 filed with Japan Patent Office on Mar. 6, 2014 and Japanese Patent Application serial no. 2014-043574 filed with Japan Patent Office on Mar. 6, 2014, the entire contents of which are hereby incorporated by reference.

What is claimed is:

1. A method for manufacturing a semiconductor device comprising the steps of:
   forming an oxide semiconductor layer over a substrate having a substantially planar surface;
   implanting a first oxygen ion in the oxide semiconductor layer through both top and side surfaces of the oxide semiconductor layer at a singular implantation angle θ so as to provide oxygen in a channel formation region uniformly in a thickness direction of the oxide semiconductor layer; and
   performing heat treatment on the oxide semiconductor layer to diffuse an oxygen in the oxide semiconductor layer,
   wherein the implantation angle θ is an angle greater than 10° and less than 85°,
   wherein 0° is an angle which is perpendicular to the substantially planar surface, and
   wherein 90° is an angle which is parallel to the substantially planar surface.

2. The method for manufacturing a semiconductor device, according to claim 1, wherein the implantation of the first oxygen ion is performed while the substrate is rotated about an axis perpendicular to the substantially planar surface.

3. The method for manufacturing a semiconductor device, according to claim 1, further comprising:
   implanting a second oxygen ion in the oxide semiconductor layer at an angle of substantially 0°.

4. The method for manufacturing a semiconductor device according to claim 1,
   wherein the oxide semiconductor layer comprises In, Zn and M, and
   wherein M is any one of Al, Ti, Ga, Sn, Y, Zr, La, Ce, Nd and Hf.

5. The method for manufacturing a semiconductor device according to claim 1,
   wherein the oxide semiconductor layer comprises a lamination in which a first oxide semiconductor layer and a second oxide semiconductor layer are stacked in this order from the substrate side.

6. The method for manufacturing a semiconductor device according to claim 5,
   wherein the first oxide semiconductor layer and the second oxide semiconductor layer each comprises In, Zn and M,
   wherein M is any one of Al, Ti, Ga, Sn, Y, Zr, La, Ce, Nd and Hf, and
   wherein an atomic ratio of M to In of the first oxide semiconductor layer is higher than an atomic ratio of M to In of the second oxide semiconductor layer.

7. The method for manufacturing a semiconductor device according to claim 5, further comprising:
   before the heat treatment, forming a third oxide semiconductor layer over the oxide semiconductor layer.

8. The method for manufacturing a semiconductor device according to claim 1, further comprising:
   before the heat treatment, forming an insulating layer over the oxide semiconductor layer.

9. The method for manufacturing a semiconductor device, according to claim 1, wherein the heat treatment is performed by light irradiation.

10. A method for manufacturing a semiconductor device comprising the steps of:
    forming an oxide semiconductor layer over a substrate having a substantially planar surface;
    forming a layer over the oxide semiconductor layer;
    implanting a first oxygen ion in the oxide semiconductor layer through the layer, both top and side surfaces of the oxide semiconductor layer at a singular implantation angle θ so as to provide oxygen in a channel formation region uniformly in a thickness direction of the oxide semiconductor layer; and
    performing heat treatment on the oxide semiconductor layer to diffuse an oxygen in the oxide semiconductor layer,
    wherein the implantation angle θ is an angle greater than 10° and less than 85°,
    wherein 0° is an angle which is perpendicular to the substantially planar surface, and
    wherein 90° is an angle which is parallel to the substantially planar surface.

11. The method for manufacturing a semiconductor device, according to claim 10, wherein the implantation of the first oxygen ion is performed while the substrate is rotated about an axis perpendicular to the substantially planar surface.

12. The method for manufacturing a semiconductor device, according to claim 10, further comprising:
    implanting a second oxygen ion in the oxide semiconductor layer at an angle of substantially 0°.

13. The method for manufacturing a semiconductor device according to claim 10,
    wherein the oxide semiconductor layer comprises In, Zn and M, and
    wherein M is any one of Al, Ti, Ga, Sn, Y, Zr, La, Ce, Nd and Hf.

14. The method for manufacturing a semiconductor device according to claim 10, wherein the oxide semiconductor layer comprises a lamination in which a first oxide semiconductor layer and a second oxide semiconductor layer are stacked in this order from the substrate side.

15. The method for manufacturing a semiconductor device according to claim 14,
wherein the first oxide semiconductor layer and the second oxide semiconductor layer each comprises In, Zn and M,
wherein M is any one of Al, Ti, Ga, Sn, Y, Zr, La, Ce, Nd and Hf, and
wherein an atomic ratio of M to In of the first oxide semiconductor layer is higher than an atomic ratio of M to In of the second oxide semiconductor layer.

16. The method for manufacturing a semiconductor device according to claim 14, wherein the layer is a third oxide semiconductor layer.

17. The method for manufacturing a semiconductor device according to claim 10, wherein the layer is an insulating layer.

18. The method for manufacturing a semiconductor device, according to claim 10, wherein the heat treatment is performed by light irradiation.

19. A method for manufacturing a semiconductor device comprising the steps of:
forming an oxide semiconductor layer over a substrate having a substantially planar surface, the oxide semiconductor layer comprising a crystalline oxide semiconductor in which c-axis are aligned perpendicularly to the substantially planar surface;
implanting a first oxygen ion in the oxide semiconductor layer through both top and side surfaces of the oxide semiconductor layer at a singular implantation angle $\theta$ so as to provide oxygen in a channel formation region uniformly in a thickness direction of the oxide semiconductor layer;
forming a layer over the oxide semiconductor layer; and
performing heat treatment on the oxide semiconductor layer to diffuse an oxygen in a direction perpendicular to a c-axis direction in the oxide semiconductor layer,
wherein the implantation angle $\theta$ is an angle greater than 10° and less than 85°,
wherein 0° is an angle which is perpendicular to the substantially planar surface, and
wherein 90° is an angle which is parallel to the substantially planar surface.

20. A method for manufacturing a semiconductor device comprising the steps of:
forming a c-axis aligned crystalline oxide semiconductor layer whose thickness is larger than a width of the c-axis aligned crystalline oxide semiconductor layer; and
implanting an oxygen ion in a channel formation region of the c-axis aligned crystalline oxide semiconductor layer through a surface of the c-axis aligned crystalline oxide semiconductor layer from a direction that is not perpendicular to the surface of the c-axis aligned crystalline oxide semiconductor layer.

21. The method for manufacturing a semiconductor device, according to claim 20, wherein the implanting oxygen is performed through an oxide insulating layer.

22. The method for manufacturing a semiconductor device, according to claim 20, wherein the implanting oxygen is performed through an oxide semiconductor layer.

* * * * *